(12) United States Patent
Inoue et al.

(10) Patent No.: US 9,590,616 B2
(45) Date of Patent: Mar. 7, 2017

(54) DRIVE CONTROL DEVICE

(71) Applicant: DENSO CORPORATION, Kariya, Aichi-pref. (JP)

(72) Inventors: Takeshi Inoue, Kariya (JP); Takahiro Iwamura, Kariya (JP); Masahiro Yamamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/901,767

(22) PCT Filed: Jul. 9, 2014

(86) PCT No.: PCT/JP2014/003639
§ 371 (c)(1),
(2) Date: Dec. 29, 2015

(87) PCT Pub. No.: WO2015/004911
PCT Pub. Date: Jan. 15, 2015

(65) Prior Publication Data
US 2016/0308524 A1 Oct. 20, 2016

(30) Foreign Application Priority Data

Jul. 10, 2013 (JP) ................................ 2013-144560
Jul. 10, 2013 (JP) ................................ 2013-144561
Jun. 30, 2014 (JP) ................................ 2014-134227

(51) Int. Cl.
*H03K 3/00* (2006.01)
*H03K 17/16* (2006.01)
(Continued)

(52) U.S. Cl.
CPC ....... *H03K 17/168* (2013.01); *H01L 27/0207* (2013.01); *H01L 27/0629* (2013.01);
(Continued)

(58) Field of Classification Search
None
See application file for complete search history.

(56) References Cited

U.S. PATENT DOCUMENTS 6,114,727 A 9/2000 Ogura et al.
8,072,241 B2 12/2011 Kouno
(Continued)

FOREIGN PATENT DOCUMENTS

JP H10-163469 A 6/1998
JP H11-97551 A 4/1999
(Continued)

OTHER PUBLICATIONS

International Search Report of the International Searching Authority dated Aug. 26, 2014 issued in the corresponding International application No. PCT/JP2014/003639 (and English translation).
(Continued)

*Primary Examiner* — Lincoln Donovan
*Assistant Examiner* — Khareem E Almo
(74) *Attorney, Agent, or Firm* — Posz Law Group, PLC

(57) ABSTRACT

A drive control device for two semiconductor elements having a transistor structure and a diode structure with a common energization electrode includes: a current detection device outputting a current detection signal of the semiconductor elements; and a first control device outputting a gate drive signal from when a first time period has elapsed from a starting time to when a second time period has elapsed from the starting time, at which an off-command signal is input after it is determined that a current flows through the semiconductor elements in a forward direction of the diode structure during a time period for which an on-command signal is input to the semiconductor elements. The first and the second time periods are preliminary set not to generate an arm short-circuit between two semiconductor elements.

39 Claims, 42 Drawing Sheets

(51) Int. Cl.

| | | |
|---|---|---|
| *H02M 1/38* | (2007.01) | |
| *H01L 27/06* | (2006.01) | |
| *H01L 27/02* | (2006.01) | |
| *H01L 29/06* | (2006.01) | |
| *H01L 29/739* | (2006.01) | |
| *H01L 29/78* | (2006.01) | |
| *H03K 17/74* | (2006.01) | |
| *H02M 1/00* | (2006.01) | |

(52) U.S. Cl.
CPC ...... *H01L 29/0619* (2013.01); *H01L 29/0634* (2013.01); *H01L 29/7397* (2013.01); *H01L 29/7811* (2013.01); *H01L 29/7813* (2013.01); *H02M 1/38* (2013.01); *H03K 17/74* (2013.01); *H02M 2001/0009* (2013.01)

(56) References Cited

U.S. PATENT DOCUMENTS

| | | |
|---|---|---|
| 2002/0088989 A1 | 7/2002 | Kim |
| 2006/0071280 A1 | 4/2006 | Bakran et al. |
| 2008/0265975 A1 | 10/2008 | Takasu et al. |
| 2009/0057832 A1 | 3/2009 | Kouno |
| 2009/0168471 A1 | 7/2009 | Tsugawa et al. |
| 2010/0090248 A1 | 4/2010 | Kouno |
| 2010/0156506 A1 | 6/2010 | Tsuzuki et al. |
| 2010/0187567 A1 | 7/2010 | Tanabe et al. |
| 2010/0283514 A1 | 11/2010 | Soeno et al. |
| 2011/0073905 A1 | 3/2011 | Mori |
| 2011/0285427 A1 | 11/2011 | Koyama et al. |
| 2012/0025264 A1 | 2/2012 | Kouno |
| 2012/0025874 A1 | 2/2012 | Saikaku et al. |
| 2012/0056242 A1 | 3/2012 | Tsuzuki et al. |
| 2013/0334567 A1 | 12/2013 | Kouno |
| 2014/0253182 A1* | 9/2014 | Akiyama ............... H03K 5/153 327/109 |
| 2015/0041850 A1 | 2/2015 | Saikaku et al. |
| 2015/0123718 A1 | 5/2015 | Kouno |

FOREIGN PATENT DOCUMENTS

| | | |
|---|---|---|
| JP | H11-97679 A | 4/1999 |
| JP | 2008-124300 A | 5/2008 |
| JP | 2008-282999 A | 11/2008 |
| JP | 2008-539571 A | 11/2008 |
| JP | 2009-101868 A | 5/2009 |
| JP | 2009-141202 A | 6/2009 |
| JP | 2009-170670 A | 7/2009 |
| JP | 2010-154595 A | 7/2010 |
| JP | 2011-86891 A | 4/2011 |
| JP | 2011-96852 A | 5/2011 |
| JP | 2011-146555 A | 7/2011 |
| JP | 2011-166052 A | 8/2011 |
| JP | 2011-238975 A | 11/2011 |
| JP | 2012-175047 A | 9/2012 |
| JP | 2014-117044 A | 6/2014 |

OTHER PUBLICATIONS

Written Opinion of the International Searching Authority dated Aug. 26, 2014 issued in the corresponding International application No. PCT/JP2014/003639 (and English translation).

Xu et al., "An Analysis and Experimental Approach to MOS Controlled Diodes Behavior," IEEE Transactions on Power Electronics, vol. 15, No. 5, pp. 916-922, Sep. 2000.

Bauer et al., "Experimental Study of a 6.5kV MOS Controllable Freewheeling Diode," Proceedings of the 20th International Symposium on Power Semiconductor Devices & IC's, pp. 40-43, May 18-22, 2008.

Rusu et al., "Gate-Controlled Diode—A New War for Electronic Circuits," Proceedings of the Romanian Academy, Series A, vol. 10, No. 3, 2009.

Rahimo et al. "A High Current 3300V Module Employing Reverse Conducting IGBTs Setting a New Benchmark in Cutout Power Capability," Proceedings of the 20th International Symposium on Power Semiconductor Devices & IC's, pp. 68-71, May 18-22, 2008.

Xu et al., "Experimental Demonstration of the MOS Controlled Diode (MCD)," IEEE 2000, vol. 2, pp. 1144-1148. (Discussed on pp. 1-4 of the specification).

* cited by examiner

DRIVE CONTROL DEVICE

CROSS REFERENCE TO RELATED APPLICATIONS

This application is the U.S. national phase of International Patent Application No. PCT/JP2014/003639 filed on Jul. 9, 2014 and is based on Japanese Patent Applications No. 2013-144561 filed on Jul. 10, 2013, No. 2013-144560 filed on Jul. 10, 2013, and No. 2014-134227 filed on Jun. 30, 2014, the disclosures of which are incorporated herein by reference.

TECHNICAL FIELD

The present disclosure relates to a drive control device of a semiconductor element in which an insulated gate transistor structure and a diode structure are formed on the same semiconductor substrate.

BACKGROUND ART

A semiconductor element, in which transistor devices and diode devices such as an RC-IGBT, a MOS transistor, and a diode with a MOS gate are formed on the same semiconductor substrate, and conduction electrodes (a collector and an emitter, or a drain and a source) of the transistor devices and conduction electrodes (a cathode and an anode) of the diode devices are common electrodes, is disclosed (refer to Non Patent Literature 1). When such a semiconductor element is used as a switching device in a power conversion device such as an inverter or a converter, the semiconductor element requires a reduced switching loss and/or a reduced conduction loss.

The power conversion device has a half-bridge circuit as a basic configuration, and performs AC to DC voltage conversion, DC to AC voltage conversion, or boosts or bucks an input voltage by turning on and off a lower-arm semiconductor element and an upper-arm semiconductor element complementary to each other. In the half-bridge circuit, a dead time is set to simultaneously turn off the upper semiconductor element and the lower semiconductor element so as to prevent the occurrence of a short circuit in a power supply (arm short circuit).

A load current flows back to a diode device of one of the semiconductor elements during the dead time. When the other semiconductor element turns on after the dead time ends, the flow of a load current is switched to the other semiconductor element from the diode device. At this time, a reverse recovery current flows due to the discharging of carriers accumulated in the diode device. The reverse recovery current is a cause of increasing a switching loss and creating noise.

In contrast, Non Patent Literature 1 discloses a method by which a positive gate drive voltage is applied to the one semiconductor element slightly before the other semiconductor element turns on. According to this method, the electron current of the semiconductor element increases, a hole current decreases, the injection of holes is restricted, and thus, it is possible to reduce the reverse recovery current.

In contrast, the semiconductor element has a characteristic in which when the gate drive voltage is applied to the semiconductor element in a state where the current flows through the diode device, a channel is formed, and the injection of holes is restricted such that a conduction loss increases. In contrast, there is proposed drive control by which it is determined whether or not a current flows through the diode device, the gate drive voltage is shut off when the current flows through the diode device, and the gate drive voltage is applied when the current does not flow through the diode device.

The method disclosed in Non Patent Literature 1, by which the injection of carriers is restricted by temporarily applying the gate drive voltage (gate drive pulse) to the semiconductor element, is effective in reducing the reverse recovery current. Since it is necessary to apply the gate drive pulse during a transient period for which the flow of a current is switched between the two semiconductor elements of the half-bridge circuit, when the application of the gate drive pulse is slightly delayed, an arm short circuit occurs. In contrast, when the gate drive pulse is applied earlier, the amount of holes to be re-injected after the application of the gate drive pulse ends increases, and the effect of reducing the reverse recovery current decreases. In Non Patent Literature 1, the application timing of the gate drive pulse or a pulse width is not specifically described. It is necessary to establish device for applying the gate drive pulse so as to realize this method.

In contrast, the conduction loss characteristic of a semiconductor element associated with the application and shut-off of the gate drive voltage varies considerably depending on the types (an RC-IGBT, MOS transistor, and the like) of semiconductor elements. For this reason, it may not be possible to sufficiently reduce a conduction loss according to determination criteria in the related art to which it is determined whether or not a current flows through the semiconductor element in a forward direction of a diode device.

PRIOR ART LITERATURES

Non Patent Literature

Non Patent Literature 1: "Experimental Demonstration of the MOS Controlled Diode (MCD)" in IEEE 2000, Vol. 2, page 1144 to page 1148, written by Zhenxue Xu, Bo Zhang, and Alex Q. Huang

SUMMARY OF INVENTION

It is an object of the present disclosure to provide a drive control device that is firstly capable of reducing a switching loss by applying a gate drive pulse to a semiconductor element, in which a transistor structure and a diode structure are formed on the same semiconductor substrate, at an appropriate timing, and is secondly capable of sufficiently reducing a conduction loss of the semiconductor element regardless of the types of the semiconductor elements.

According to a first aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through at least one of the two semiconductor elements; and a first control device that outputs a gate drive signal for instructing to apply the gate drive voltage from when a first time period has elapsed from a starting time to when a second time period has elapsed from the starting time, at which an off-command signal is input after it is determined based on the current detection signal that a current flows through the at least one of the two semiconductor elements in a forward direction of the diode structure during a time period for which an on-command signal is input to the at least one of the two semiconductor elements. The two semiconductor elements provide a half-bridge circuit. The first time period and the second time period are preliminary set not to generate an arm short-circuit between the two semiconductor elements.

According to this device, it is possible to understand a dead time by pre-measuring a delay or variations, and to accurately set the timing of the gate drive signal required to apply the gate drive voltage at a desired timing, starting from when the off-command signal is input, that is, to accurately set the first time period and the second time period.

As a result, while an arm short circuit is prevented from occurring, a re-injection time period can be controlled to be short, and thus, a reverse recovery current can be reduced, and a switching loss can be reduced. Since the first control device is capable of applying the gate drive signal using the off-command signal as a reference timing, the first control device does not require a separate timing signal, and a drive control device in the related art is easily switched to the drive control device in this aspect of this disclosure.

According to a second aspect of the present disclosure, a drive control device for a semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through the semiconductor element; and a second control device that outputs a gate drive signal for instructing to shut off the gate drive voltage when it is determined based on the current detection signal that the current of the semiconductor element flowing in a forward direction of the diode structure is greater than or equal to a current threshold value during a time period for which an on-command signal is input to the semiconductor element. When it is determined based on the current detection signal that the current of the semiconductor element flowing in the forward direction of the diode structure is less than the current threshold value during the time period for which the on-command signal is input to the semiconductor element, the second control device outputs another gate drive signal for instructing to apply the gate drive voltage. When the current flows through the semiconductor element in the forward direction of the diode structure, a current value, at which a conduction loss in a case where the gate drive voltage is shut off is equal to a conduction loss in a case where the gate drive voltage is applied, is preliminary measured, and a measured current value is set as the current threshold value.

In this configuration, the same operations and effects as in the first aspect can be obtained. Regardless of the types or the breakdown voltages of semiconductor elements, it is possible to appropriately reduce a conduction loss. The gate drive voltage is reliably applied during a time period for which a current flows through the semiconductor element in a reverse direction of the diode structure, and thus, a current is capable of flowing through the transistor structure according to the on-command signal.

According to a third aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through at least one of the two semiconductor elements; and a control device that outputs a pulse not to generate an arm short-circuit between the two semiconductor elements at a time when the current detection device detects a change in the current detection signal in a case where it is determined based on the current detection signal that a current flows through the at least one of the two semiconductor elements in a forward direction of the diode structure under a condition that an off-command signal is input to the at least one of the two semiconductor elements. The time is ahead of an input time when the on-command signal is input to the at least one of the two semiconductor elements. The two semiconductor elements provide a half-bridge circuit.

In this configuration, the same operations and effects as in the first aspect can be obtained.

According to a fourth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal based on an electrode potential of one of the two semiconductor elements; and a control device that outputs a pulse not to generate an arm short-circuit between the two semiconductor elements from an input time when an on-command signal is input to the one of the two semiconductor elements in a case where it is determined based on the voltage detection signal that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

According to a fifth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through one of the two semiconductor elements; an input device that inputs a command signal to the other of the two semiconductor elements; and a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the current detection signal and an input signal of the input device that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

According to a sixth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal based on an electrode potential of one of the two semiconductor elements; an input device that inputs a command signal to the other of the two semiconductor elements; and a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the voltage detection signal and an input signal of the input device that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

According to a seventh aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal corresponding to an electrode potential of at least one of the two semiconductor elements; and a control device that outputs a gate drive signal for instructing to apply the gate drive voltage from when a first time period has elapsed from a starting time to when a second time period has elapsed from the starting time, at which an off-command signal is input subsequent to an input of an on-command signal after it is determined based on the voltage detection signal that a current flows through the one of the two semiconductor elements in a forward direction of the diode structure under a condition that an off-command signal is input to the one of the two semiconductor elements. The first time period and the second time period are preliminary set not to generate an arm short-circuit between the two semiconductor elements. The two semiconductor elements provide a half-bridge circuit.

In this configuration, the same operations and effects as in the first aspect can be obtained.

According to an eighth aspect of the present disclosure, a drive control device for a semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through the semiconductor element; a control device that outputs a gate drive signal for instructing to apply the gate drive voltage from when a predetermined first time period has elapsed from a starting time to when a predetermined second time period has elapsed from the starting time, at which an off-command signal is input after it is determined based on the current detection signal that a current flows through the semiconductor element in a forward direction of the diode structure during a time period for which an on-command signal is input to the semiconductor element; and a drive circuit that receives the gate drive signal, and outputs the gate drive voltage. A time width, which is a difference between the first time period and the second time period, is set to a value corresponding to a magnitude of a current flowing through the semiconductor element during a time period for which an on-command signal is input to the semiconductor element.

As a result, it is possible to accurately control a time period from when the application of the gate drive pulse to the one semiconductor element ends to when a reverse recovery current starts to flow therethrough, for example, a time period (carrier re-injection time period) for which carriers (holes) are injected into the diode structure again after the application of the gate drive pulse ends. According to this device, while an arm short circuit is prevented from occurring, a re-injection time period can be controlled to be short, and thus, the reverse recovery current can be reduced, and a switching loss can be reduced. Since the control device is capable of applying the gate drive signal using the off-command signal as a reference timing, the control device does not require a separate timing signal, and a drive control device in the related art is easily switched to the drive control device in this aspect of this disclosure.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

In embodiments, the same reference signs will be assigned to substantially the same portions, and descriptions thereof will be omitted.

First Embodiment

Figure 1:
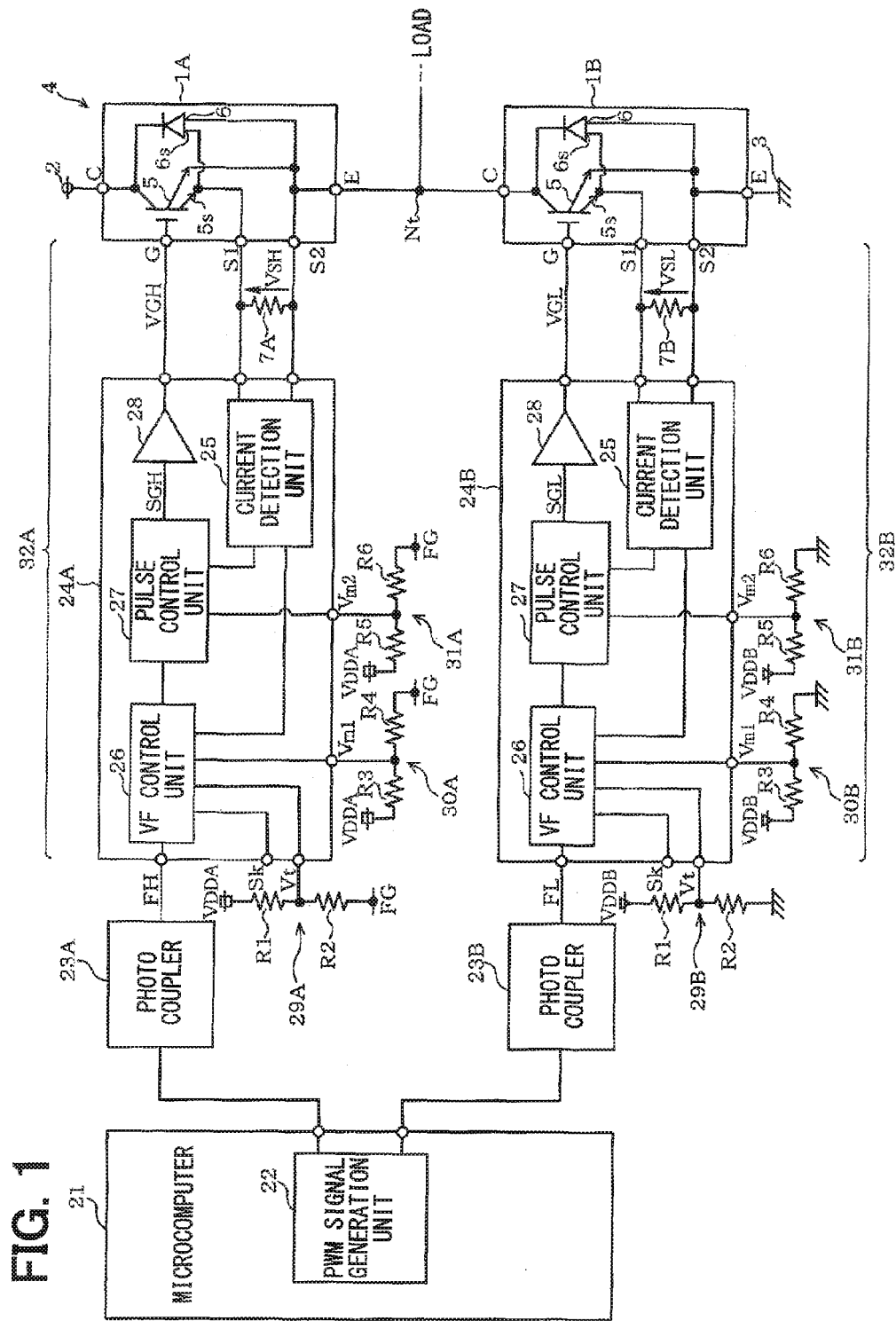
FIG. 1 is a diagram illustrating the configuration of a drive control system in a first embodiment.

Hereinafter, a first embodiment of the present disclosure will be described with reference to FIGS. 1 to 5. A drive control system illustrated in FIG. 1 is used in power converter devices such as an inverter device that drives an inductive load (for example, a motor), and a converter device that includes an inductor, and boosts and bucks a DC voltage. Semiconductor elements 1A and 1B which are switching devices form a half-bridge circuit 4 such that the semiconductor elements 1A and 1B are disposed in series with an output terminal Nt interposed between a high-potential DC power supply line 2 and a low-potential DC power supply line 3.

Each of the semiconductor elements 1A and 1B with the same structure is a reverse-conducting IGBT (RC-IGBT) in which an insulated gate transistor device 5 and a diode device 6 are formed on the same semiconductor substrate. Conduction electrodes (a collector and an emitter) of the transistor device 5 and conduction electrodes (a cathode and an anode) of the diode device 6 are common electrodes.

Figure 2:
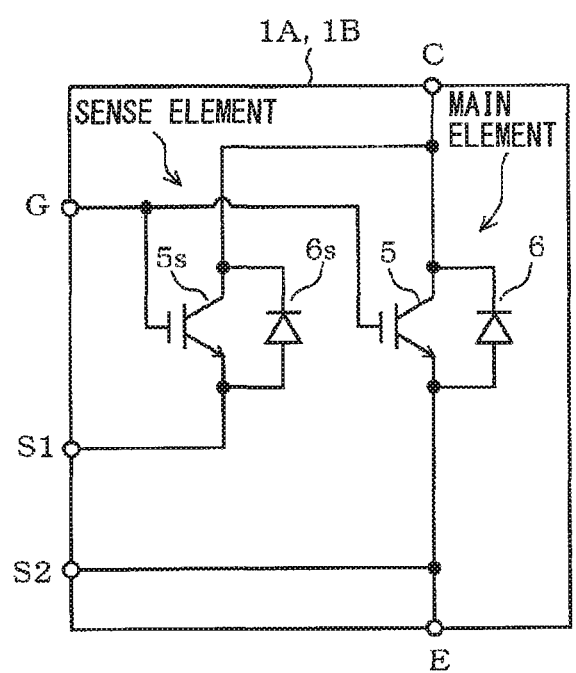
FIG. 2 is a diagram illustrating the circuit configurations of a main element and a sense element.

As illustrated in FIG. 2, in addition to the main elements, a sense element is formed on the semiconductor substrate, and is formed of a transistor device 5s and a diode device 6s through which a very small amount of current flows in proportional to the amount of current flowing through the main elements. FIG. 1 simply illustrates the main elements and the sense elements. A sense resistor 7A is connected between sense terminals S1 and S2 of the semiconductor element 1A, and a sense resistor 7B is connected between the sense terminals S1 and S2 of the semiconductor element 1B. Each of the sense resistors 7A and 7B along with a current detection unit 25 (to be described later) forms current detection device.

Figure 3:
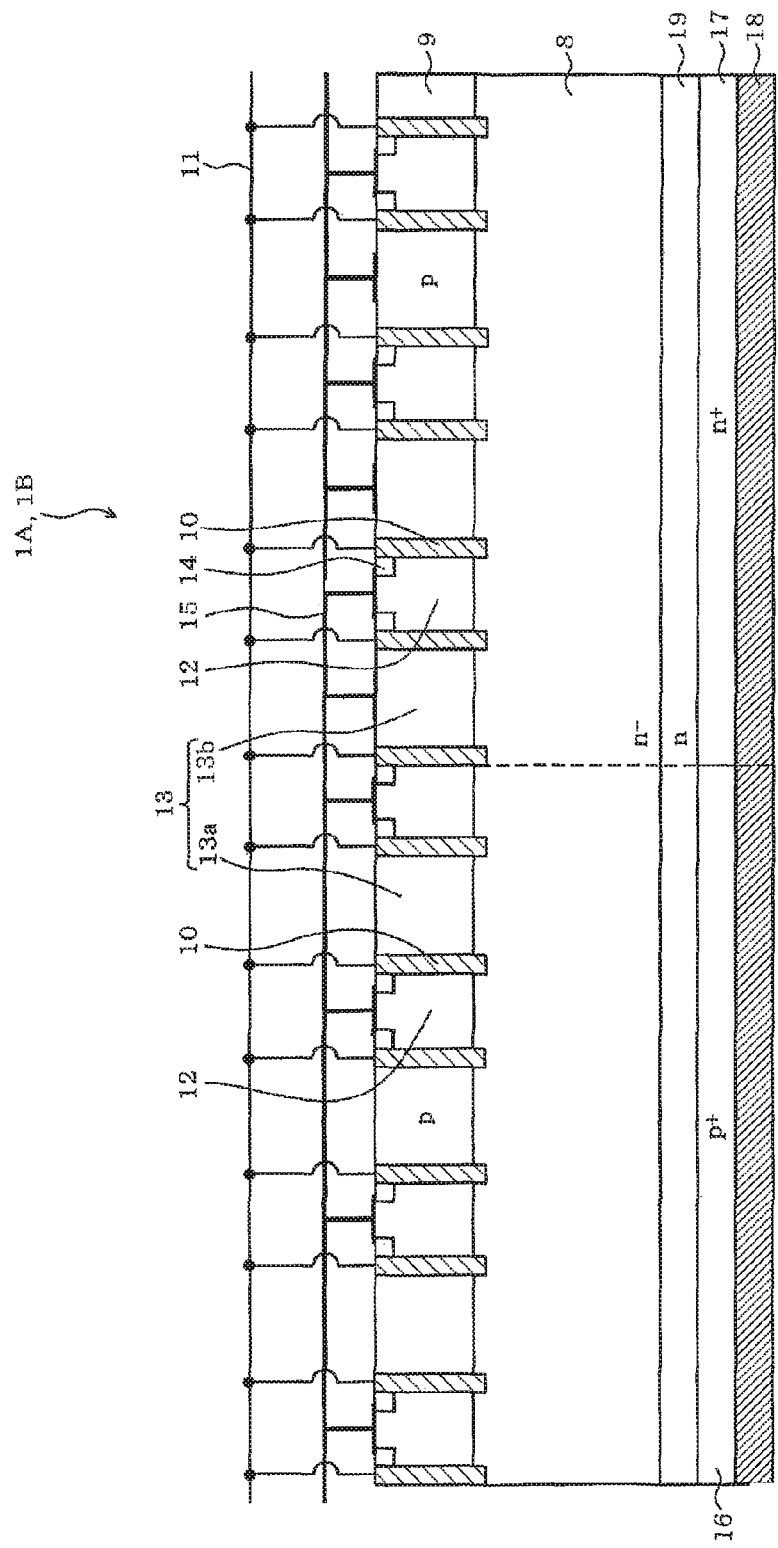
FIG. 3 is a schematic longitudinal cross-sectional view of a semiconductor element.

As an example of the semiconductor elements 1A and 1B, an RC-IGBT with a longitudinal structure is illustrated in FIG. 3. In the RC-IGBT in this embodiment, a transistor structure and a diode structure are built on the same semiconductor substrate. A semiconductor substrate 8 is an n− type silicon substrate. A guard ring (not illustrated) is formed in the vicinity of a circumferential edge portion of an element formation region for the semiconductor substrate 8 in such a way as to surround the element formation region.

A p type base layer 9 is formed on an upper surface layer portion of the semiconductor substrate 8. Multiple trenches are formed in the base layer 9, and have a depth to pass through the base layer 9. Each of the trenches is filled with polysilicon such that a trench-structured gate electrode 10 is formed. A gate drive voltage is input to each of the gate electrode 10 via a common gate wiring 11. The gate electrodes 10 are provided in the pattern of a stripe while being equally spaced in one direction along a surface layer portion of the base layer 9. Accordingly, the base layer 9 is divided into multiple first regions 12 and multiple second regions 13 which are electrically disconnected from each other along the one direction. The first regions 12 and the second regions 13 are alternately disposed, and the second region 13 has a width larger than that of the first region 12.

N+ type emitter regions 14 are formed in a surface layer portion of each of the first regions 12 while being adjacent to the gate electrodes 10. An emitter electrode 15 is formed above the first regions 12. The emitter electrode 15 is connected to the base layer 9 and the emitter region 14 in each of the first regions 12. The first region 12 operates as both a channel region of the transistor device 5 and an anode region of the diode device 6. That is, the emitter electrode 15 in the first region 12 serves as an emitter electrode of the transistor device 5 and an anode electrode of the diode device 6.

Second regions 13a provided above a collector region 16 (to be described later) are connected to none of the electrodes. Second regions 13b provided above a cathode region 17 (to be described above) are connected to the emitter electrode 15. Accordingly, only the second region 13b of the second region 13 serves as the anode region of the diode device 6, with the second region 13b being provided above the cathode region 17. That is, the emitter electrode 15 serves as the anode electrode of the diode device 6 in the second region 13b.

A p+ type collector region 16 is formed in a lower surface layer portion of the semiconductor substrate 8 which corresponds to a range of region (which is located on a left side of the dotted line) in which the second regions 13a are formed, and an n+ type cathode region 17 is formed in a lower surface layer portion of the semiconductor substrate 8 which corresponds to a range of region (which is located on a right side of the dotted line) in which the second regions 13b are formed. The collector region 16 and the cathode region 17 are connected to a collector electrode 18. That is, a cathode electrode of the diode device 6 serves as the collector electrode 18 of the transistor device 5. An n type field stop layer 19 is formed between the semiconductor substrate 8 and the collector region 16/the cathode region 17.

In the drive control system illustrated in FIG. 1, a microcomputer 21 includes a PWM signal generation unit 22 that generates a high-side PWM signal FH and a low-side PWM signal FL for the half-bridge circuit 4. The PWM signals FH and FL have a dead time Td of predetermined period for which the PWM signals FH and FL are simultaneously set to an L level (off command-level). The PWM signals FH and FL are respectively input to drive IC's 24A and 24B via photo couplers 23A and 23B. In the present disclosure, an on-command signal represents H-level (on command-level) PWM signals FH and FL, and an off-command signal represents L-level (off command-level) PWM signals FH and FL.

Each of the drive IC's 24A and 24B includes a current detection unit 25; a Vf control unit 26; a pulse control unit 27; and a drive circuit 28. Power source voltages VDDA and VDDB (for example, 15 V) are respectively supplied to the drive IC's 24 and 24B such that the drive IC's 24A and 24B operate. The drive IC's 24A and 24B are independently provided for the high-side semiconductor element 1A and the low-side semiconductor element 1B, respectively. For this reason, the drive IC's 24A and 24B have sufficient breakdown voltages corresponding to the power source voltages VDDA and VDDB (that is, breakdown voltages corresponding to the gate drive voltages), respectively. Since the drive IC's 24A and 24B have the same configuration, the configuration of the drive IC 24B will be mainly described.

The current detection unit 25 is current detection device that outputs a current detection signal (the polarity and the magnitude of current) corresponding to a current flowing through the semiconductor element 1B based on a sense voltage VSL applied to the sense resistor 7B. The Vf control unit 26 and the pulse control unit 27 generate a gate drive signal SGL based on the PWM signal FL. The drive circuit 28 receives the gate drive signal SGL, and outputs a gate drive voltage VGL.

During a time period for which the PWM signal FL is at an H level, when the current of the semiconductor element 1B flowing in a forward direction of the diode device 6 is greater than or equal to a current threshold value It, the Vf control unit 26 performs control for shutting off the gate drive voltage VGL. This control acts to reduce a conduction loss by decreasing the voltage (a forward voltage Vf of the diode device 6 when the semiconductor element 1B is an RC-IGBT) of the semiconductor element 1B. In the description to be given hereinafter, this control is referred to as Vf control.

During the time period for which the PWM signal FL is at an H level, when a current flows through the semiconductor element 1B in the forward direction of the diode device 6, the pulse control unit 27 outputs the gate drive signal SGL with a pulse shape referenced to the falling of the PWM signal FL. The gate drive voltage VGL with a pulse shape (hereinafter, referred to as a gate drive pulse) is applied to a gate of the semiconductor element 1B based on the gate drive signal SGL. This control acts to reduce a reverse recovery current by reducing the amount of holes accumulated in the diode device 6. In the description to be given hereinafter, this control is referred to as pulse control.

The gate drive signal SGL generated by the Vf control unit 26 and the pulse control unit 27 is applied to the gate of the semiconductor element 1B via the drive circuit 28. The drive circuit 28 switches the drive capability of charging and discharging the gate in multiple ways. That is, when a rapid change in a current (element current) flowing through the semiconductor element 1B or a rapid change in voltage occurs, for example, when the PWM signal FL rises, or when the PWM signal FL falls in a state in which the current flows through the transistor device 5, the drive circuit 28 switches to a low drive capability so as to restrict the occurrence of a voltage surge. In this case, the drive circuit 28 is driven using a constant current circuit such that the drive circuit 28 is turned on. The drive circuit 28 is driven using a switch element with high on-resistance such that the drive circuit 28 is turned off.

In contrast, when a rapid change in the element current or the voltage does not occur as with the pulse control, the drive circuit 28 switches to a high drive capability. In this case, the drive circuit 28 is driven using a constant voltage circuit such that the drive circuit 28 is turned on. A switch element with a high on-resistance and a switch element with a low on-resistance connected in parallel to each other drive the drive circuit 28 such that the drive circuit 28 is turned off.

Threshold value setting circuits 29A, 30A, and 31A are externally attached to the drive IC 24A. Threshold value setting circuits 29B, 30B, and 31B are externally attached to the drive IC 24B. Each of the threshold value setting circuits 29A, 30A, and 31A is configured with respect to the reference potential of a floating ground FG, which is equal to the emitter potential of the semiconductor element 1A. The threshold value setting circuit 29A generates a threshold value voltage Vt by dividing the voltage VDDA using resistors R1 and R2, and the threshold value setting circuit 29B generates the threshold value voltage Vt by dividing the voltage VDDB using the resistors R1 and R2. The threshold value setting circuit 30A generates a specified voltage Vm1 by dividing the voltage VDDA using resistors R3 and R4, and the threshold value setting circuit 30B generates the specified voltage Vm1 by dividing the voltage VDDB using the resistors R3 and R4. The threshold value setting circuit 31A generates a specified voltage Vm2 by dividing the voltage VDDA using resistors R5 and R6, and the threshold value setting circuit 31B generates the specified voltage Vm2 by dividing the voltage VDDB using the resistors R5 and R6.

The threshold value voltage Vt determines the magnitude of the current threshold value It used by the Vf control unit 26. The characteristic of the forward voltage Vf with respect to a forward current If of the diode device 6 varies depending on the types (an RC-IGBT, a MOS transistor, and the like) of elements or the breakdown voltage of an element. The Vf control unit 26 properly selects the current threshold value It based on a switch signal Sk applied from the outside and the threshold value voltage Vt.

The specified voltage Vm1 determines the magnitude of a specified value Im1 used to determine whether to stop the Vf control. The specified voltage Vm2 determines the magnitude of a specified value Im2 used to determine whether to stop the pulse control. There is a problem in that the polarity of a current is reversed due to a control delay when the current is detected, and when the gate drive voltages VGH and VGL are applied based on the polarity of the detected current. For this reason, when a current detection value is less than the specified value Im1, the Vf control unit 26 stops the Vf control, and when the current detection value is less than the specified value Im2, the pulse control unit 27 stops the pulse control.

A drive control device 32A is formed of the drive IC 24A and the sense resistor 7A, and a drive control device 32B is formed of the drive IC 24B and the sense resistor 7B.

Figure 4:
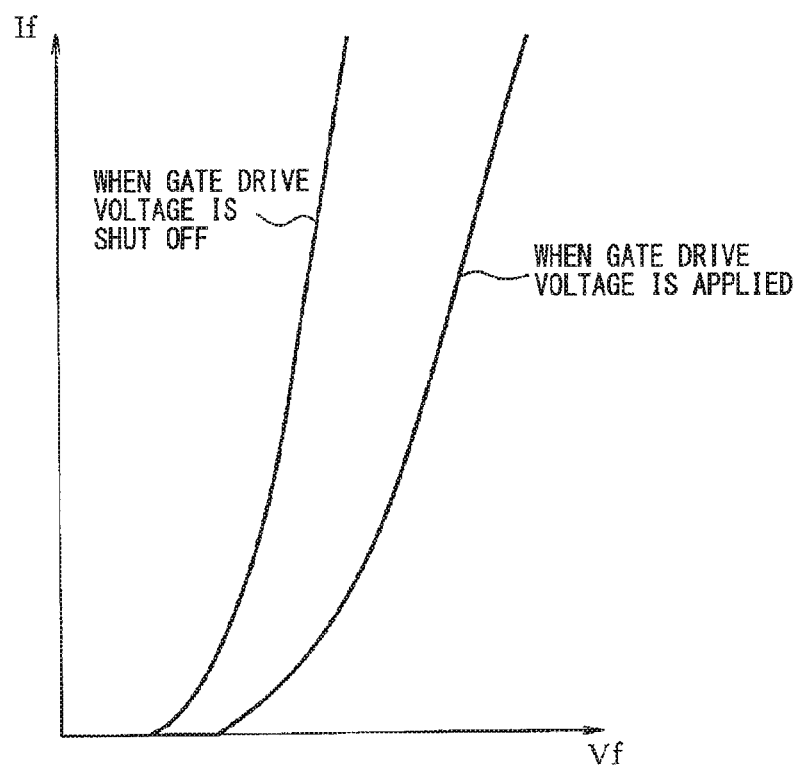
FIG. 4 is a forward voltage-to-current characteristic graph of a diode device.

Hereinafter, the operation of the low-side drive control device 32B will be mainly described with reference to FIGS. 4 and 5. The high-side drive control device 32A also operates in the same manner.

First, the Vf control will be described. When a gate drive voltage is applied to each of the semiconductor elements 1A and 1B, which are RC-IGBT's, in a state where a current flows through the diode device 6, a channel is formed in each of the first regions 12, and the injection of holes is restricted. For this reason, as illustrated in FIG. 4, the forward voltage Vf of the diode device 6 through which the forward current If flows increases, and the conduction loss (Vf×If) of the diode device 6 increases.

Also when the semiconductor elements 1A and 1B are MOS transistors (refer to a second embodiment), the same operation occurs. Typically, to the extent that the thickness of a drift region is increased by allowing an element to have a high breakdown voltage, the ratio of the resistance of a channel to the entire on-resistance decreases, and the conduction loss of the diode device 6 tends to increase when the gate drive voltage is applied.

When the semiconductor elements 1A and 16 are RC-IGBT's, at a small current value (the current threshold value It), the conduction loss of the diode device 6 at the shutting off of the gate drive voltage becomes equal to the conduction loss of the diode device 6 at the application of the gate drive voltage. In the case illustrated in FIG. 4, the current value is approximately zero. In contrast, when the semiconductor elements 1A and 1B are MOS transistors, at a relatively large current value (the current threshold value It), the conduction loss of the diode device 6 at the shutting off of the gate drive voltage becomes equal to the conduction loss of the transistor device 5 at the application of the gate drive voltage (refer to FIG. 6). That is, the current threshold value It varies depending on the types or the breakdown voltage of the semiconductor elements 1A and 1B, and thus, the current threshold value It is measured in advance.

For example, the switch signal Sk switches to an L level to drive the RC-ICBT, and the switch signal Sk switches to an H level to drive the MOS transistor. The switch signal Sk is a threshold value specifying signal that is input from the outside to specify the current threshold value It. When the switch signal Sk is at an L level, the Vf control unit 26 sets the current threshold value It to zero, and executes the Vf control. In contrast, when the switch signal Sk is at an H level, the Vf control unit 26 sets the current threshold value It according to the threshold value voltage Vt input from the outside, and executes the Vf control.

Figure 5:
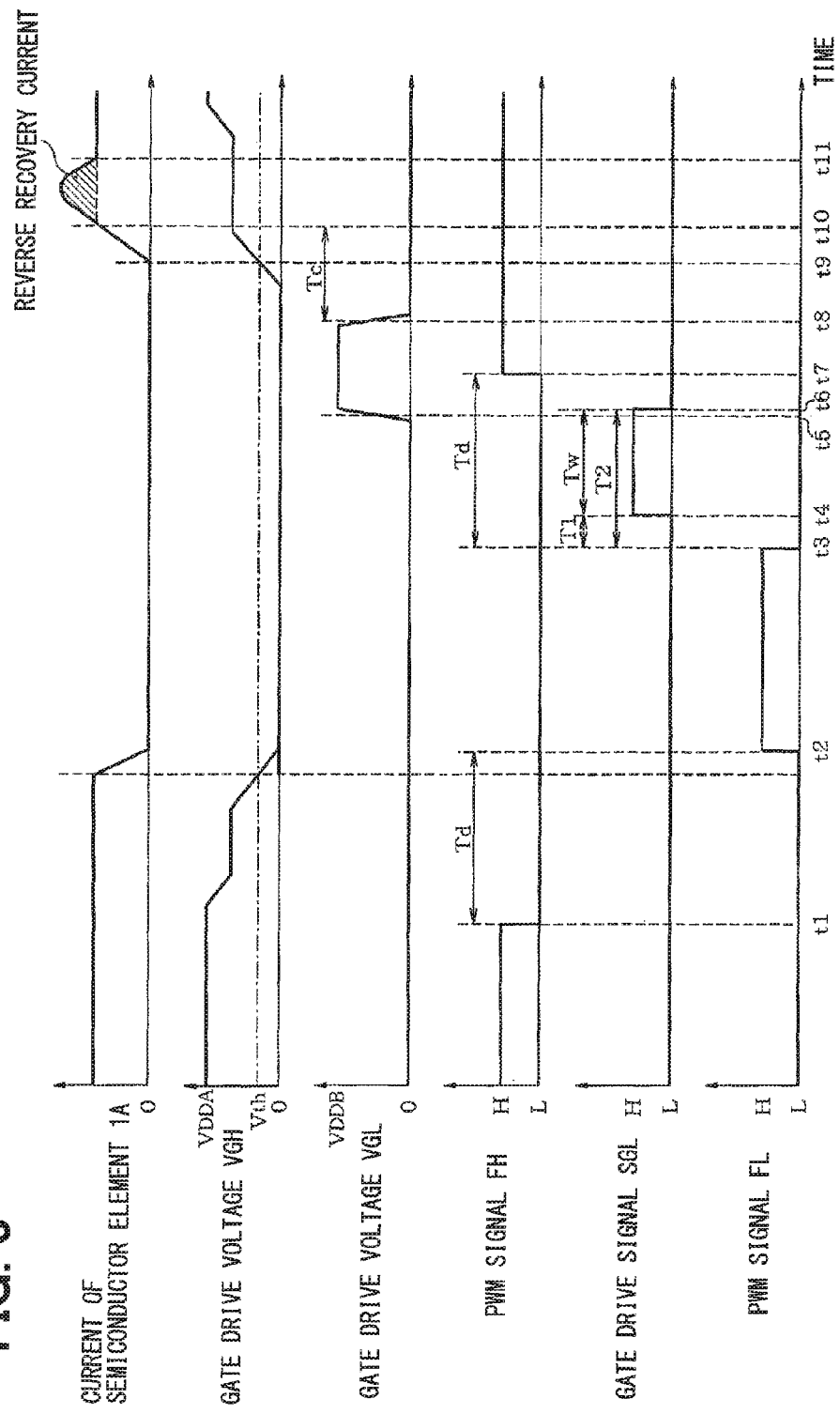
FIG. 5 illustrates waveform graphs in Vf control and pulse control.

FIG. 5 illustrates waveforms when the semiconductor element 1A is turned off, the semiconductor element 1B is turned on, and then, the semiconductor element 1B is turned off, and the semiconductor element 1A is turned again on in a state where a current flows toward a load from the output terminal Nt. The current of the semiconductor element 1A, the gate drive voltages VGH and VGL, the PWM signal FH, the gate drive signal SGL to command the gate drive voltage VGL, the PWM signal FL are illustrated sequentially from the top. Vth is the threshold value voltage of the semiconductor element 1A.

When conduction switches between the upper arm and the lower arm, and the gate drive voltage VGH is greater than or equal to the threshold value voltage Vth (time t9), a current increasingly flows through the transistor device 5 of the semiconductor element 1A. In the case illustrated in FIG. 5, the reverse recovery current represents a fraction of the increasing current of the transistor device 5 exceeding the amount of current flowing through the diode device 6 of the semiconductor element 1B. The reverse recovery current is illustrated by hatching in the drawing (time t10 to time t11).

The Vf control unit 26 of the drive IC 24B determines whether or not the detected current of the diode device 6 in the forward direction is greater than or equal to the current threshold value It during a time period (time t2 to time t3) for which the PWM signal FL is at an H level. When it is determined that the detected current is less than the current threshold value It, the Vf control unit 26 outputs the H-level gate drive signal SGL. The gate drive voltage VGL according to a delay in the drive circuit 28, the element capacitor charging time of the semiconductor element 1B, and the like is applied to a gate of the semiconductor element 1B based on the gate drive signal SGL. In contrast, when it is determined that the detected current is greater than or equal to the current threshold value It (the case illustrated in FIG. 5), the Vf control unit 26 outputs the L-level gate drive signal SGL. Accordingly, the gate drive voltage VGL is shut off.

Hereinafter, the pulse control will be described. The pulse control represents control by which when a current flows through the diode device 6 of the semiconductor element 1B during the time period for which the PWM signal FL is at an H level, a gate drive pulse is applied to the semiconductor element 1B until the reverse recovery current starts to flow after the PWM signal FL falls to an L level. Similarly, when a current flows through the diode device 6 of the semiconductor element 1A during a time period for which the PWM signal FH is at an H level, after the PWM signal FH falls to an L level, the pulse control is performed. Accordingly, the amount of carriers (holes) accumulated in the diode device 6 is reduced, and thus, it is possible to obtain the effect of reducing the reverse recovery current.

In FIG. 5, during the time period for which the PWM signal FL is at an H level, and more preferably, when the PWM signal FL falls to an L level (time t3), the pulse control unit 27 determines whether or not a current flows through the diode device 6 of the semiconductor element 1B. When the current flows through the diode device 6 (additionally when the current detection value is greater than or equal to the specified value Im2), the gate drive signal SGL is set to an H level from when a first time period T1 has elapsed (time t4) to when a second time period T2 has elapsed (time t6), starting from when the PWM signal FL falls. Due to the Vf control, the gate drive signal SGL is set to an L level when the PWM signal FL falls.

Also after the PWM signal FL falls to an L level, the pulse control unit 27 continues to determine whether or not a current flows through the diode device 6 of the semiconductor element 1B. When the current detection value is less than the specified value Im2, the pulse control unit 27 immediately causes the gate drive signal SGL to return to an L level even before the second time period T2 has elapsed after the first time period T1 has elapsed.

In contrast, if it is determined that a current does not flow through the diode device 6 when the PWM signal FL falls to an L level, the pulse control unit 27 immediately maintains the gate drive signal SGL at an L level. That is, the gate drive pulse is not applied.

The first time period T1 and the second time period T2 are set in advance in order for an arm short circuit not to occur. During the time period for which the PWM signal FL is at an L level, when a current flows through the diode device 6, the waveform of the gate drive voltage VGL at the application of the gate drive pulse is different from that when a current flows through the transistor device 5.

Since the collector-to-emitter voltage of the semiconductor element 1B does not change when a current flows through the diode device 6, a mirror time period does not occur. A rapid change in the current and the voltage of the semiconductor element 1B does not occur. For this reason, when the gate drive voltage VGL rises and falls, the drive circuit 28 is capable of outputting the gate drive voltage VGL at a gate drive capability higher than in a normal state. When a current flows through the diode device 6, there is no possibility that a short circuit on a path via each of the semiconductor elements 1A and 1B occurs. For this reason, in the middle of an increase in the gate drive voltage VGL, it is not necessary to perform two-stage drive by which the gate drive voltage VGL is temporarily held at an intermediate voltage, and a short-circuit current at the occurrence of a short circuit in the other side semiconductor element 1A is reduced.

While the waveform of the gate drive voltage VGL and the drive pattern of the drive circuit 28 are taken into consideration when the gate drive pulse is applied, the first time period T1 and the second time period T2 are set in order for the gate drive voltage VGL to simply increase or decrease according to the gate drive capability of the drive circuit 28. A time period Tc (a carrier re-injection time period) from when the application of the gate drive pulse ends to when the reverse recovery current starts to flow is set to be greater than zero, and is less than or equal to an injection allowance time period. The injection allowance time period is specified according to the allowed magnitude of the reverse recovery current.

Specifically, the first time period T1 and the second time period T2 are set by pre-measuring a timing at which the gate drive signal SGL is applied, a timing at which the gate drive voltage VGL is actually applied, and a timing at which the reverse recovery current starts to flow, starting from when the PWM signal FL falls, while diversely changing a current flowing through the diode device 6. In this embodiment, the first time period T1 and the second time period T2 are stored in a memory or the like of the pulse control unit 27 while being associated with a current. The first time period T1 and the second time period T2 can be generated using one or several patterns of logic circuits, an analog delay circuit, or the like.

When applying the gate drive pulse, the pulse control unit 27 obtains a current flowing through the diode device 6 with reference to a current detection signal, and reads the first time period T1 and the second time period T2 from the memory corresponding to the value of the current. The pulse control unit 27 causes the gate drive signal SGL to rise when the first time period T1 has elapsed, and the gate drive signal SGL to fall when the second time period T2 has elapsed, starting from when the PWM signal FL falls.

As described above, in this embodiment, when it is determined that the current (diode current) of the semiconductor elements 1A and 1B flowing in the forward direction of the diode device 6 is greater than or equal to the current threshold value It (zero in this embodiment) during the time period for which the respective PWM signals FH and FL are at an H level, the drive control devices 32A and 32B set the respective gate drive signals SGH and SGL to an L level. The current threshold value It is a current value at which the conduction losses of the semiconductor elements 1A and 1B at the shutting off of the respective gate drive voltages VGH and VGL become respectively equal to the conduction losses of the semiconductor elements 1A and 1B at the application of the respective gate drive voltages VGH and VGL. Due to the Vf control, the conduction loss of the diode device 6 can be reduced regardless of the types or the breakdown voltages of the semiconductor elements 1A and 1B.

When conduction switches between the upper arm and the lower arm, and it is determined that a current flows through the semiconductor elements 1A and 1B in the forward direction of the diode device 6 during the time period for which the respective PWM signals FH and FL are at an H level, the drive control devices 32A and 32B output the gate drive signals SGH and SGL to command the application of the gate drive pulse, respectively. Due to the pulse control, the amount of holes accumulated in the diode device 6 is reduced such that the reverse recovery current is reduced, and thus, a switching loss can be reduced.

The respective pulse control units 27 of the drive IC's 24A and 24B set the respective gate drive signals SGH and SGL to an H level from when the first time period T1 has elapsed to when the second time period T2 has elapsed, starting from when the respective PWM signals FH and FL fall. Since the falling of each of the PWM signals FH and FL is a starting point of the dead time Td, while an arm short circuit is prevented from occurring, the gate drive pulse can be applied by effectively using the dead time Td of predetermined period.

The first time period T1 and the second time period T2 are set based on delays or variations in the gate drive voltages VGH and VGL which are pre-measured corresponding to the dead time Td and the element current, and a time period until the reverse recovery current starts to flow. The first time period T1 and the second time period T2 are set while the waveform of the gate drive voltage and the drive pattern of the drive circuit 28 at the application of the gate drive pulse are taken into consideration. Accordingly, a wide pulse width Tw of the gate drive pulse can be ensured. The accuracy of the application timing of the gate drive pulse can be improved, and the re-injection time period Tc can be accurately controlled. As a result, the re-injection time period Tc can be controlled to be short while an arm short circuit is prevented from occurring, and a switching loss can be further reduced.

Even during a time period (time t4 to time t6) for which the gate drive pulse is applied based on the pulse control, when it is determined that a current may not flow through the diode device 6 (a current detection value may become less than the specified value Im2) or a current does not flow through the diode device 6, the pulse control unit 27 immediately stops applying the gate drive pulse. Accordingly, even if the load current changes rapidly, an arm short circuit can be reliably prevented from occurring. In addition, it is not necessary to set the specified value Im2 to a high value in preparation for a rapid change in the load current, and thus, a wide range of current with which the pulse control is executed can be ensured, and a switching loss can be further reduced.

Since the pulse control unit 27 applies the gate drive signal, starting from when the PWM signals FH and FL fall, the pulse control unit 27 does not require a separate timing signal, and a drive control device in the related art is easily switched to the drive control device in this embodiment. Each of the drive control devices 32A and 32B has a short control loop, and thus, high responsiveness can be obtained. Since the drive IC's 24A and 24B are provided on a half-bridge circuit 4 side via the respective photo couplers 23A and 23B, the current detection units 25 do not require an insulation function.

When the magnitude of the load current becomes less than the specified values Im1 and Im2, the Vf control unit 26 and the pulse control unit 27 stop the Vf control and the pulse control, respectively, and perform normal control. The normal control represents control by which, regardless of a current flowing through the diode device 6, the gate drive signal is set to rise when the PWM signal rises, and the gate drive signal is set to fall when the PWM signal falls. Accordingly, a decrease in the accuracy of current detection can be prevented from causing erroneous control.

Second Embodiment

A second embodiment, in which MOS transistors are used in the semiconductor elements 1A and 1B, will be described with reference to FIGS. 6 and 7. The drive control devices 32A and 32B have the configuration illustrated in FIG. 1. The operation of the low-side drive control device 32B will be mainly described. The high-side drive control device 32A also operates in the same manner.

When MOS transistors are used as the semiconductor elements 1A and 1B, the switch signal Sk switches to an H level. The drive control device 32B sets the current threshold value It according to the threshold value voltage Vt input from the threshold value setting circuit 29B, and executes the Vf control.

Figure 6:
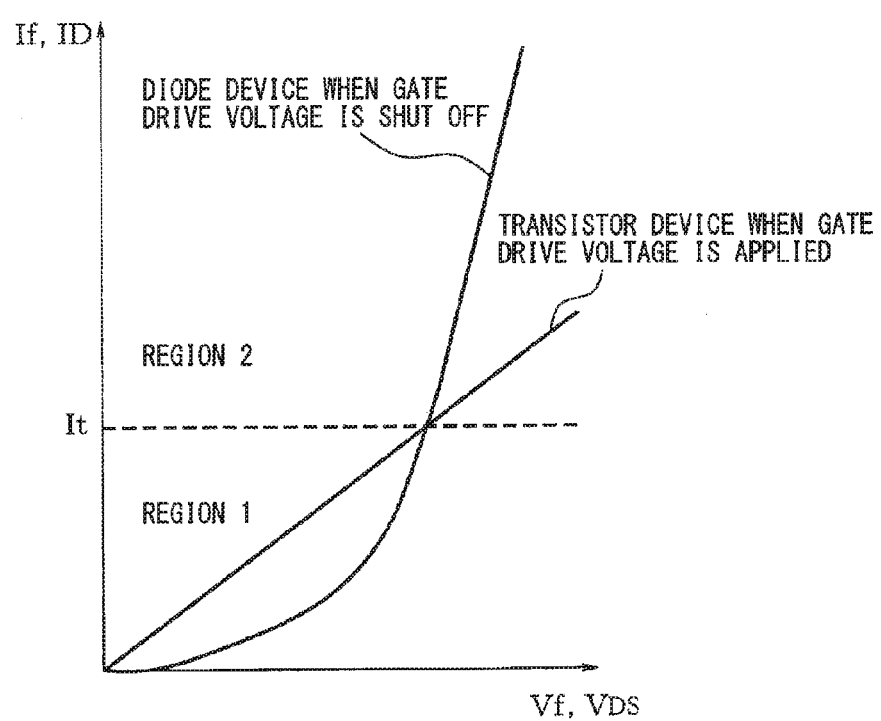
FIG. 6 is a voltage-to-current characteristic graph when a current flows through a MOS transistor in a forward direction of a diode device in a second embodiment.

FIG. 6 is a voltage-to-current characteristic graph when a current flows through the MOS transistor in the forward direction of the diode device 6. A magnitude relationship between the forward voltage Vf of the diode device 6 at the shutting off of the gate drive voltage and a drain-to-source voltage VDS of the transistor device 5 at the application of the gate drive voltage is reversed at the current threshold value It as the boundary. In region 1 in which the voltage VDS is lower than the voltage Vf, a conduction loss can be reduced by applying the gate drive voltage. In region 2 in which the voltage VDS is higher than or equal to the voltage Vf, a conduction loss can be reduced by shutting off the gate drive voltage.

During a time period for which the PWM signal FL is at an H level, when a current in the range of region 1 flows through the semiconductor element 1B, the Vf control unit 26 executes normal control (synchronous rectification) by which the gate drive voltage VGL is applied. Thereafter, when the PWM signal FL is set to an L level, the gate drive pulse is required to be applied to the semiconductor element 1B.

In this case, after the Vf control unit 26 sets the gate drive signal SGL to an L level, the pulse control unit 27 may set the gate drive signal SGL to an H level from when the first time period T1 has elapsed to when the second time period T2 has elapsed, starting from when the PWM signal FL falls. However, when the gate drive voltage VGL is continuously applied rather than being shut off until the second time period T2 has elapsed, a conduction loss can be reduced. In order to perform the pulse control in succession after the Vf control, the Vf control unit 26 extends and outputs the H-level gate drive signal SGL until time t3 is exceeded and the second time period T2 has elapsed (time t6) (extension of pulse).

During the time period for which the PWM signal FL is at an H level, when a current in the range of region 2 flows through the semiconductor element 1B, the Vf control unit 26 and the pulse control unit 27 output the same gate drive signal SGL as when controlling the RC-IGBT illustrated in FIG. 5. During the time period for which the PWM signal FL is at an H level, when a current in each of the ranges of region 1 and region 2 does not flow through the semiconductor element 1B, that is, when a current flows through the MOS transistor in a forward direction thereof (a reverse direction of the diode device 6), the Vf control unit 26 and the pulse control unit 27 perform the normal control. In this embodiment, the same effects as in the first embodiment can be obtained.

Third, Fourth, and Fifth Embodiments

Figure 8:
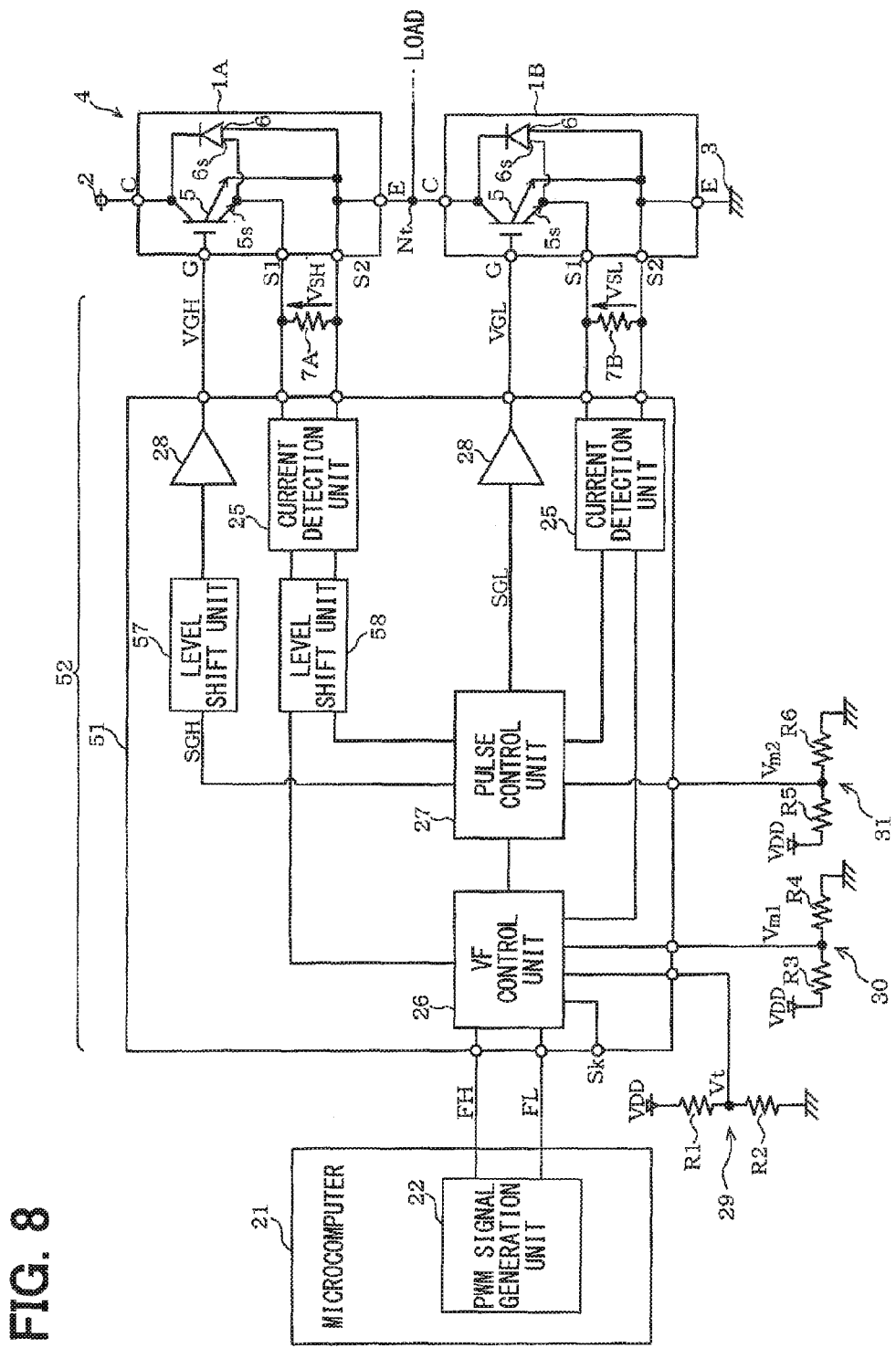
FIG. 8 is a diagram illustrating the configuration of a drive control system in a third embodiment.
Figure 9:
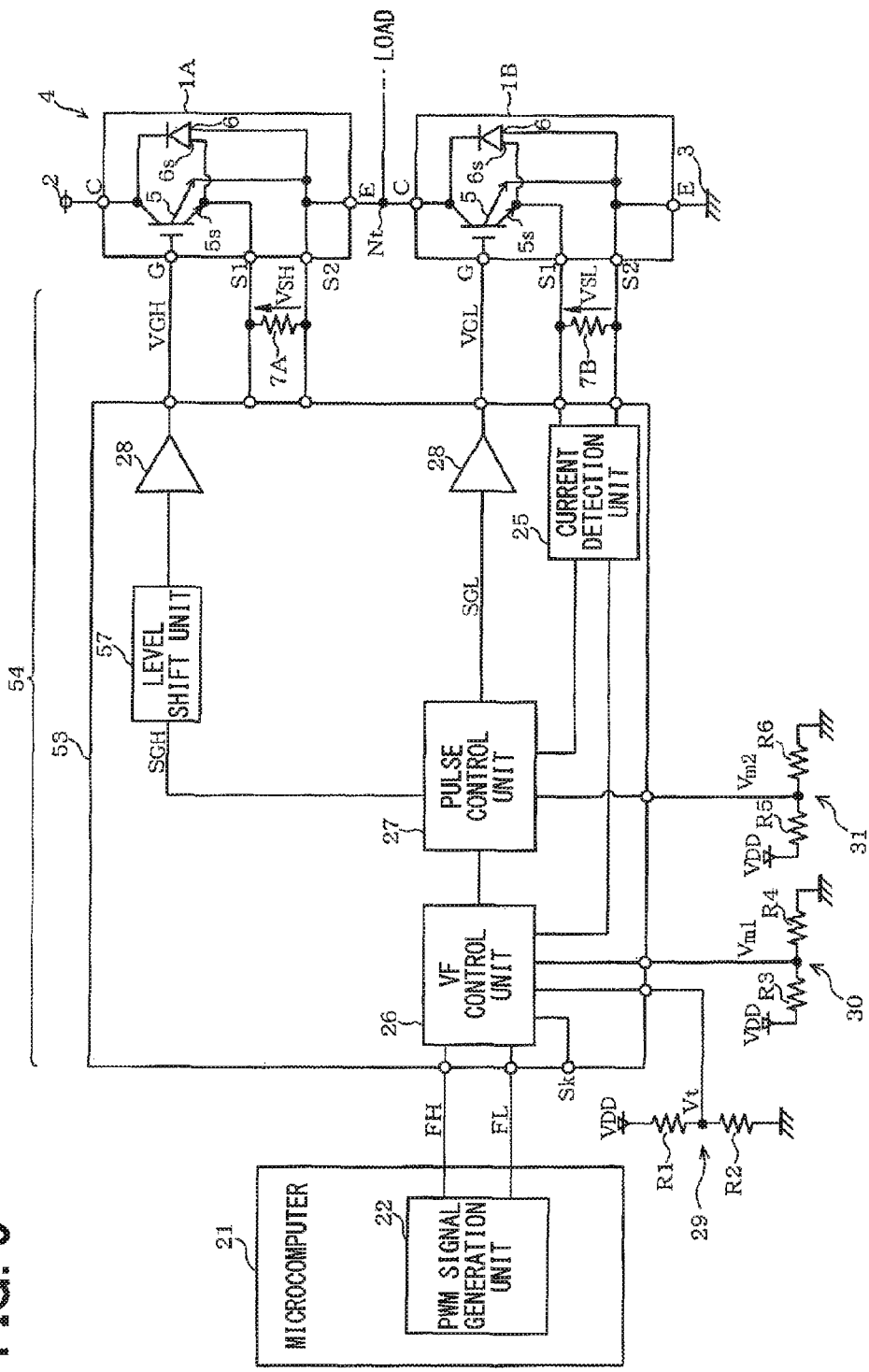
FIG. 9 is a diagram illustrating the configuration of a drive control system in a fourth embodiment.
Figure 10:
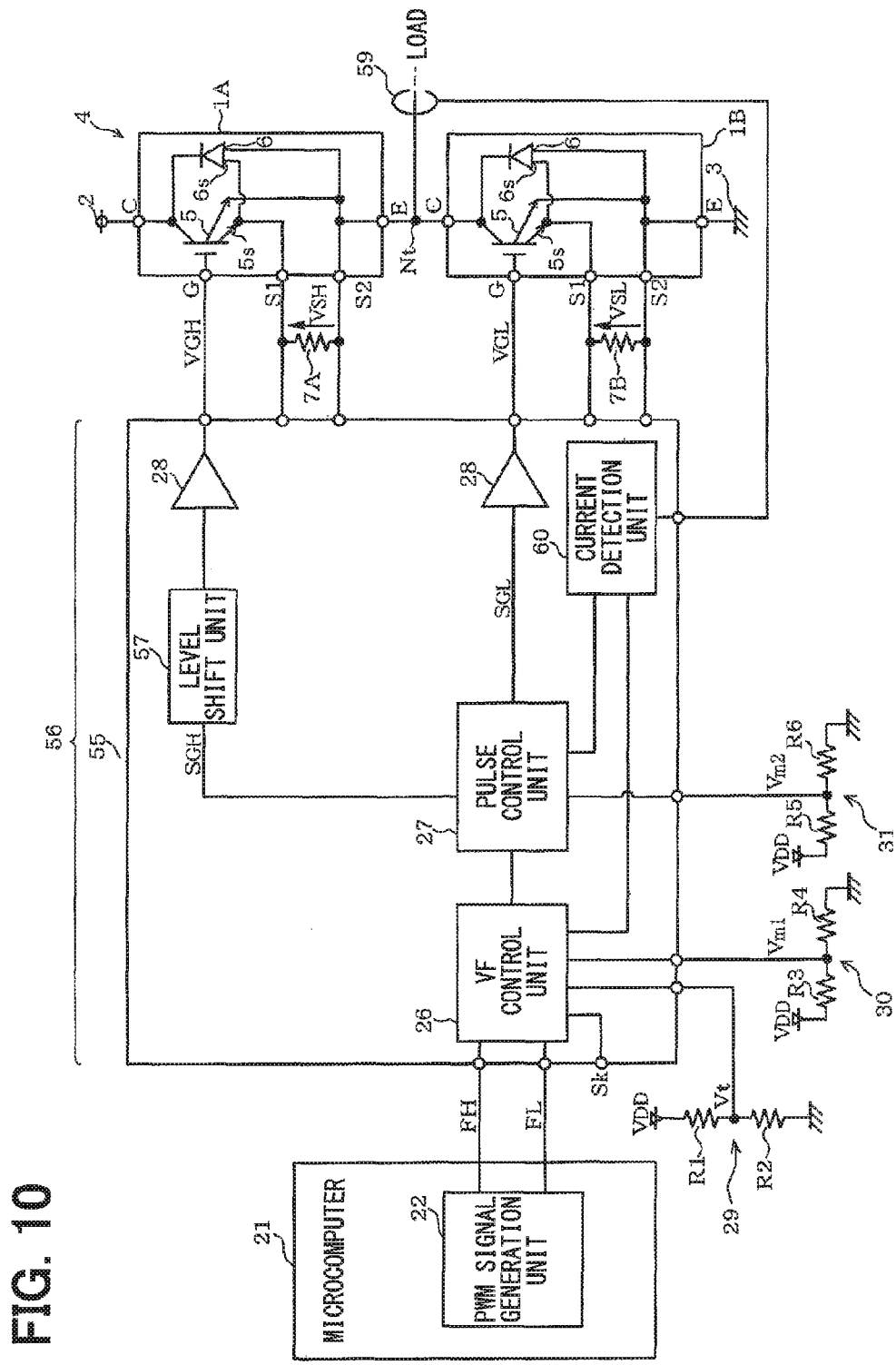
FIG. 10 is a diagram illustrating the configuration of a drive control system in a fifth embodiment.

FIG. 8 illustrates a drive control device 52 using a drive IC 51 with a high breakdown voltage, FIG. 9 illustrates a drive control device 54 using a drive IC 53 with a high breakdown voltage, and FIG. 10 illustrates a drive control device 56 using a drive IC 55 with a high breakdown voltage. The high breakdown voltage represents a breakdown voltage corresponding to a power source voltage applied to the half-bridge circuit 4. Each of the drive control devices 52, 54, and 56 controls the driving of two semiconductor elements 1A and 1B of the half-bridge circuit 4.

Each of the drive IC's 51, 53, and 55 includes the Vf control unit 26 and the pulse control unit 27 which are common to the semiconductor elements 1A and 1B. A power source voltage VDD (for example, 15 V) is applied to the drive IC's 51, 53, and 55 such that the drive IC's 51, 53, and 55 operate. The gate drive signal SGH is applied to the semiconductor element 1A via a level shift circuit 57 and the drive circuit 28, and the gate drive signal SGL is applied to the semiconductor element 1B via the drive circuit 28.

The drive IC 51 includes the current detection units 25 which respectively output current detection signals based on the sense voltage VSH applied to the sense resistor 7A and the sense voltage VSL applied to the sense resistor 7B. The high-side current detection unit 25 outputs a current detection signal via a level shift circuit 58. The drive IC 53 has a configuration in which the high-side current detection unit 25 and the level shift circuit 58 are omitted. The drive IC 55 includes a current detection circuit 60, and receives a sense signal from a hole sensor 59 or the like instead of the sense voltage VSL. The current detection unit 25 of the drive IC 53 and the current detection circuit 60 of the drive IC 55 estimate a current flowing through one semiconductor element (for example, the semiconductor element 1A) of the semiconductor elements 1A and 1B based on a detection signal of a current flowing through the other semiconductor element (for example, the semiconductor element 1B). The rest of the configuration is the same as in the first embodiment.

The pulse control unit 27 generates the gate drive signals SGH and SGL, and is capable of prohibiting the gate drive voltage from being applied to one semiconductor element of the two semiconductor elements 1A and 1B during a time period for which the gate drive voltage is applied to the other semiconductor element. The PWM signals FH and FL are input to the Vf control unit 26 of a control IC 63, and thus, the Vf control unit 26 and the pulse control unit 27 are capable of integrally controlling the one arm and the other arm, and an arm short circuit can be reliably prevented from occurring. The current detection unit 25 or the current detection circuit 60 can be common to the high side and the low side, and thus, a circuit configuration can be simplified (refer to FIGS. 9 and 10). When the current detection unit 25 or the current detection circuit 60 is common to the high side and the low side, the high-side specified values Im1 and Im2 are preferably set to be greater than in the first embodiment based on the specified voltages Vm1 and Vm2 which are respectively generated by the threshold value setting circuits 30 and 31. The same operations and effects as in the first and second embodiments can be obtained.

Sixth and Seventh Embodiments

Figure 11:
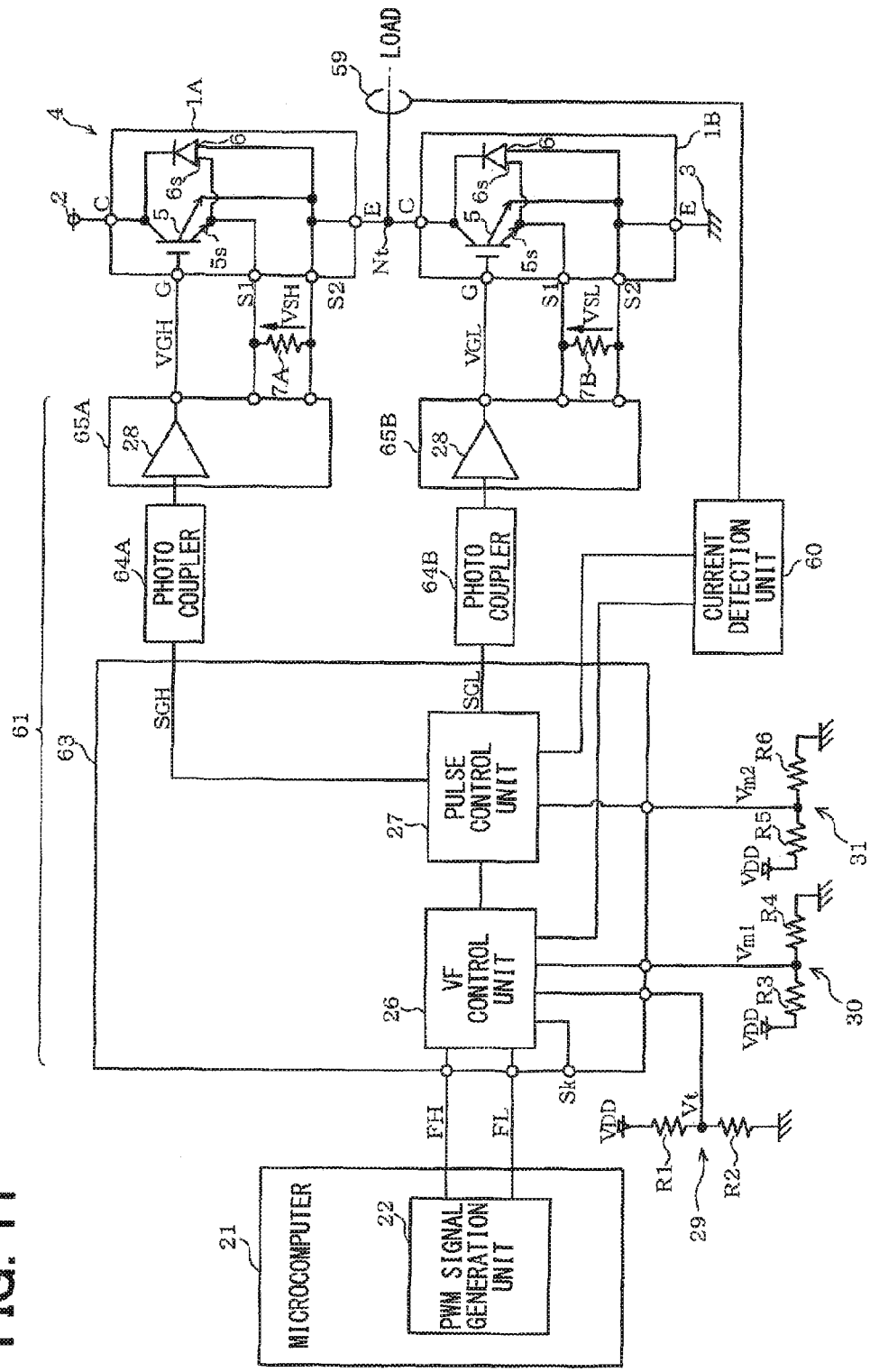
FIG. 11 is a diagram illustrating the configuration of a drive control system in a sixth embodiment.
Figure 12:
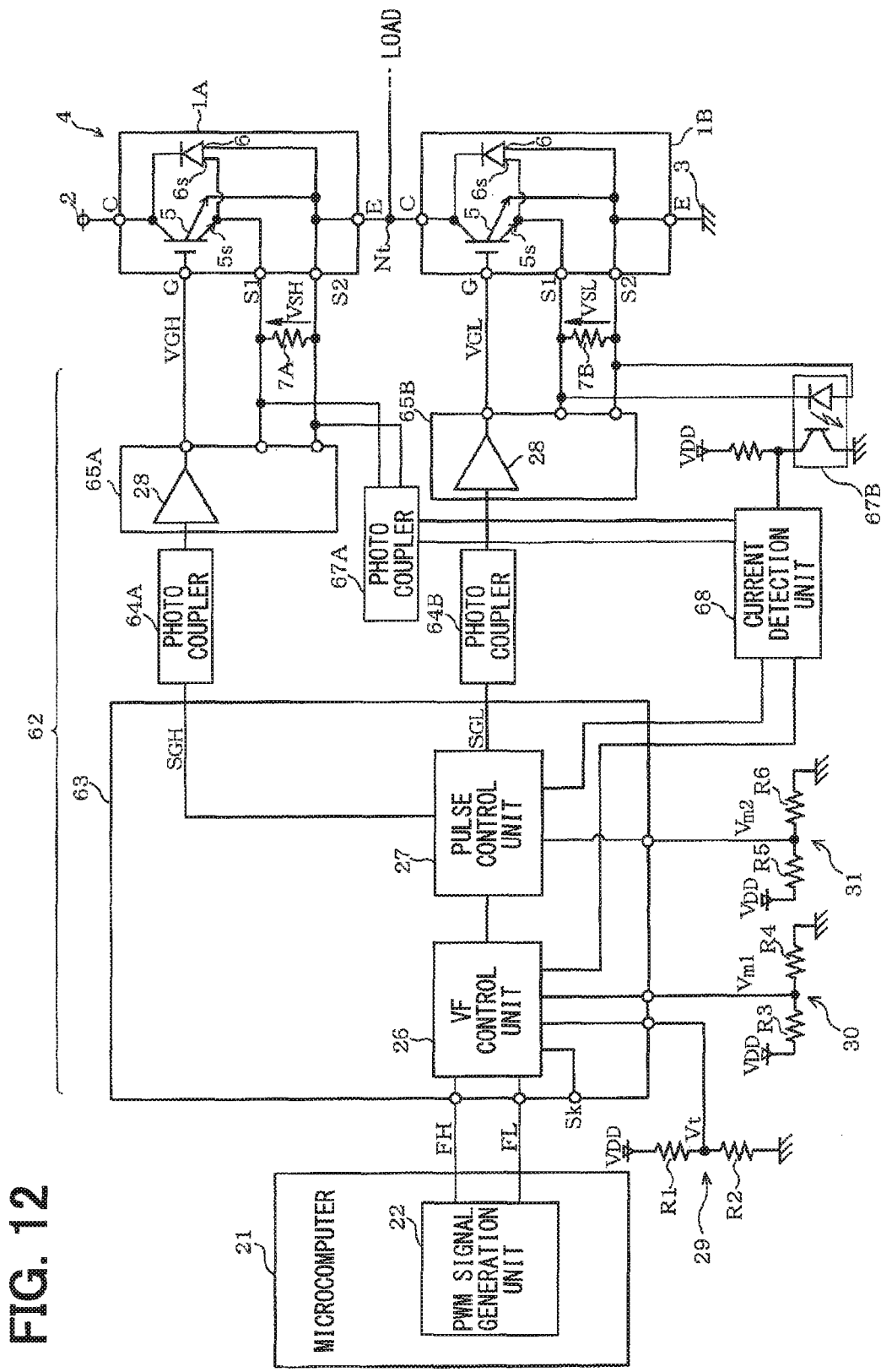
FIG. 12 is a diagram illustrating the configuration of a drive control system in a seventh embodiment.

FIGS. 11 and 12 respectively illustrate drive control devices 61 and 62, each of which is configured such that the control unit is provided separately from the drive circuit. Each of the drive control devices 61 and 62 controls the driving of the two semiconductor elements 1A and 1B of the half-bridge circuit 4. The drive control device 61 is configured to include a control IC 63; photo couplers 64A and 64B; drive IC's 65A and 65B; the current detection circuit 60; and the like.

The control IC 63 is made up of a dedicated ASIC, a hard intellectual property (IP) of a microcomputer, an FPGA, or the like, and the Vf control unit 26 and the pulse control unit 27 are mounted on the control IC 63. The photo couplers 64A and 64B are insulated circuits through which the gate drive signals SGH and SGL are respectively transmitted to the drive IC's 65A and 65B while being electrically insulated. Each of the drive IC's 65A and 65B includes the drive circuit 28, and the drive IC's 65A and 65B receive the gate drive signals SGH and SGL, and output the gate drive voltages VGH and VGL, respectively. The current detection circuit 60 detects a load current using the hole sensor 59 or the like, and outputs a current detection signal to the control IC 63.

The drive control device 62 includes photo couplers 67A and 67B which input the respective sense voltages VSH and VSL instead of the hole sensor 59 and the current detection circuit 60, and a current polarity detection circuit 68. The current polarity detection circuit 68 detects the value or the direction (polarity) of a current flowing through the semiconductor elements 1A and 1B. That is, the current polarity detection circuit 68 may detect the magnitude of current, or may detect only the polarity of current. Accordingly, the pulse control, and the Vf control of an RC-IGBT can be executed.

Also in this embodiment, the pulse control unit 27 is capable of prohibiting the gate drive voltage from being applied to one semiconductor element of the two semiconductor elements 1A and 1B during a time period for which the gate drive voltage is applied to the other semiconductor element. Accordingly, an arm short circuit can be reliably prevented from occurring.

Since the PWM signals FH and FL are input to the Vf control unit 26 of the control IC 63, the Vf control unit 26 and the pulse control unit 27 are capable of integrally controlling the one arm and the other arm. Also in the embodiment, the same operations and effects as in the first and second embodiments can be obtained. In the seventh embodiment, similar to the fourth embodiment, either one of the photo couplers 67A and 67B may be omitted. In this case, the sense elements (5s and 6s) and the sense resistor (7) corresponding to each of the omitted photo couplers 67A and 67B may be omitted. In this case, the current polarity detection unit 68 estimates the polarity of a current flowing through one semiconductor element (for example, the semiconductor element 1A) based on a polarity detection signal of a current flowing through the other semiconductor element (for example, the semiconductor element 1B). A photo coupler with the same configuration as the photo couplers 67A and 67B may not be provided in a front stage of the current polarity detection unit 68, but in a rear stage of the current polarity detection unit 68. The current detection circuit 60 or the current polarity detection circuit 68 may be formed inside the control IC 63 or the drive IC 65.

Eighth and Ninth Embodiments

Figure 13:
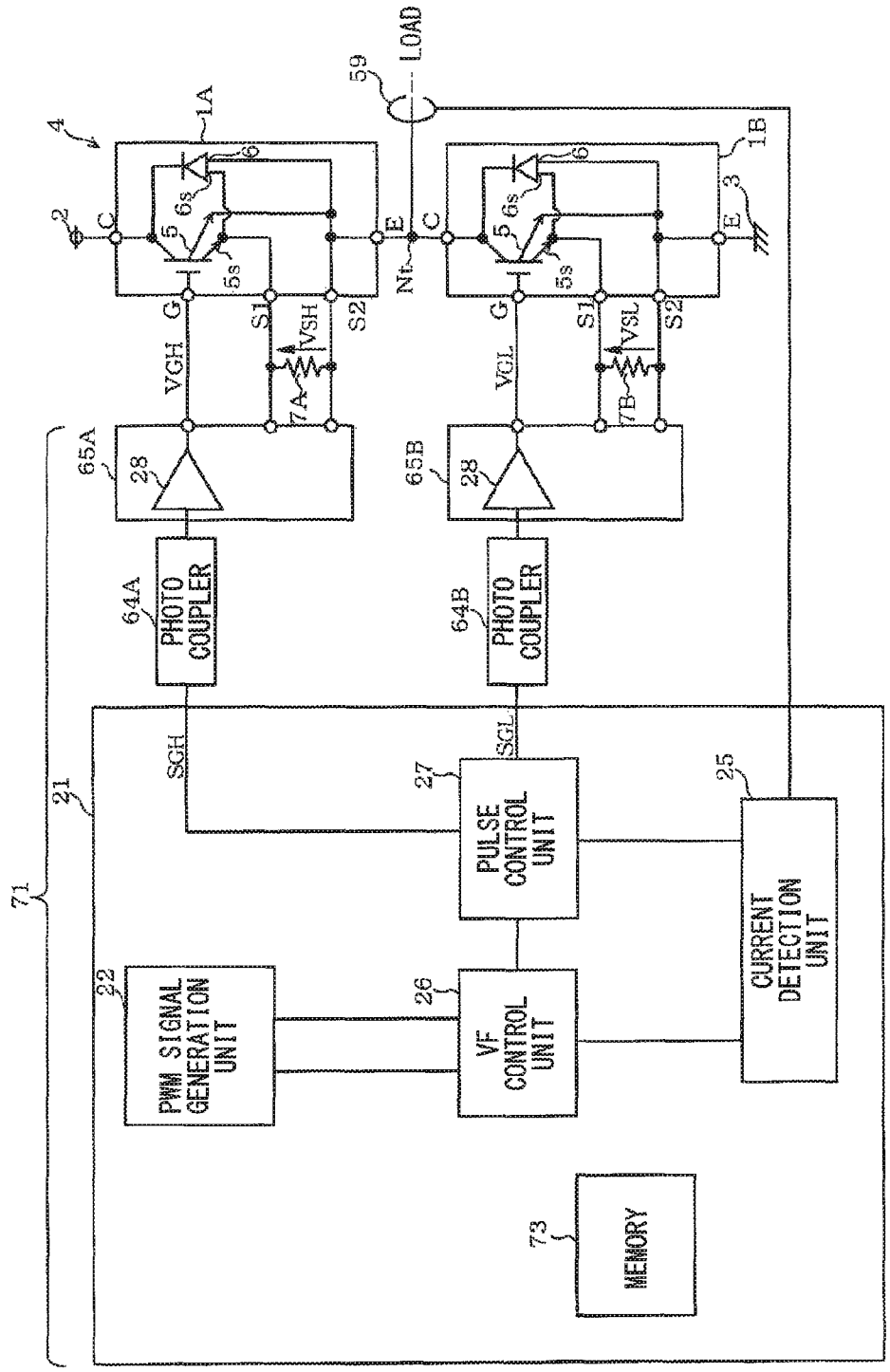
FIG. 13 is a diagram illustrating the configuration of a drive control system in an eighth embodiment.
Figure 14:
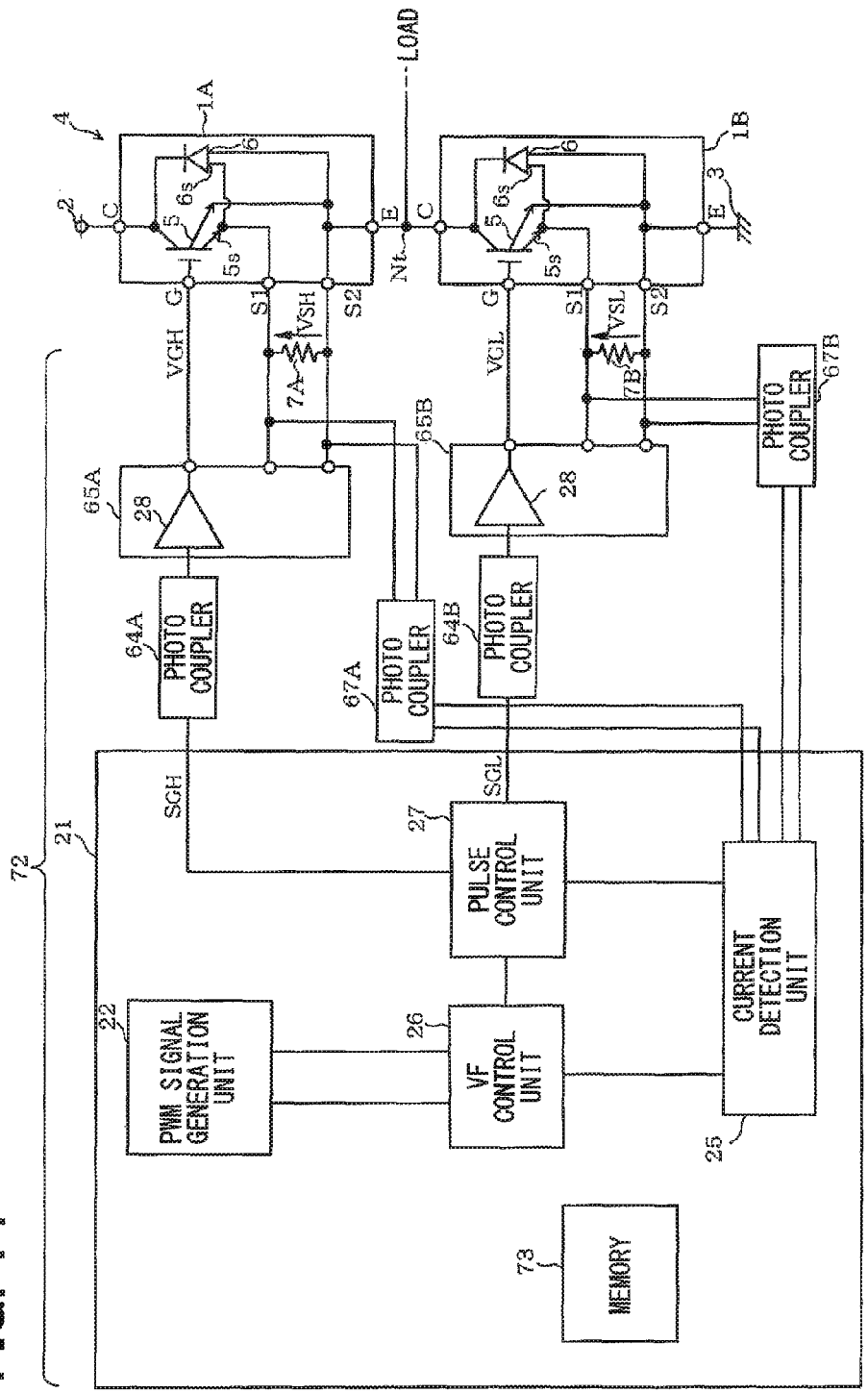
FIG. 14 is a diagram illustrating the configuration of a drive control system in a ninth embodiment.

FIGS. 13 and 14 respectively illustrate drive control devices 71 and 72, each of which is configured such that the control unit is provided separately from the drive circuit, and the Vf control unit 26, the pulse control unit 27, and the current detection unit 25 are built into the microcomputer 21. Each of the drive control devices 71 and 72 controls the driving of the two semiconductor elements 1A and 1B of the half-bridge circuit 4. The drive control device 71 is configured to include the microcomputer 21; the photo couplers 64A and 64B; the drive IC's 65A and 65B; and the like. The drive control device 72 includes the photo couplers 67A and 67B which input the sense voltages VSH and VSL, respectively.

The microcomputer 21 realizes the functions of the Vf control unit 26, the pulse control unit 27, and the current detection unit 25 by executing a control program that is stored in a memory 73 in advance. The microcomputer 21 of the drive control device 71 obtains a current detection signal based on a sense signal input from the hole sensor 59. The microcomputer 21 of the drive control device 72 obtains a current detection signal from output signals from the photo couplers 67A and 67B. The memory 73 stores the first time period T1, the second time period T2, a threshold value, and the like in addition to the control program.

Also in this embodiment, the pulse control unit 27 is capable of prohibiting the gate drive voltage from being applied to one semiconductor element of the two semiconductor elements 1A and 1B during a time period for which the gate drive voltage is applied to the other semiconductor element. Accordingly, an arm short circuit can be reliably prevented from occurring.

Since the PWM signals FH and FL are input to the Vf control unit 26 of the microcomputer 21, the Vf control unit 26 and the pulse control unit 27 are capable of integrally controlling the one arm and the other arm. Also in the embodiment, the same operations and effects as in the first and second embodiments can be obtained. In the ninth embodiment, similar to the fourth embodiment, either one of the photo couplers 67A and 67B may be omitted. In this case, the sense elements (5s and 6s) and the sense resistor (7) corresponding to each of the omitted photo couplers 67A and 67B may be omitted. In this case, the current polarity detection unit 68 estimates the polarity of a current flowing through one semiconductor element (for example, the semiconductor element 1A) based on a polarity detection signal of a current flowing through the other semiconductor element (for example, the semiconductor element 1B).

Other Embodiments of First to Ninth Embodiments

The first to ninth embodiments have been described, and this disclosure can be modified in various forms or can be extended insofar as the modifications and the extension do not depart from the purport of this disclosure, which will be described hereinafter.

The configuration of each of the embodiments may be changed such that only the Vf control or only the pulse control of the Vf control performed by the Vf control unit 26 and the pulse control performed by the pulse control unit 27 is performed. When only the Vf control is performed in the third to seventh embodiments, naturally, the Vf control unit 26 prohibits the gate drive voltage from being applied to one semiconductor element of the semiconductor elements 1A and 1B during a time period for which the gate drive voltage is applied to the other semiconductor element.

The switch signal Sk and the threshold value voltage Vt (the setting of the current threshold value It) may be input as needed.

When the magnitude of the load current becomes less than the specified values Im1 and Im2, the Vf control unit 26 and the pulse control unit 27 stop the Vf control and the pulse control, respectively, and perform normal control. Switching control to the normal control may be executed as needed.

Also in the first and second embodiments, the current detection unit 25 may obtain a current detection signal based on a sense signal input from the hole sensor 59 instead of the sense voltages VSH and VSL.

Also in the second embodiment, when the magnitude of the load current is less than the specified values Im1 and Im2, the Vf control and the pulse control may be stopped, and the normal control may be performed. When the drive control system always operates in region 1 illustrated in FIG. 6, a control switching function for the controlling of switching between region 1 and region 2 may be omitted from the Vf control unit 26. That is, during a time period for which the PWM signal FL is at an H level, the Vf control unit 26 always applies the gate drive voltage VGL to the gate of the semiconductor element 1B. When it is determined that a current flows through the semiconductor element 1B in the forward direction of the diode device 6 during the time period, similar to the second embodiment, the Vf control unit 26 extends a pulse until the second time period T2 has elapsed (time t6).

Also in the eighth and ninth embodiments, a threshold value specifying signal (the switch signal Sk) for specifying the current threshold value It may be capable of being input from the outside, and the threshold value setting circuits 29A and 29B may be included. The threshold value setting circuits 30A, 30B, 31A, and 31B may be included, and when the magnitude of the load current is less than the specified values Im1 and Im2, the Vf control and the pulse control may be stopped, and the normal control may be performed.

Similar to the second embodiment, the third to ninth embodiments are capable of adopting the configuration in which MOS transistors are used as the semiconductor elements 1A and 1B. Each of the semiconductor elements 1A and 1B may be an element which has a control gate and is provided with a parasitic diode, and for example, may be a diode with a MOS gate. The RC-IGBT is not limited to a trench gate type RC-IGBT, and may be a planar gate type RC-IGBT or the like. The MOS transistor is not limited to a trench gate type MOS transistor, and may be a planar gate type MOS transistor, or the like. The MOS transistor may have a super junction (53) structure.

Figure 15:
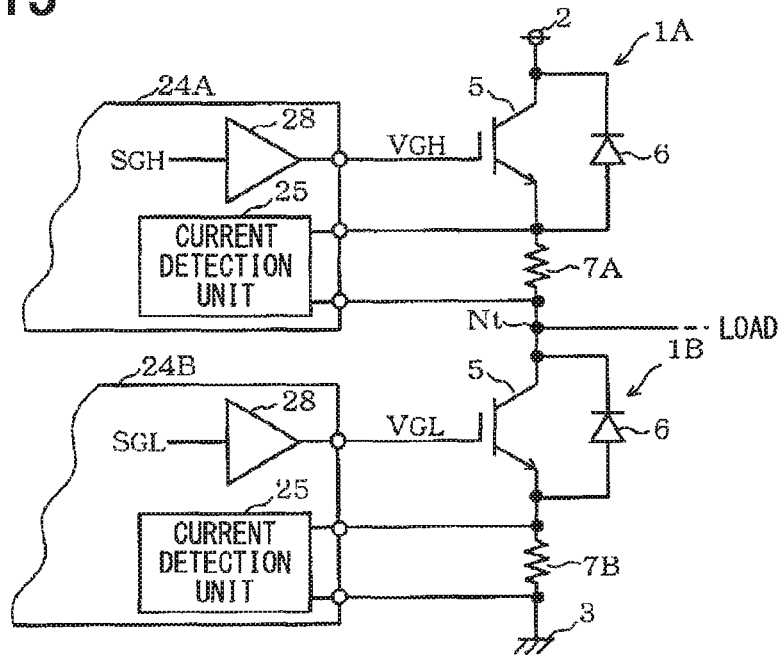
FIG. 15 is a diagram illustrating a modification example of a current detection configuration.
Figure 16:
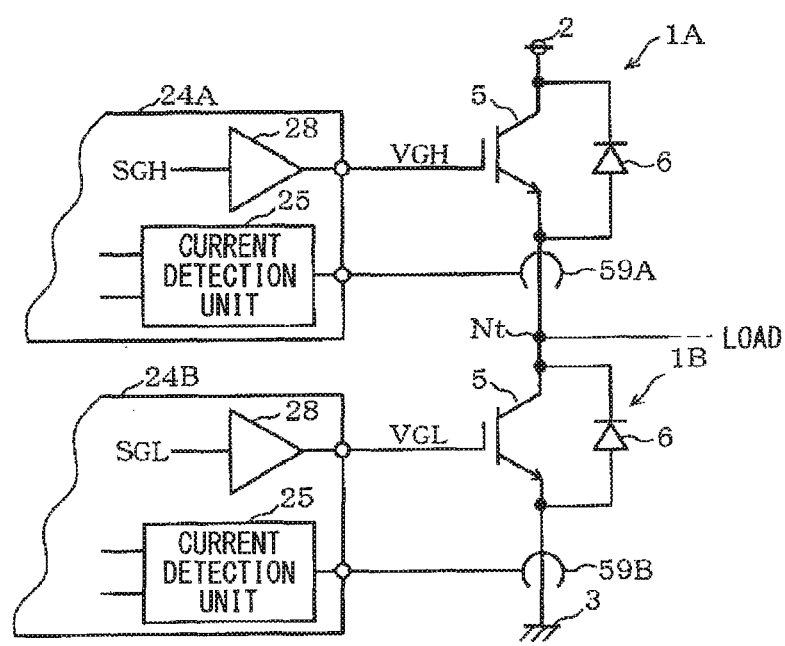
FIG. 16 is a diagram illustrating another modification example of the current detection configuration.

In the embodiments, as the current detection device, the semiconductor elements 1A and 1B are respectively provided with the sense elements, and include the sense resistors 7A and 7B, respectively. Alternatively, the hole sensor 59 is included as the current detection device. Instead, as illustrated in FIG. 15, the sense resistors 7A and 7B may be respectively provided in series to the semiconductor elements 1A and 1B from which the sense elements are removed. Since the sense resistors 7A and 7B are directly connected to the main elements, respectively, high responsiveness can be obtained. As illustrated in FIG. 16, hole sensors 59A and 59B may be respectively provided for the semiconductor elements 1A and 1B. In any configuration, a current can be detected with high precision. These modification examples can be applied to not only the first and second embodiments, but also the third to ninth embodiments. Also, an insulated current sensor such as a giant magneto resistance (GMR) sensor may be used instead of the hole sensor.

Also in the configuration of the first, third, fourth, ninth, and second embodiments in which the control switching function is omitted because the operation region of the drive control system is always region 1, and in the configuration illustrated in FIG. 15, the current detection unit 25 or the current detection circuit 60 may be replaced with the current polarity detection circuit 68, and similar to the seventh embodiment, the pulse control and the Vf control may be executed. In this case, similar to the seventh embodiment, the gate drive voltage can be prohibited from being applied to one semiconductor element of the semiconductor elements 1A and 1B during a time period for which the gate drive voltage is applied to the other semiconductor element. The current polarity detection circuit 68 is capable of estimating the polarity of a current flowing through one semiconductor element based on a polarity detection signal of a current flowing through the other semiconductor element.

The current polarity detection circuit 68 is capable of detecting the polarity of a current flowing through the semiconductor elements 1A and 1B based on the collector-to-emitter voltage (or the drain-to-source voltage) of the transistor device 5 or the gate drive voltages VGH and VGL instead of the sense voltages VSH and VSL which are respectively applied to the sense resistors 7A and 7B.

Tenth Embodiment

Figure 17:
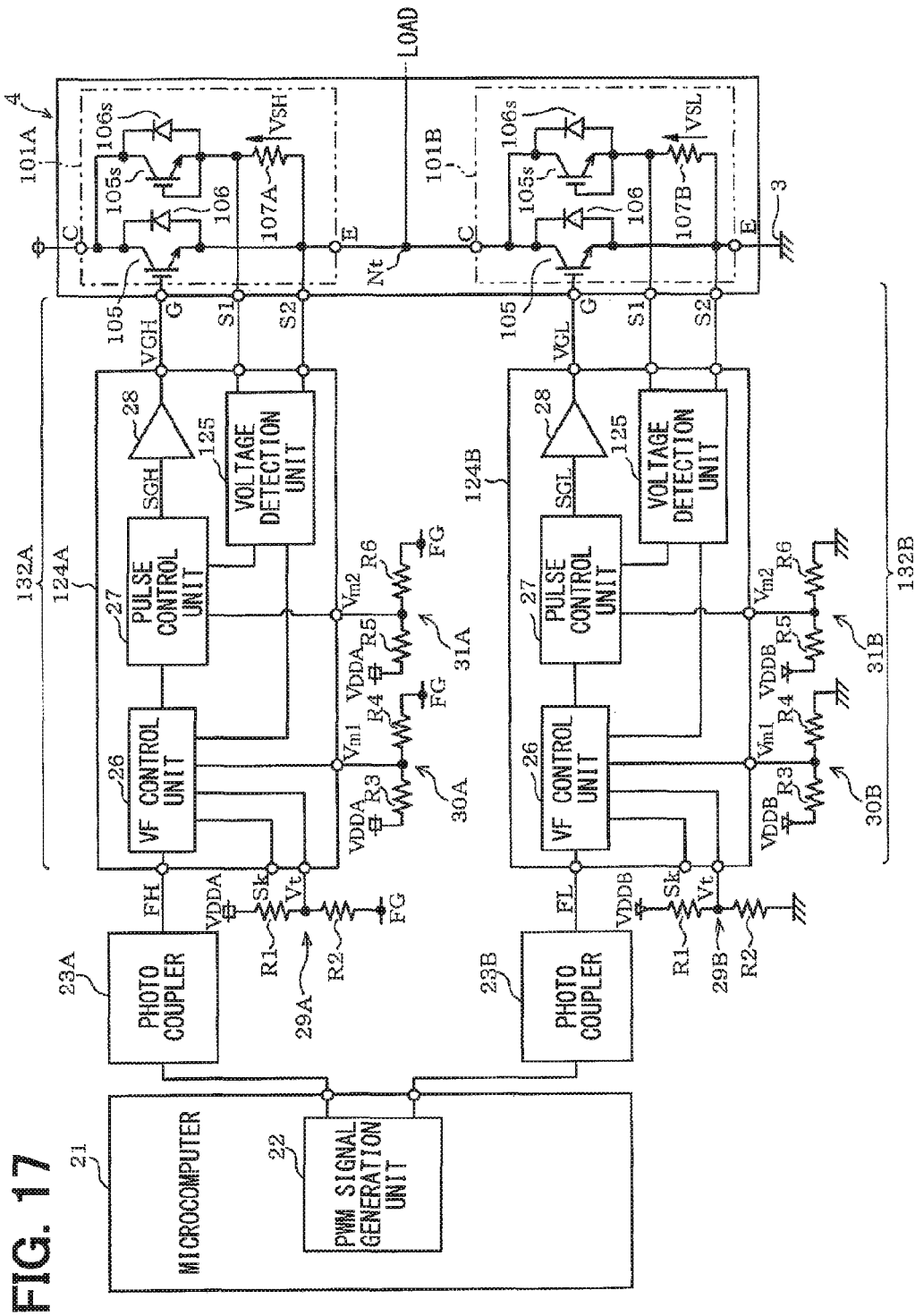
FIG. 17 is a diagram illustrating the configuration of a drive control system in a tenth embodiment.
Figure 18:
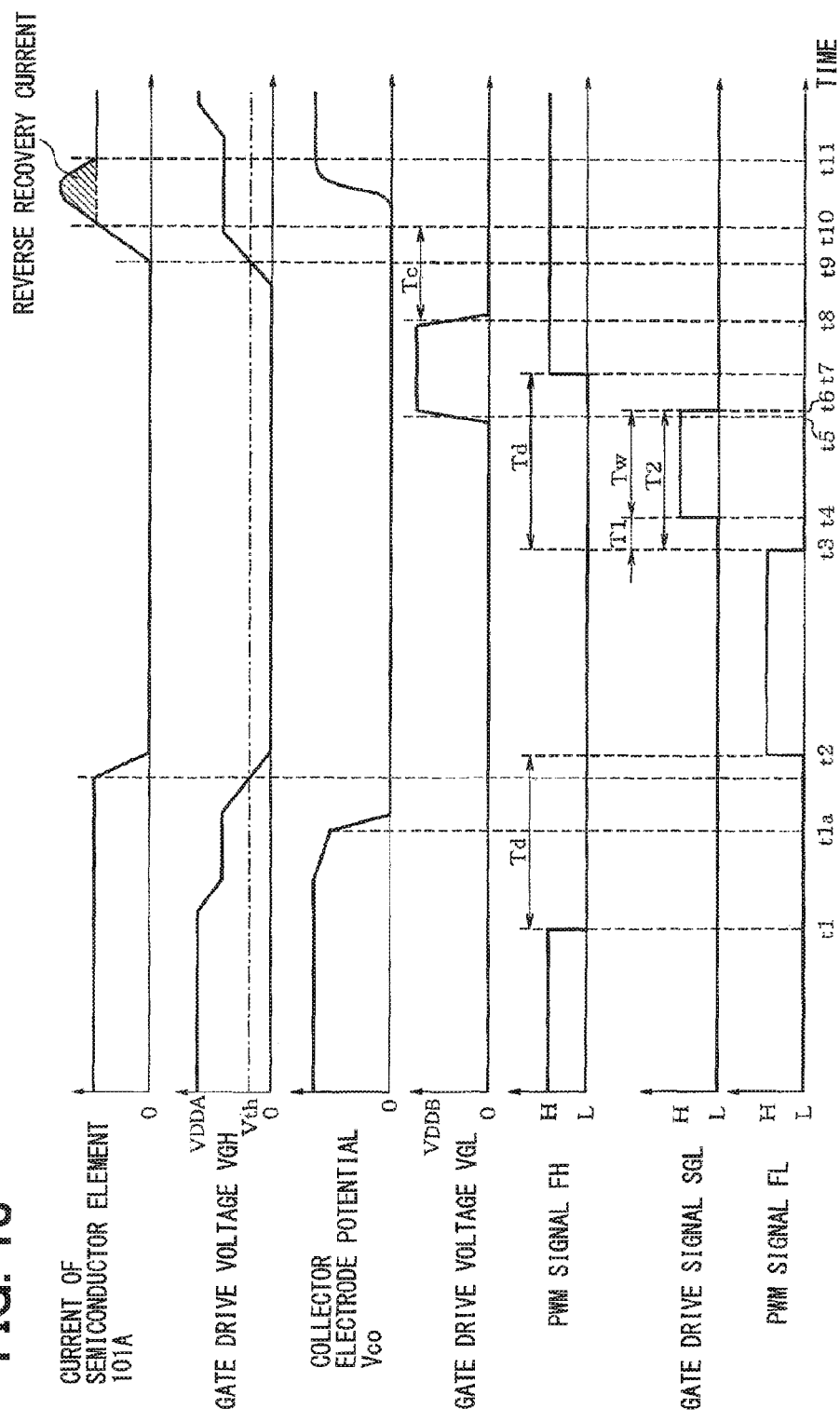
FIG. 18 illustrates waveform graphs in Vf control and pulse control in the tenth embodiment.

FIGS. 17 and 18 illustrate a tenth embodiment. FIG. 17 illustrates a configuration in which a semiconductor element 101A is used instead of the semiconductor element 1A, and a voltage detection unit 125 is used instead of the current detection unit 25, and FIG. 18 illustrates a configuration in which a semiconductor element 101B is used instead of the semiconductor element 1B, and the voltage detection unit 125 is used instead of the current detection unit 25. The same or similar reference signs are assigned to the same or similar configuration elements, and descriptions thereof will be omitted.

Each of the semiconductor elements 101A and 101B is a reverse-conducting IGBT (RC-IGBT) in which an insulated gate transistor device 105 and a diode device 106 are formed on the same semiconductor substrate 8. Each of the semiconductor elements 101A and 101B illustrates main elements (the transistor device 105 and the diode device 106) which respectively correspond to the transistor device 5 and the diode device 6 in the aforementioned embodiments. Conduction electrodes (a collector and an emitter) of the transistor device 105 and conduction electrodes (a cathode and an anode) of the diode device 106 are common electrodes.

In addition to the main elements, sense elements (a sense transistor 105s and a sense diode 106s) for detecting the collector potentials (equivalent to the electrode potentials) of the main elements are formed on the semiconductor substrate. Conduction electrodes (a collector and an emitter) of the sense transistor 105s and conduction electrodes (a cathode and an anode) of the sense diode 106s are common electrodes. The gate and the emitter of the insulated gate sense transistor 105s are connected to each other. Each of sense resistors 107A and 107B is connected between the emitter electrode of the sense transistor 105s and the emitter electrode of the transistor device 105. Each of the sense resistors 107A and 107B along with the voltage detection unit 125 forms voltage detection device.

The voltage detection unit 125 is provided in each of drive IC's 124A and 124B which replace the drive IC's 24A and 24B, respectively. Each of the drive IC's 124A and 124B is provided with the Vf control unit 26, the pulse control unit 27, and the drive circuit 28. The Vf control unit 26, the pulse control unit 27, and the drive circuit 28 are controlled by a technique similar to the aforementioned embodiments, and thus, the same reference signs are assigned in FIGS. 17 and 18. Since the drive IC's 124A and 124B have the same configuration, only the configuration of the voltage detection unit 125 which is a different portion in the drive IC 124B will be described.

The voltage detection unit 125 is the voltage detection device that outputs a voltage detection signal of the semiconductor element 101B based on the sense voltage VSL applied to the sense resistor 107B. By device of the sense elements (105s and 106s), the voltage detection unit 125 detects divided voltages which are the terminal-to-terminal voltage of the sense diode 106s, and a voltage applied to each of the sense resistors 107A and 107B. The Vf control unit 26 and the pulse control unit 27 generate a gate drive signal SGL based on the PWM signal FL. The drive circuit 28 receives the gate drive signal SGL, and outputs a gate drive voltage Va. The rest of the configuration is the same as in the aforementioned embodiments, and thus, a detailed description thereof will be omitted. The embodiment has substantially the same operation as in the first embodiment, and the pulse control which is different from that in the first embodiment will be described with reference to FIG. 18.

As illustrated in FIG. 18, the pulse control in this embodiment is the same as in the first embodiment in that the gate drive pulse is applied to the semiconductor element 101B until the reverse recovery current starts to flow after the PWM signal FL falls to an L level. However, the determination of conditions for applying the gate drive pulse is different from that in the first embodiment.

That is, as illustrated in FIG. 18, when the PWM signal FH falls from an H level to an L level, the collector-to-emitter voltage of the semiconductor element 101A increases, and at the same time, a collector electrode potential Vco (the collector electrode potential of a transistor device 105B) of the semiconductor element 101B decreases. By means of the sense elements (105s and 106s), the voltage detection unit 125 is capable of detecting the timing of a decrease in the electrode potential Vco. The collector-to-emitter voltage of the semiconductor element 101A increases gradually during a mirror time period, and thereafter, increases rapidly. For this reason, the collector electrode potential Vco decreases gradually during the mirror time period, and thereafter, decreases rapidly.

The voltage detection unit 125 detects a timing (time t1a) of a decrease in the collector electrode potential Vco during the mirror time period. The voltage detection unit 125 detects a decrease in the electrode potential Vco, and the Vf control unit 26 is capable of estimating the polarity according to a relationship between an on/off-command signal of the input PWM signal FL and the collector electrode potential Vco.

The Vf control unit 26 of the drive IC 124B determines whether or not an on-command signal of the PWM signal FL is input from when the collector electrode potential Vco is detected to decrease (t1a), and when the on-command signal is input, the Vf control unit 26 outputs the L-level gate drive signal SGL (time t2 to time t3). At this time, the gate drive voltage VGL corresponding to the gate drive signal SGL is applied to a gate of the semiconductor element 101B. Accordingly, the gate drive voltage VGL is shut off. During this time period, the determination of the polarity is continuously performed.

Figures 25A, 25B, 25C:
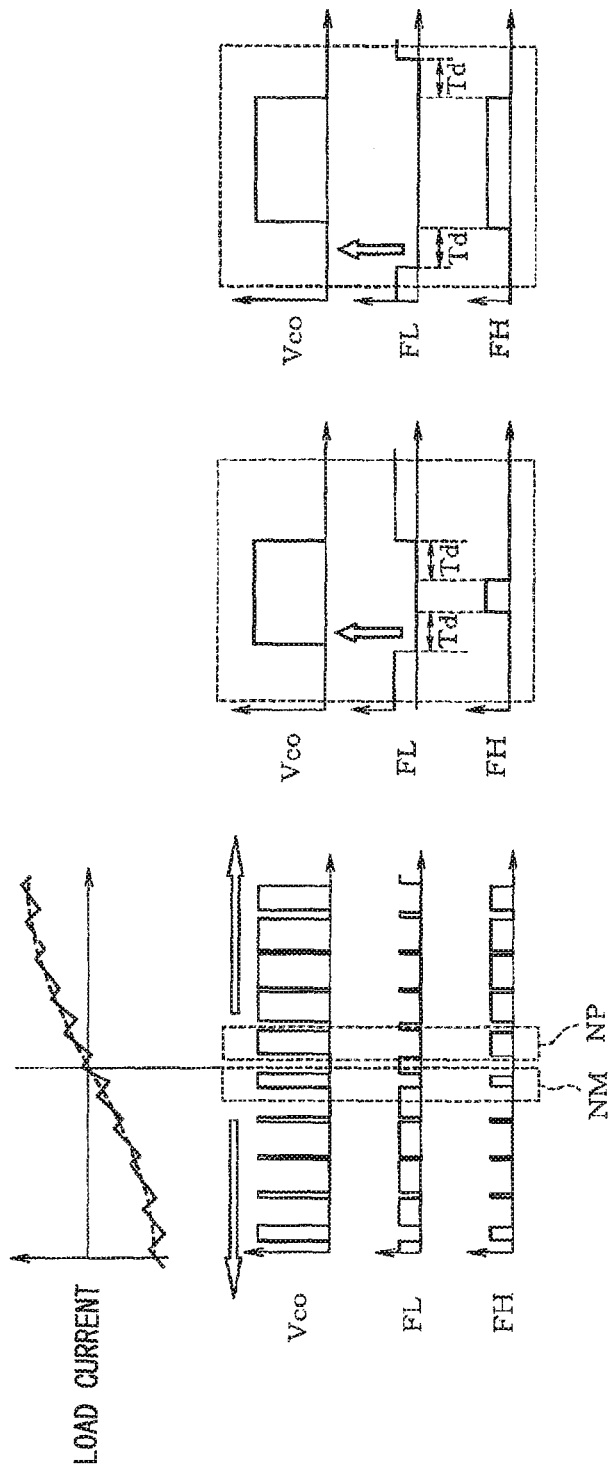
FIGS. 25A to 25C show graphs schematically illustrating a collector electrode potential change characteristic depending on the direction and the magnitude of a load current in each of the embodiments.
Figure 26:
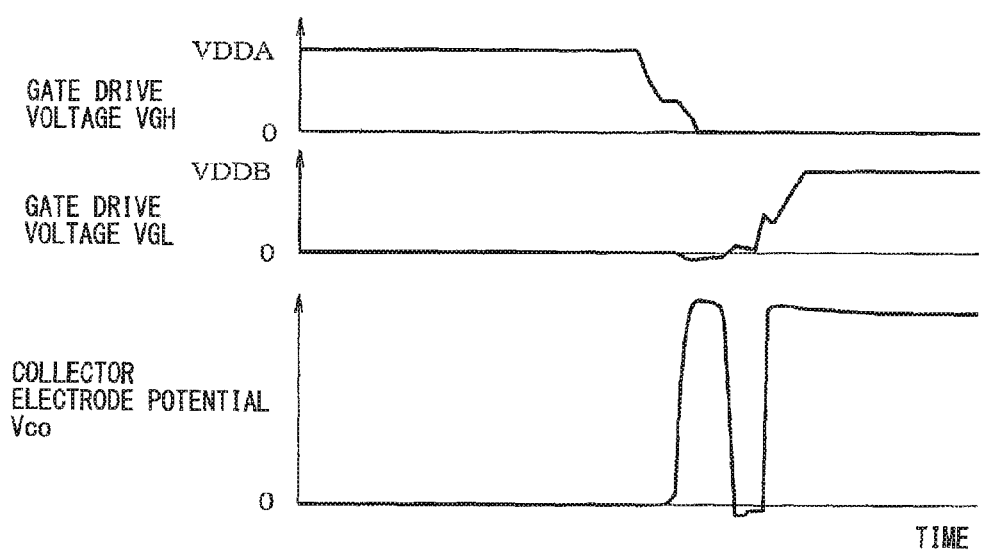
FIG. 26 shows graphs schematically illustrating the collector electrode potential change characteristic depending on the direction and the magnitude (around zero current) of the load current in each of the embodiments.

FIGS. 25 and 26 are reference graphs illustrating a collector electrode potential change characteristic depending on the direction and the magnitude of a load current. The load current is defined to be negative (on the left side in FIG. 25A) when the current flows from a load toward the node Nt illustrated in FIG. 17, and the load current is defined to be positive (on the right side in FIG. 25A) when the current flows from the node Nt in FIG. 17 toward the load.

When the load current is negative, the current flows into the node Nt. For this reason, as illustrated in FIG. 25B that is an enlarged view of portion NM in FIG. 25A, theoretically, the collector electrode potential Vco increases. When the load current is positive, the current flows out toward the load from the node Nt, and thus, as illustrated in FIG. 25C that is an enlarged view of portion NP in FIG. 25A, the collector electrode potential Vco decreases.

Accordingly, when the polarity of the load current is reversed under conditions where the load current is near zero, a voltage detected by the voltage detection unit 125 is determined according to the balance of the on-resistance of the semiconductor elements 101A and 101B. As illustrated in FIG. 26, when the polarity of the load current is reversed, the collector electrode potential Vco changes considerably, or chattering occurs. For this reason, as described above, it is determined whether or not the load current and the current of the diode device 106 are within a predetermined range near zero by determining whether or not the voltage detected by the voltage detection unit 125 changes considerably. When it is determined that this condition is satisfied, and the load current becomes near zero and hardly flows, the Vf control unit 26 continues to output the L-level gate drive signal SGL. Accordingly, it is possible to improve the reliability and the safety of control.

In contrast, when it is detected that the collector electrode potential Vco changes considerably during the Vf control unit 26 determines the polarity and continues to output the L-level gate drive signal SGL, the Vf control unit 26 outputs the gate drive signal SGL in accordance with a command signal of the PWM signal FL. In this case, it is possible to improve the responsiveness of control.

When the dead time Td between time t1 and time t2 decreases, or when a delay time period from when an off-command signal of the PWM signal FH occurs to when the gate drive voltage VGH falls increases, an on-command signal of the PWM signal FL may be input prior to when the collector electrode potential Vco decreases rapidly. In this case, the Vf control unit 26 may output the gate drive signal SGL using the aforementioned control technique on the condition that the voltage detection unit 125 detects that the collector electrode potential Vco decreases rapidly within a predetermined time period from when an on-command signal of the PWM signal FL is input.

In contrast, as illustrated in FIG. 18, when the PWM signal FH rises from an L level to an H level (time t7), thereafter, the collector-to-emitter voltage of the semiconductor element 101B increases, and the electrode potential Vco of the semiconductor element 101B (the collector potential of the transistor device 105B) increases. At this time, the voltage detection unit 125 is capable of detecting the timing of an increase in the electrode potential Vco, by divided voltages which are the voltage of the diode 6 and the voltage of the resistor 107A using the sense elements (105s and 106s).

When the polarity is determined by the Vf control unit 26, and it is determined that a current flows through the diode device 106 in the forward direction, the pulse control unit 27 sets the gate drive signal SGL to an H level from when the first time period T1 has elapsed (time t4) to when the second time period T2 has elapsed (time t6), starting from when the off-command signal of the PWM signal FL is input (time t3). The gate drive voltage VGL is applied to the gate of the semiconductor element 101B based on the gate drive signal SGL.

Also after the PWM signal FL falls to an L level, the pulse control unit 27 determines whether or not the voltage of the voltage detection unit 125 changes, and thus, continues to determine whether or not a current flows through the diode device 106 of the semiconductor element 101B. In contrast, if it is determined that a current does not flow through the diode device 6 when the PWM signal FL falls to an L level, the pulse control unit 27 immediately maintains the gate drive signal SGL at an L level. That is, the gate drive pulse is not applied.

The first time period T1 and the second time period T2 illustrated in FIG. 18 are set in advance in order for an arm short circuit not to occur. During the time period for which the PWM signal FL is at an L level, when a current flows through the diode device 106, the waveform of the gate drive voltage VGL at the application of the gate drive pulse is different from that when a current flows through the transistor device 105.

When a current flows through the diode device 106, the collector-to-emitter voltage of the semiconductor element 101B does not change. A rapid change in the current and the voltage of the semiconductor element 101B does not occur. For this reason, when the gate drive voltage VGL rises and falls, the drive circuit 28 is capable of outputting the gate drive voltage VGL at a gate drive capability higher than in a normal state.

While the waveform of the gate drive voltage VGL and the drive pattern of the drive circuit 28 are taken into consideration when the gate drive pulse is applied, the first time period T1 and the second time period T2 are set in order for the gate drive voltage VGL to simply increase or decrease according to the gate drive capability of the drive circuit 28. A time period Tc (a carrier re-injection time period) from when the application of the gate drive pulse ends to when the reverse recovery current starts to flow is set to be greater than zero, and is less than or equal to an injection allowance time period. The injection allowance time period is specified according to the allowed magnitude of the reverse recovery current.

Specifically, the first time period T1 and the second time period T2 are set by pre-measuring a timing at which the gate drive signal SGL is applied, a timing at which the gate drive voltage VGL is actually applied, and a timing at which the reverse recovery current starts to flow, starting from when the PWM signal FL falls, while diversely changing a current flowing through the diode device 106. In this embodiment, the first time period T1 and the second time period T2 are stored in the memory or the like of the pulse control unit 27. The first time period T1 and the second time period T2 can be configured using one or several patterns of logic circuits, an analog delay circuit, or the like.

When applying the gate drive pulse, the pulse control unit 27 reads the first time period T1 and the second time period T2 from the memory. The pulse control unit 27 causes the gate drive signal SGL to rise when the first time period T1 has elapsed, and the gate drive signal SGL to fall when the second time period T2 has elapsed, starting from when a decrease in the collector electrode potential Vco is detected.

As described above, also in the configuration of the tenth embodiment, substantially the same effects may be obtained even if a current is less than or equal to the current threshold, which is uncontrollable as in the first embodiment.

Eleventh Embodiment

Figure 19:
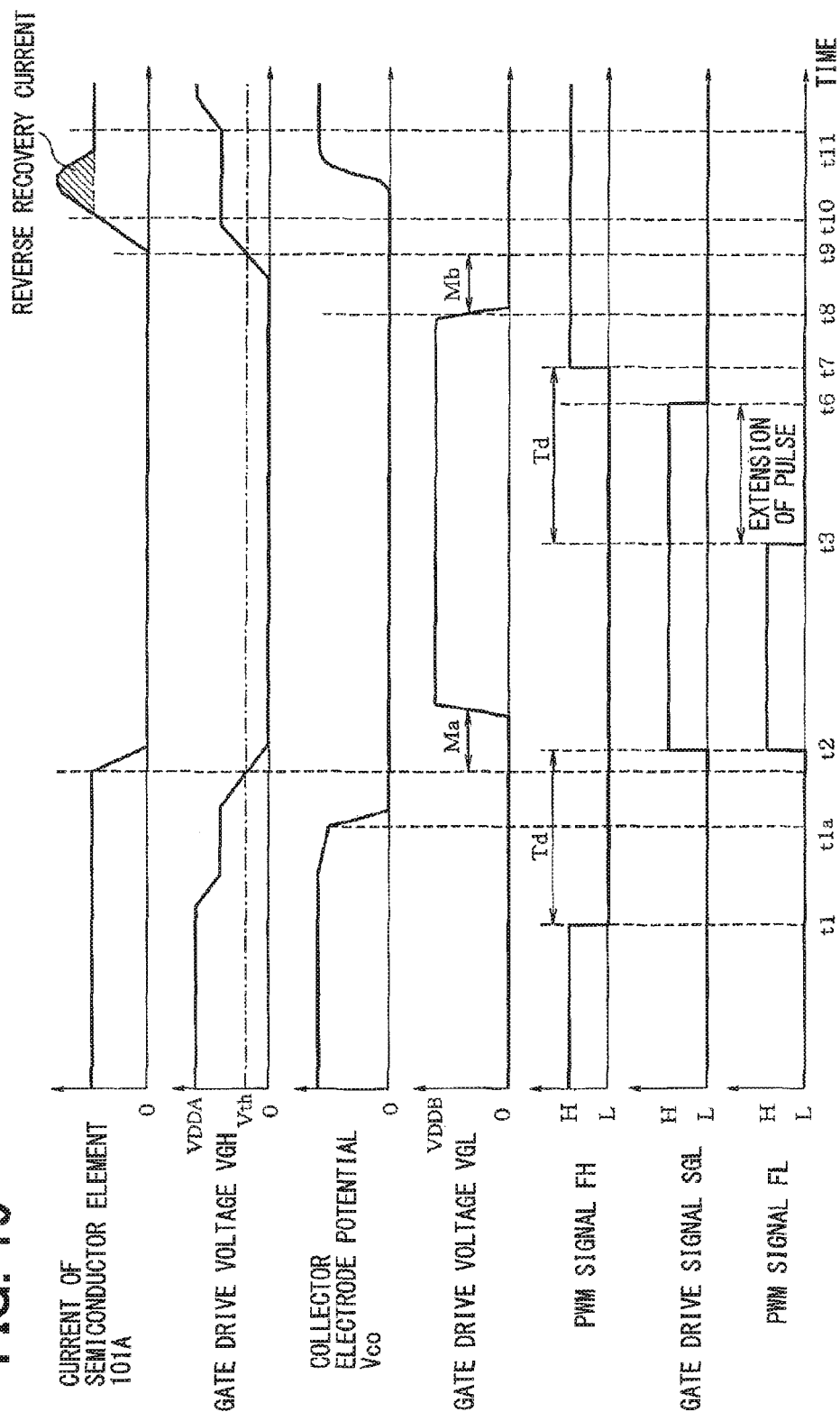
FIG. 19 illustrates waveform graphs in Vf control and pulse control when synchronous rectification is used in an eleventh embodiment.

FIG. 19 illustrates an eleventh embodiment, and illustrates a timing chart when a conduction loss can be reduced by performing synchronous rectification using MOS transistors as the semiconductor elements 101A and 101B. Each of drive control devices 132A and 132B has a configuration illustrated in FIG. 17. The operation of the low-side drive control device 132B will be mainly described. The high-side drive control device 132A also operates in the same manner. When the MOS transistors are used, according to the characteristic illustrated in FIG. 6, a conduction loss can be reduced by applying the gate drive voltage in region 1 in which the voltage VDS is lower than the voltage Vf. In region 2 in which the voltage VDS is higher than or equal to the voltage Vf, a conduction loss can be reduced by shutting off the gate drive voltage. Descriptions of the same operations as the aforementioned embodiments will be omitted. The voltage detection unit 125 detects a timing (time t1a) of a decrease in the collector electrode potential Vco during the mirror time period. The voltage detection unit 125 detects a decrease in the electrode potential Vco, and the Vf control unit 26 is capable of estimating the polarity according to a relationship between an on/off-command signal of the input PWM signal FL and the collector electrode potential Vco.

The Vf control unit 26 of the drive IC 124B determines whether or not an on-command signal of the PWM signal FL is input from when the collector electrode potential Vco is detected to decrease (t1a), and when the on-command signal is input, the Vf control unit 26 outputs the H-level gate drive signal SGL (time t2 to time t3). At this time, the gate drive voltage VGL corresponding to the gate drive signal SGL is applied to a gate of the semiconductor element 101B.

During a time period for which the PWM signal FL is at an H level, when a current in the range of region 1 flows through the semiconductor element 101B, the Vf control unit 26 executes the normal control (synchronous rectification) by which the gate drive voltage VGL is applied. Thereafter, when the PWM signal FL is set to an L level, the Vf control unit 26 applies the gate drive pulse to the semiconductor element 101B.

In this case, the pulse control unit 27 may set the gate drive signal SGL to an H level from when the first time period T1 has elapsed to when the second time period T2 has elapsed, starting from when the off-command signal is input. However, when the gate drive voltage VGL is continuously applied rather than being shut off until the second time period T2 has elapsed, a conduction loss can be reduced. In order to perform the pulse control in succession after the Vf control, it is preferable that the Vf control unit 26 extends and outputs the H-level gate drive signal SGL until time t3 is exceeded and the second time period T2 has elapsed (time t6) (extension of pulse).

During the time period for which the PWM signal FL is at an H level, when a current in the range of region 2 illustrated in FIG. 6 flows through the semiconductor element 101B, the Vf control unit 26 and the pulse control unit 27 output the same gate drive signal SGL as when controlling the RC-IGBT illustrated in FIG. 5.

As described in the tenth embodiment, also during a time period for which the PWM signal FL is at an L level, in order for the Vf control unit 26 to continue to perform the normal Vf control after the voltage detection unit 125 detects the falling of the collector electrode potential Vco (time t1a) using the sense elements (105s and 106s), control device (the Vf control unit 26 or the pulse control unit 27) may perform the pulse control such that the on-command signal is output retroactively from an input time (t2) (refer to the extension of pulse in a section of time t1b to time t2).

In order to prevent the occurrence of an arm short circuit, the gate drive voltage VGL can be increased a time period from when the gate drive voltage VGH is less than a threshold voltage Vth (that is, when the flow of current is stopped) to when the gate drive voltage VGH reaches the threshold voltage Vth again (that is, when a current starts to flow).

The Vf control unit 26 and the pulse control unit 27 generate a delay time period for performing various processes such as a signal generation process from when the gate drive signal SGL is applied to when the gate drive voltage VGL rises. The delay time period is pre-measured using an experiment, a simulation, or the like, and the Vf control unit 26 and the pulse control unit 27 may extend the pulse of the gate drive signal SGL in order for an arm short circuit not to occur while the gate drive voltage VGL rises.

At this time, a margin time period (a margin time period Ma in FIG. 19) may be provided between when the gate drive voltage VGH is less than the threshold voltage Vth (that is, when the flow of current is stopped) and when the gate drive voltage VGL is greater than or equal to the threshold voltage Vth. A margin time period (a margin time period Mb in FIG. 19) may be provided between when the gate drive voltage VGL is less than the threshold voltage Vth and when the gate drive voltage VGH is greater than or equal to the threshold voltage Vth (that is, when a current starts to flow).

That is, there is the occurrence of variations (delay variations due to variations in the voltage detection unit 125, configuration variations in the semiconductor element 101A and the like, a temperature characteristic change, deterioration over time, and the like) in a delay from when the voltage detection unit 125 detects a voltage to when control is actually performed. The pulse may be extended in anticipation of the delay time period which takes into consideration the delay variations as a margin.

The voltage detection unit 125 detects a timing (time t1a) of a decrease in the collector electrode potential Vco during the mirror time period. The voltage detection unit 125 detects a decrease in the electrode potential Vco, and the Vf control unit 26 is capable of estimating the polarity according to a relationship between an on/off-command signal of the input PWM signal FL and the collector electrode potential Vco. A method of estimating the polarity is the same as that in the tenth embodiment.

Experimentally or using simulation, it is determined whether or not a current in the range of region 1 or region 2 flows, and when it is determined that region 1 is dominant (control time period is greater than or equal to a predetermined ratio), the Vf control unit 26 executes the normal control (synchronous rectification) by which the gate drive voltage VGL is applied. Thereafter, when the PWM signal FL is set to an L level, the gate drive pulse is required to be applied to the semiconductor element 101B.

In this case, after the Vf control unit 26 sets the gate drive signal SGL to an L level, the pulse control unit 27 may set the gate drive signal SGL to an H level from when the first time period T1 has elapsed to when the second time period T2 has elapsed, starting from when the PWM signal FL falls. However, when the gate drive voltage VGL is continuously applied rather than being shut off until the second lime period T2 has elapsed, a conduction loss can be reduced. In order to perform the pulse control in succession after the Vf control, the Vf control unit 26 extends and outputs the H-level gate drive signal SGL until time t3 is exceeded and the second time period T2 has elapsed (time t6) (extension of pulse).

A detection process during a time period from time t1a to time t2 is performed by the same method as in the tenth embodiment, and after time t2, the Vf control unit 26 sets the gate drive signal SGL to an H level, and thus, even if the polarity of a load current is reversed under conditions where the load current is near zero, chattering illustrated in the tenth embodiment does not occur. Accordingly, the Vf control unit 26 may continue to output the H-level gate drive signal SGL up to time t6 after time t2.

Also in this embodiment, the same effects as in the second or tenth embodiment can be obtained.

Twelfth and Thirteenth Embodiments

Figure 20:
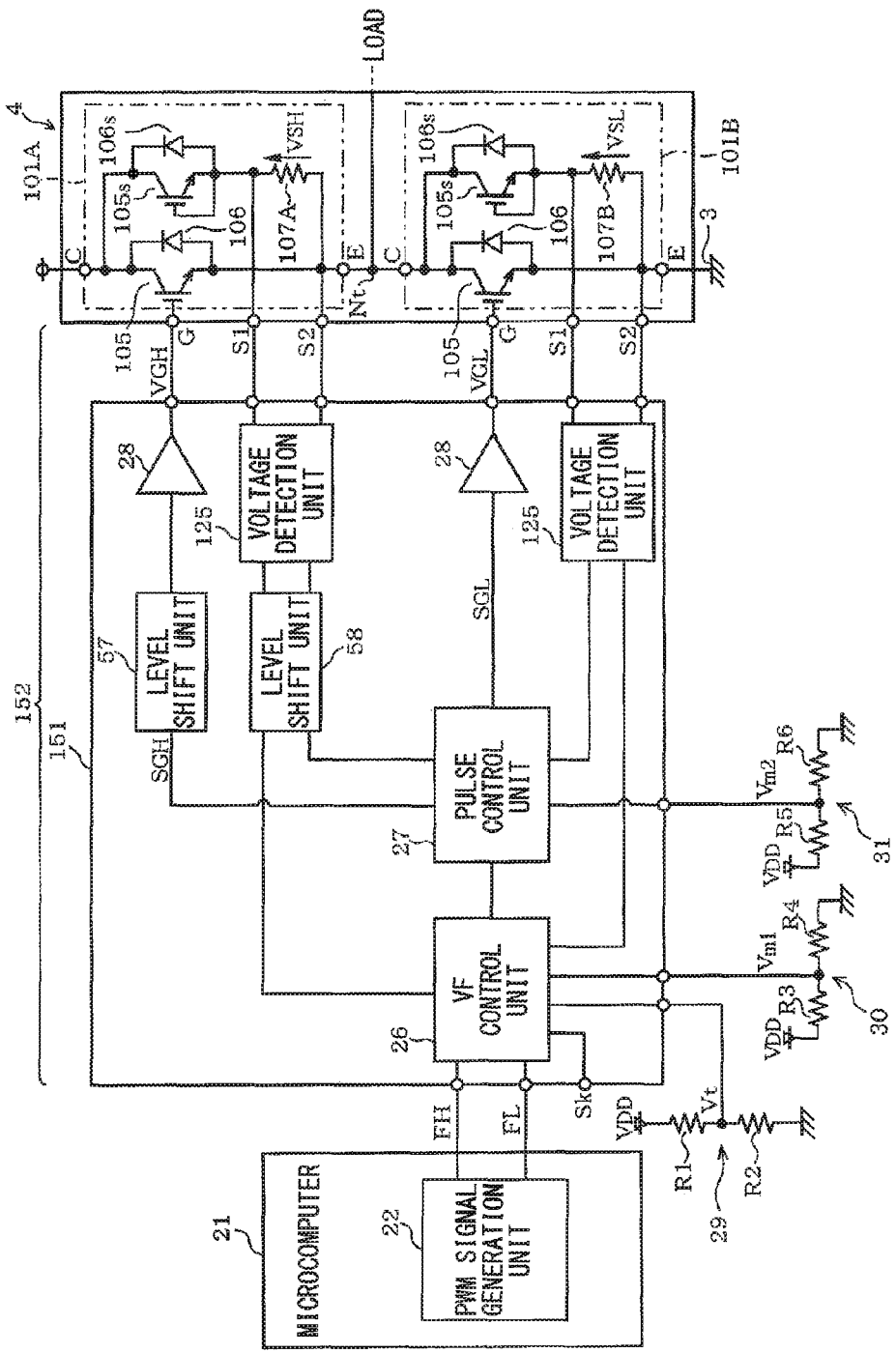
FIG. 20 is a diagram illustrating the configuration of a drive control system in a twelfth embodiment.
Figure 21:
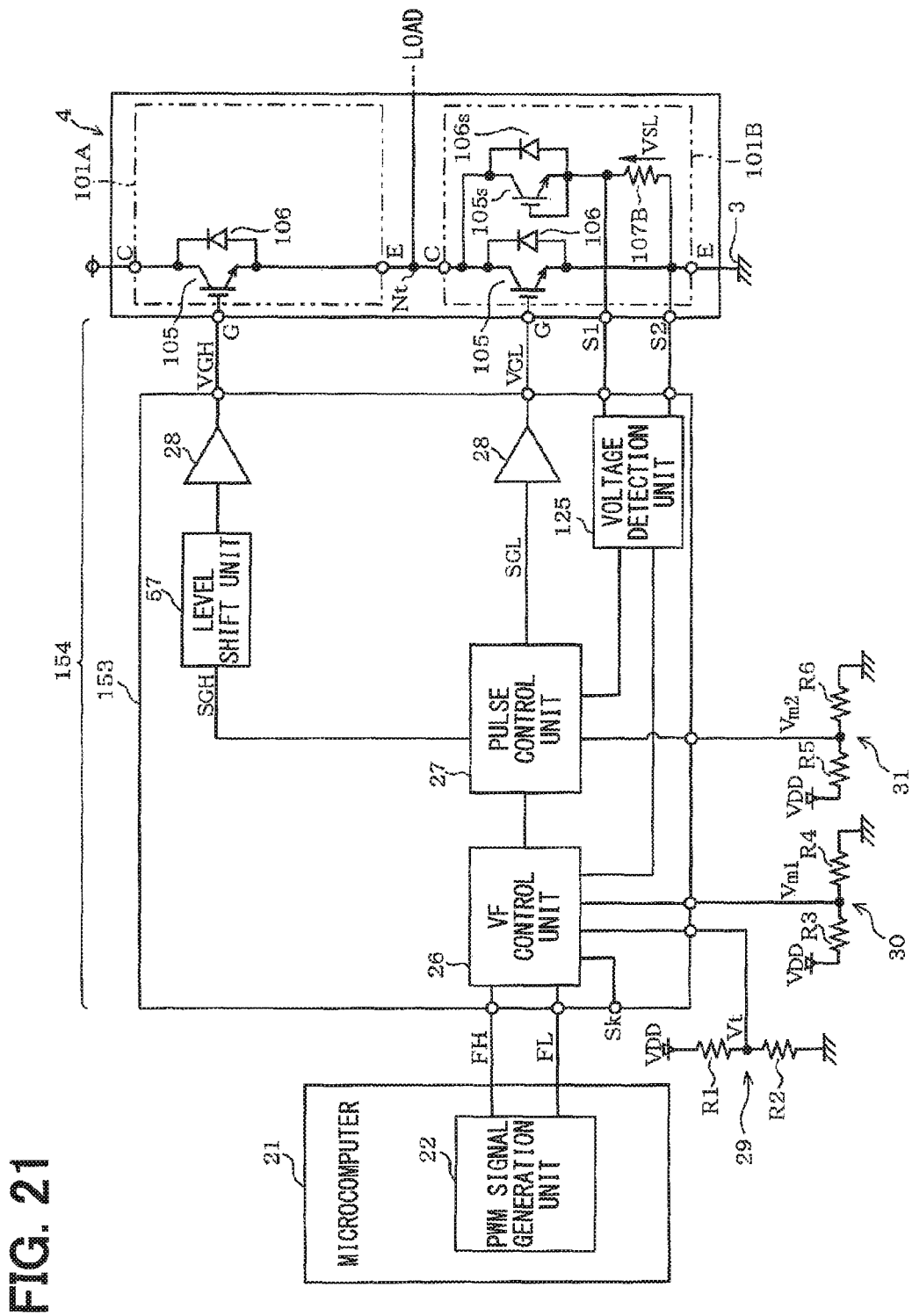
FIG. 21 is a diagram illustrating the configuration of a drive control system in a thirteenth embodiment.

FIGS. 20 and 21 respectively illustrate twelfth and thirteenth embodiments, FIG. 20 illustrates a drive control device 152 using a drive IC 151 with a high breakdown voltage, and FIG. 21 illustrates a drive control device 154 using a drive IC 153 with a high breakdown voltage. The high breakdown voltage represents a breakdown voltage corresponding to a power source voltage applied to the half-bridge circuit 4. Each of the drive control devices 152 and 154 controls the driving of two semiconductor elements 101A and 101B of the half-bridge circuit 4.

Each of the drive IC's 151 and 153 includes the Vf control unit 26 and the pulse control unit 27 which are common to the semiconductor elements 101A and 101B. A power source voltage VDD (for example, 15 V) is applied to the drive IC's 151 and 153 such that the drive IC's 151 and 153 operate. The gate drive signal SGH is applied to the semiconductor element 101A via a level shift unit 57 and the drive circuit 28, and the gate drive signal SGL is applied to the semiconductor element 101B via the drive circuit 28.

The drive IC 151 includes the voltage detection units 125 which respectively output voltage detection signals based on the sense voltage VSH applied to the sense resistor 107A and the sense voltage VSL applied to the sense resistor 107B. The high-side voltage detection unit 125 outputs a voltage detection signal via the level shift circuit 58. The drive IC 153 has a configuration in which the high-side voltage detection unit 125 and the level shift circuit 58 are omitted.

The pulse control unit 27 generates the gate drive signals SGH and SGL, and is capable of prohibiting the gate drive voltage from being applied to one semiconductor element of the two semiconductor elements 101A and 101B during a time period for which the gate drive voltage is applied to the other semiconductor element. Accordingly, an arm short circuit can be reliably prevented from occurring.

As illustrated in FIG. 21 that illustrates the thirteenth embodiment, the voltage detection unit 125 can be common to the high side and the low side, and thus, a circuit configuration can be simplified. In this case, the sense elements (105*s* and 106*s*) and the sense resistor (107) corresponding to the voltage detection unit 125 omitted due to the commoditizing may be omitted. When the voltage detection unit 125 is common to the high side and the low side, a high-side specified voltage is preferably set to be greater than that in the tenth embodiment based on the specified voltages Vm1 and Vm2 which are respectively generated by the threshold value setting circuits 30 and 31. The same operations and effects as in the tenth and eleventh embodiments can be obtained.

Fourteenth Embodiment

Figure 22:
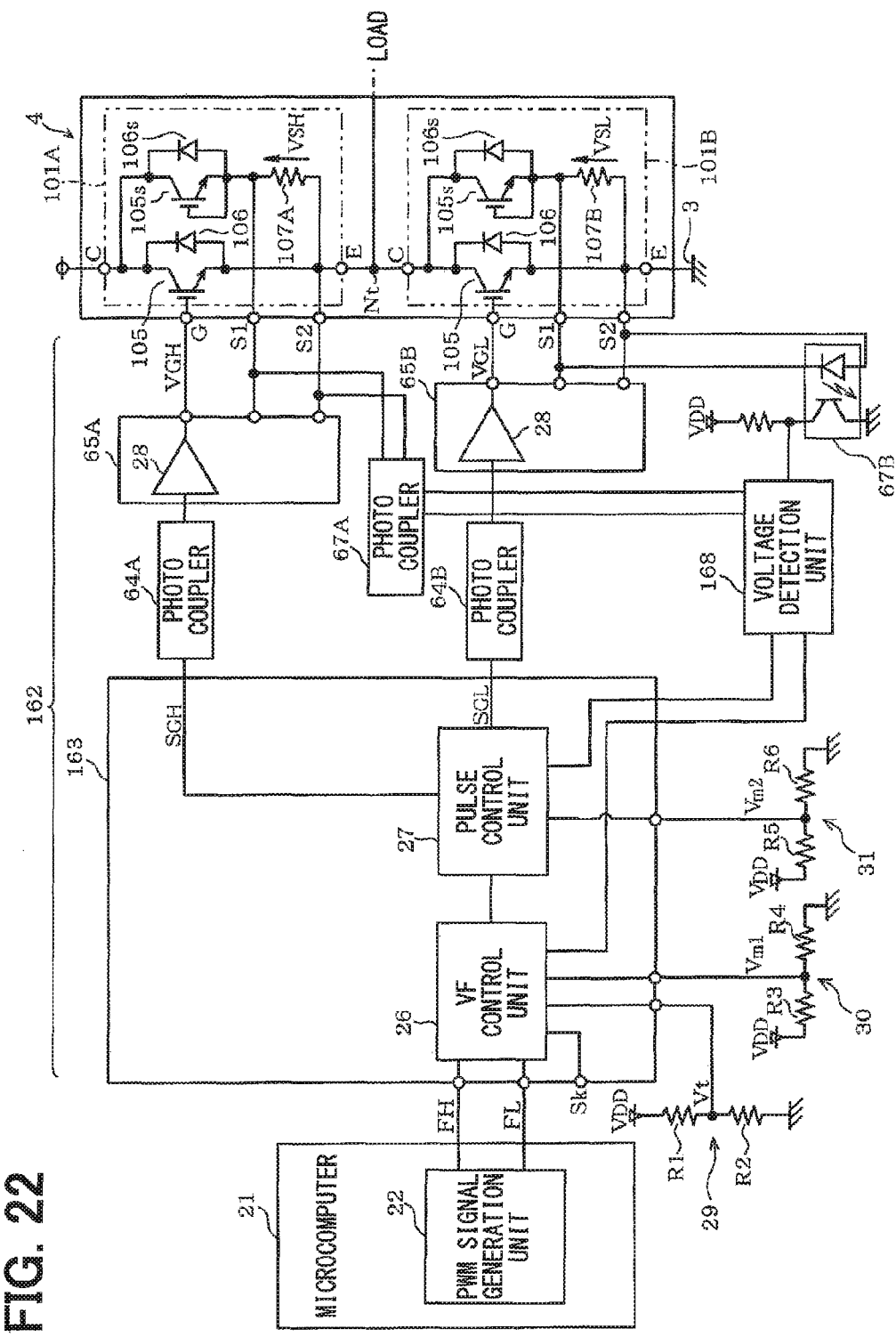
FIG. 22 is a diagram illustrating the configuration of a drive control system in a fourteenth embodiment.

FIG. 22 illustrates a fourteenth embodiment, and a drive control device 162 which is configured such that the control unit is provided separately from the drive circuit. The drive control device 162 controls the driving of the two semiconductor elements 101A and 101B of the half-bridge circuit 4. The drive control device 162 is configured to include a control IC 163; the photo couplers 64A, 64B, 67A, and 67B; the drive IC's 65A and 65B; a voltage detection unit 168; and the like.

The control IC 163 is made up of a dedicated ASIC, a hard intellectual property (IP) of a microcomputer, an FPGA, or the like, and the Vf control unit 26 and the pulse control unit 27 are mounted on the control IC 163. The photo couplers 64A and 64B are insulated circuits through which the gate drive signals SGH and SGL are respectively transmitted to the drive IC's 65A and 65B while being electrically insulated. Each of the drive IC's 65A and 65B includes the drive circuit 28, and the drive IC's 65A and 65B receive the gate drive signals SGH and SGL, and output the gate drive voltages VGH and VGL, respectively.

The voltage detection unit 168 detects the sense voltages VSH and VSL via the respective photo couplers 67A and 67B. The voltage detection unit 168 is capable of detecting the value or the direction (polarity) of a current flowing through the semiconductor element 101A using divided voltages which are a voltage applied to the sense elements 105*s* and 106*s* and a voltage applied to the resistor 107A, and the value or the direction (polarity) of a current flowing through the semiconductor element 101B using divided voltages which are a voltage applied to the sense elements 105*s* and 106*s* and a voltage applied to the resistor 107B. Accordingly, the pulse control, and the Vf control of an RC-IGBT can be executed.

Also in this embodiment, the pulse control unit 27 is capable of prohibiting the gate drive voltage from being applied to one semiconductor element of the two semiconductor elements 101A and 101B during a time period for which the gate drive voltage is applied to the other semiconductor element. Accordingly, an arm short circuit can be reliably prevented from occurring. Either one of the photo couplers 67A and 67B may be omitted. In this case, the sense elements (105*s* and 106*s*) and the sense resistor (107) corresponding to each of the omitted photo couplers 67A and 67B may be omitted. In this case, the current detection unit 168 estimates the polarity of a current flowing through one semiconductor element 101A based on a polarity detection signal of a current flowing through the other semiconductor element 101B. A photo coupler with the same configuration as the photo couplers 67A and 67B may not be provided in a front stage of the voltage detection unit 168, but in a rear stage of the voltage detection unit 168. The voltage detection unit 168 may be formed inside the control IC 63 or the drive IC 65.

Since the PWM signals FH and FL are input to the Vf control unit 26 of the control IC 163, the Vf control unit 26 and the pulse control unit 27 are capable of integrally controlling the one arm and the other arm. Also in the embodiment, the same operations and effects as in the tenth and eleventh embodiments can be obtained.

Fifteenth Embodiment

Figure 23:
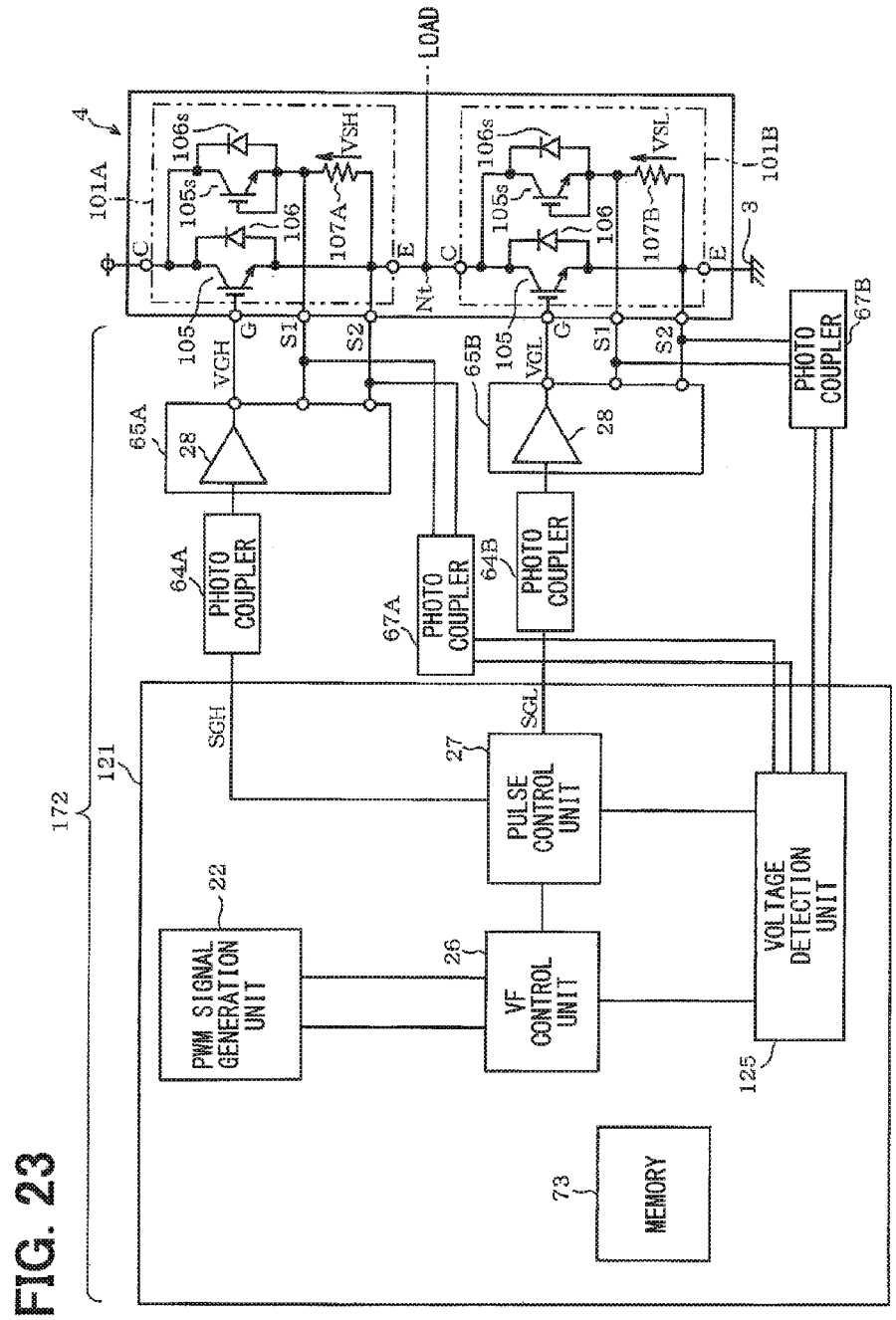
FIG. 23 is a diagram illustrating the configuration of a drive control system in a fifteenth embodiment.

FIG. 23 illustrates a fifteenth embodiment, and illustrates a drive control device 172 which is configured such that the control unit is provided separately from the drive circuit, and the Vf control unit 26, the pulse control unit 27, and the voltage detection unit 125 are built into a microcomputer 121. Each of the drive control device 172 controls the driving of the two semiconductor elements 101A and 101B of the half-bridge circuit 4. The drive control device 172 is configured to include the microcomputer 121; the photo couplers 64A and 64B; the drive IC's 65A and 65B; and the like. The drive control device 172 includes the photo couplers 67A and 67B which input the sense voltages VSH and VSL, respectively.

The microcomputer 121 realizes the functions of the Vf control unit 26, the pulse control unit 27, and the voltage detection unit 125 by executing the control program that is stored in the memory 73 in advance. The microcomputer 121 of the drive control device 172 obtains a voltage detection signal based on output signals from the photo couplers 67A and 67B. The memory 73 stores the first time period T1, the second time period T2, a threshold value, and the like in addition to the control program.

Also in this embodiment, the microcomputer 121 is capable of prohibiting the gate drive voltage from being applied to one semiconductor element of the two semiconductor elements 101A and 101B during a time period for which the gate drive voltage is applied to the other semiconductor element. Accordingly, an arm short circuit can be reliably prevented from occurring. Either one of the photo couplers 67A and 67B may be omitted. In this case, the sense elements (105s and 106s) and the sense resistor (107) corresponding to each of the omitted photo couplers 67A and 67B may be omitted. When the voltage detection unit 125 is common to the high side and the low side, a high-side specified voltage is preferably set to be greater than that in the tenth embodiment based on the specified voltages Vm1 and Vm2 which are respectively generated by the threshold value setting circuits 30 and 31. The same operations and effects as in the tenth and eleventh embodiments can be obtained.

Since the PWM signals FH and FL are input to the Vf control unit 26 of the control IC 163, the Vf control unit 26 and the pulse control unit 27 are capable of integrally controlling the one arm and the other arm. Similar to the fourteenth embodiment, the photo coupler 67A may be omitted. Also in these embodiments, the same operations and effects as in the tenth and eleventh embodiments can be obtained.

Sixteenth Embodiment

Figure 24:
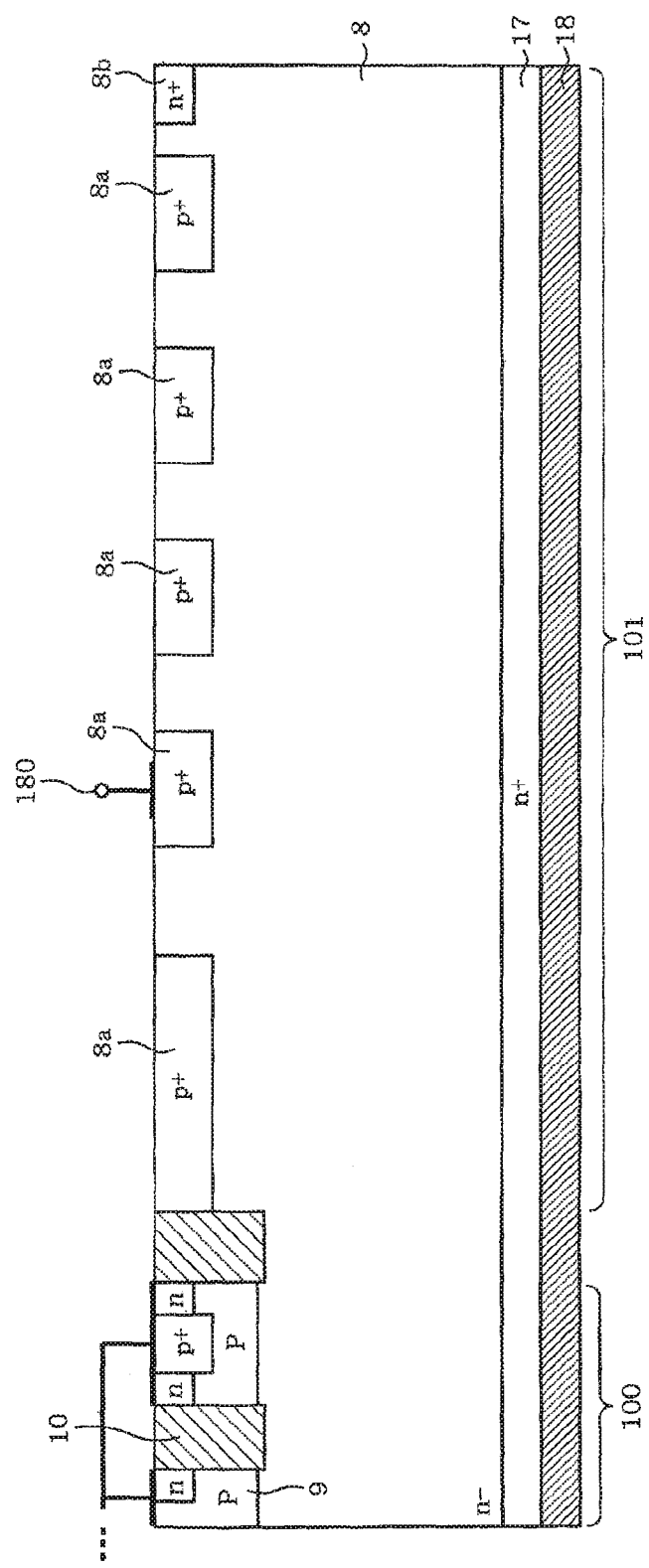
FIG. 24 is a schematic cross-sectional view of a semiconductor structure illustrating a state in which a midpoint potential is detected in a sixteenth embodiment.

FIG. 24 illustrates a sixteenth embodiment, and illustrates a configuration in which a voltage detection unit 180 is provided as voltage detection device that detects a midpoint voltage potential. The voltage detection unit 180 illustrated in FIG. 24 is provided to detect the potential of a guard ring 8a that is provided on an outer circumferential side of an element formation region 100 of the transistor device 105 and the diode structure 106 of the semiconductor substrate 8. The cathode region 17 of the diode structure 6 and the collector electrode 18 of a transistor structure 5 are formed in the lower surface layer portion of the semiconductor substrate 8, and are formed not only in the element formation region 100, but also communicate with the outer circumferential side, and extend over a breakdown voltage holding region 101.

The guard ring 8a is formed in the breakdown voltage holding region 101. Multiple guard rings 8a are formed. The conduction type (in this case, p+ (reverse conduction type)) of the guard ring 8a is different from that of the semiconductor layer 8, and the guard rings 8a are concentrically formed in a plan view to surround an outer circumference of the element formation region 100

An n+ equivalent potential ring (EQR) 8b, the conduction of which is typically the same as that of the semiconductor substrate 8, is formed as a channel stopper region in an outermost circumferential region which is positioned on the outside of the guard rings 8a of the semiconductor substrate 8, and the n+ equivalent potential ring is provided to fix a drain potential. The guard rings 8a are formed on an outer circumferential edge side of the semiconductor substrate 8 while being separated from each other, and are provided to relax an electric field occurring between the outermost equivalent potential ring 8b and the source electrode provided on the element formation region 100 side.

The potentials of the guard rings 8a decrease sequentially from an outer circumferential side in a step-like manner, and the breakdown voltage can be held. The voltage detection unit 180 is capable of detecting a midpoint potential between the collector and the emitter by detecting a voltage from an upper portion of one layer of the guard ring 8a among layers of the guard ring 8a. A change in the midpoint potential is the same as the change in the collector electrode potential Vco in the aforementioned embodiments, and also when the voltage detection unit 180 detects the midpoint potential, control can be performed in the same manner.

The voltage detection unit 180 in the embodiment can be used instead of the voltage detection unit 125 in the tenth to fifteenth embodiments, or may be used along with the voltage detection unit 125. The voltage detection unit 180 may be used in combination of the current detection device (7A, 7B, 25, 59, 60, and 68) in the first to ninth embodiments.

As needed, the midpoint potential detected by the voltage detection unit 180 may be further bucked by resistive voltage division, and be used.

Other Embodiments of First to Sixteenth Embodiments

The first to sixteenth embodiments have been described, and this disclosure can be modified in various forms or can be extended insofar as the modifications and the extension do not depart from the purport of this disclosure, which will be described hereinafter.

The configuration of each of the embodiments may be changed such that only the Vf control or only the pulse control of the Vf control performed by the Vf control unit 26 and the pulse control performed by the pulse control unit 27 is performed. When only the Vf control is performed in the third to seventh embodiments, naturally, the Vf control unit 26 prohibits the gate drive voltage from being applied to one semiconductor element of the semiconductor elements 1A and 1B during a time period for which the gate drive voltage is applied to the other semiconductor element.

When the magnitudes of detected voltages become less than the specified values, the Vf control unit 26 and the pulse control unit 27 stop the Vf control and the pulse control, respectively, and perform normal control. Switching control to the normal control may be executed as needed.

Also in the eleventh embodiment, when the magnitude of the load current becomes less than the specified values Im1 and Im2, the Vf control and the pulse control may be stopped and the normal control may be performed. When the drive control system always operates in region 1 illustrated in FIG. 6, a control switching function for the controlling of switching between region 1 and region 2 may be omitted from the Vf control unit 26. That is, during a time period for which the PWM signal FL is at an H level, the Vf control unit 26 always applies the gate drive voltage VGL to the gate of the semiconductor element 1B. When it is determined that a current flows through the semiconductor element 1B in the forward direction of the diode device 6 during the time period, similar to the eleventh embodiment, the Vf control unit 26 extends a pulse until the second time period T2 has elapsed (time t6) from time t2.

Similar to the eleventh embodiment, the twelfth to sixteenth embodiments are capable of adopting the configuration in which MOS transistors are used as the semiconductor elements 101A and 101B. Each of the semiconductor elements 101A and 101B may be an element which has a control gate and is provided with a parasitic diode, and for example, may be a diode with a MOS gate. The RC-IGBT is not limited to a trench gate type RC-IGBT, and may be a planar gate type RC-IGBT or the like. The MOS transistor is not limited to a trench gate type MOS transistor, and may be a planar gate type MOS transistor, or the like. The MOS transistor may have a super junction (SJ) structure.

The description has been given with reference to the configuration in which the sense elements 105s and 106s are connected in parallel to each other. Instead, the sense diode 106s may be provided as a single sense element, and the voltage detection unit 125 may detect a direct current voltage (DC voltage) applied to both ends of this sense element. In this configuration, both of a voltage detection and a current detection can be performed. A direct current voltage (DC voltage) may be detected using a resistor instead of the sense diode 106s. Alternatively, the sense transistor 105s may be used as a single sense element. In this case, the sense transistor 105s serves as a transistor capacitor, and thus, a voltage change can be detected as a pulse voltage/current.

Figure 27:
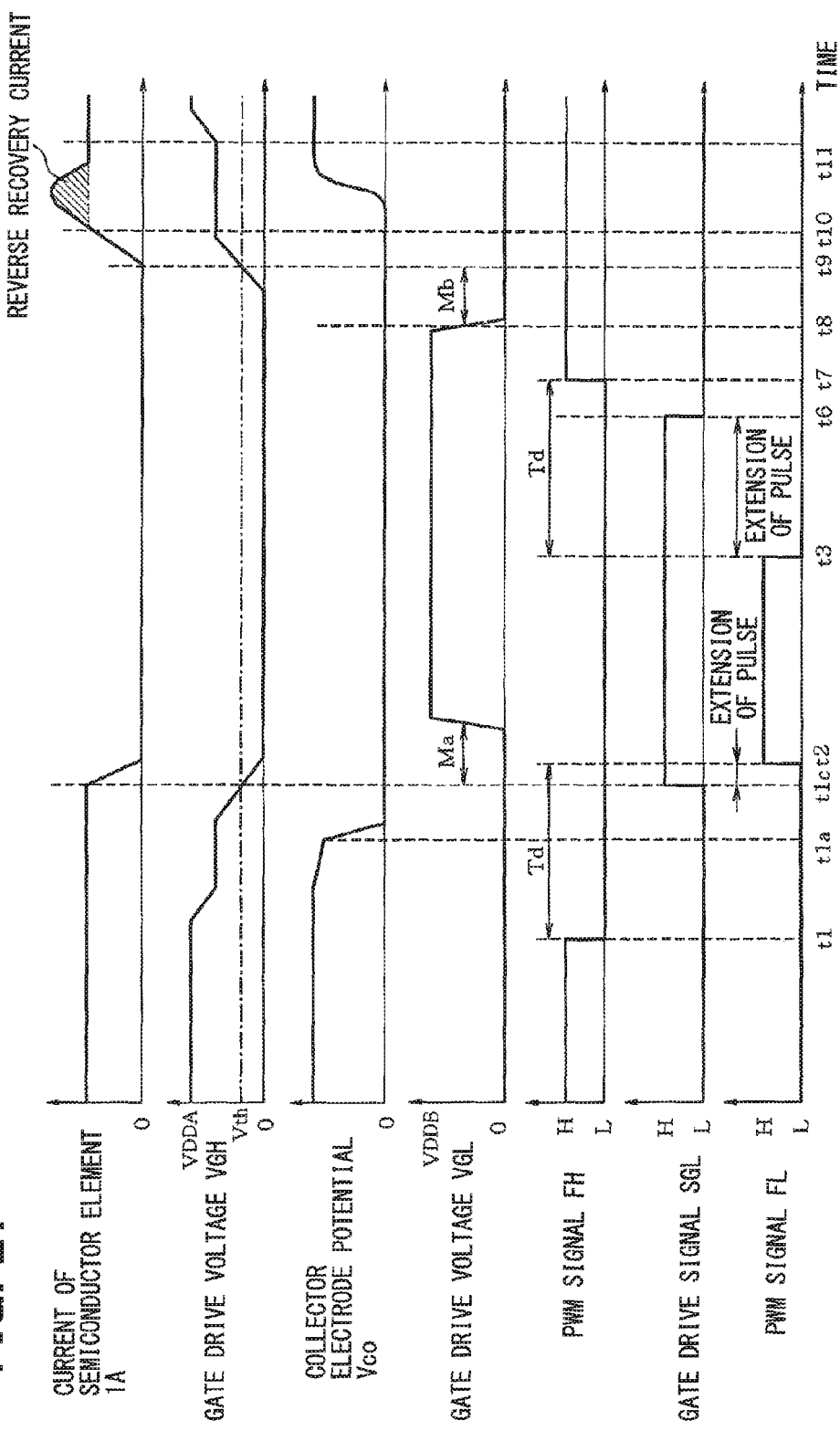
FIG. 27 illustrates waveform graphs in Vf control and pulse control when synchronous rectification is used in modification examples of the first to sixteenth embodiments.

When the configuration illustrated in FIG. 1 is adopted, as illustrated in FIG. 27, the current detection unit 25 detects the current of the semiconductor element 1A, and at time t1c at which a change in the current is detected, the Vf control unit 26 may extend a pulse prior to t2, and output the H-level gate drive signal SGL. Instead of the current detection unit 25 in FIG. 1, the current detection unit 25 of another type may be provided, or the current polarity detection circuit 68 in the seventh embodiment may be provided.

Figure 28:
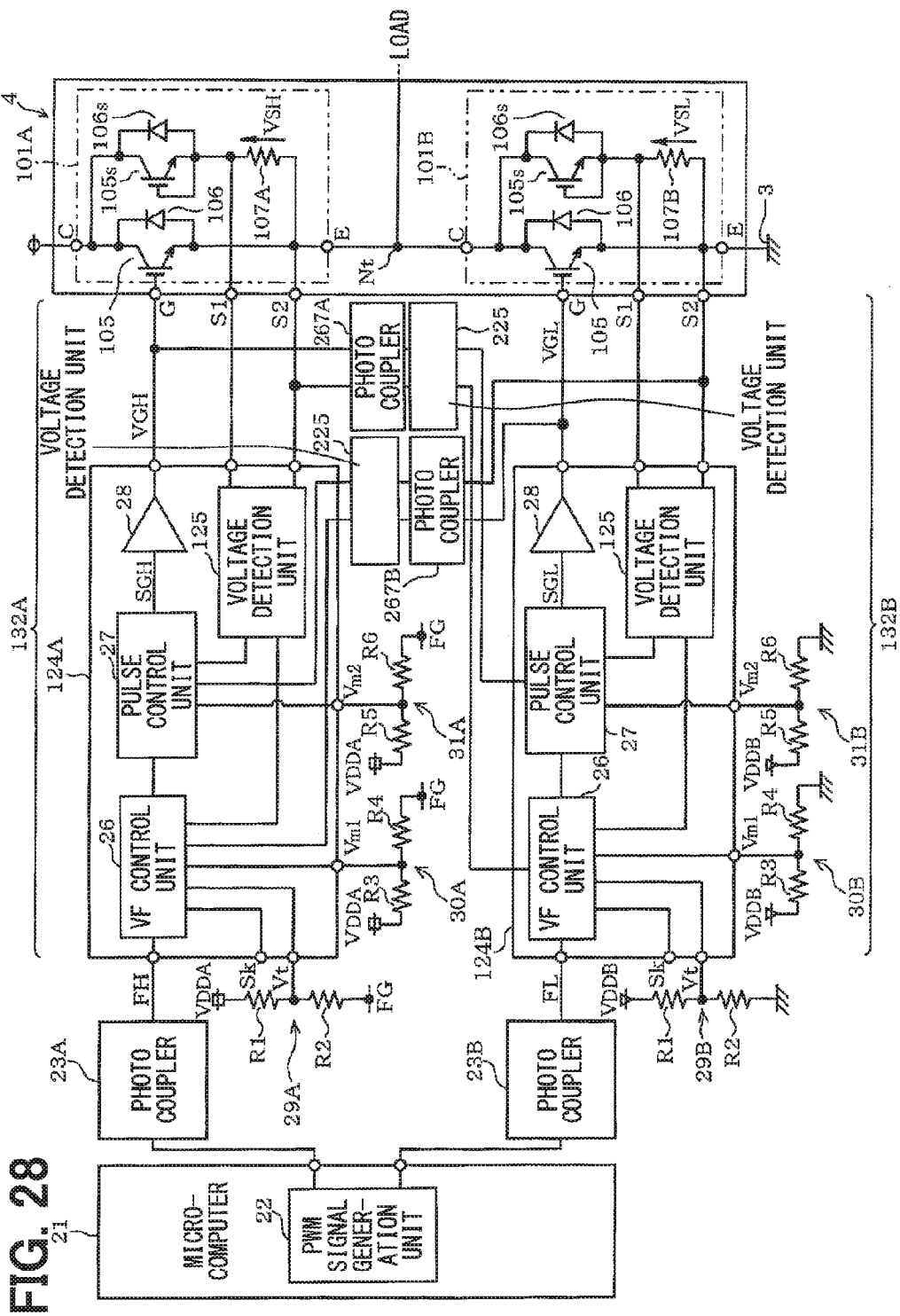
FIG. 28 is a diagram illustrating the configuration of a drive control system in the modification examples of the first to sixteenth embodiments.

As illustrated in FIG. 28, a voltage detection unit 225 for detecting the gate drive voltage VGH on a side opposite to the arm is provided as control voltage detection device based on a basic configuration illustrated in FIG. 17, and when it is determined that the gate drive voltage VGH detected by the voltage detection unit 225 is less than the threshold voltage Vth, the Vf control unit (control device) 26 may extend a pulse prior to t2, and output the H-level gate drive signal SGL. The waveforms of a control signal, a drive signal, and the like of each node in the Vf control and the pulse control are the same as in FIG. 27, and thus, an illustration will be omitted. The voltage detection units 225 may be respectively assembled into the drive IC's 124A and 124B, or may be provided independent of the drive IC's 124A and 124B.

Figure 29:
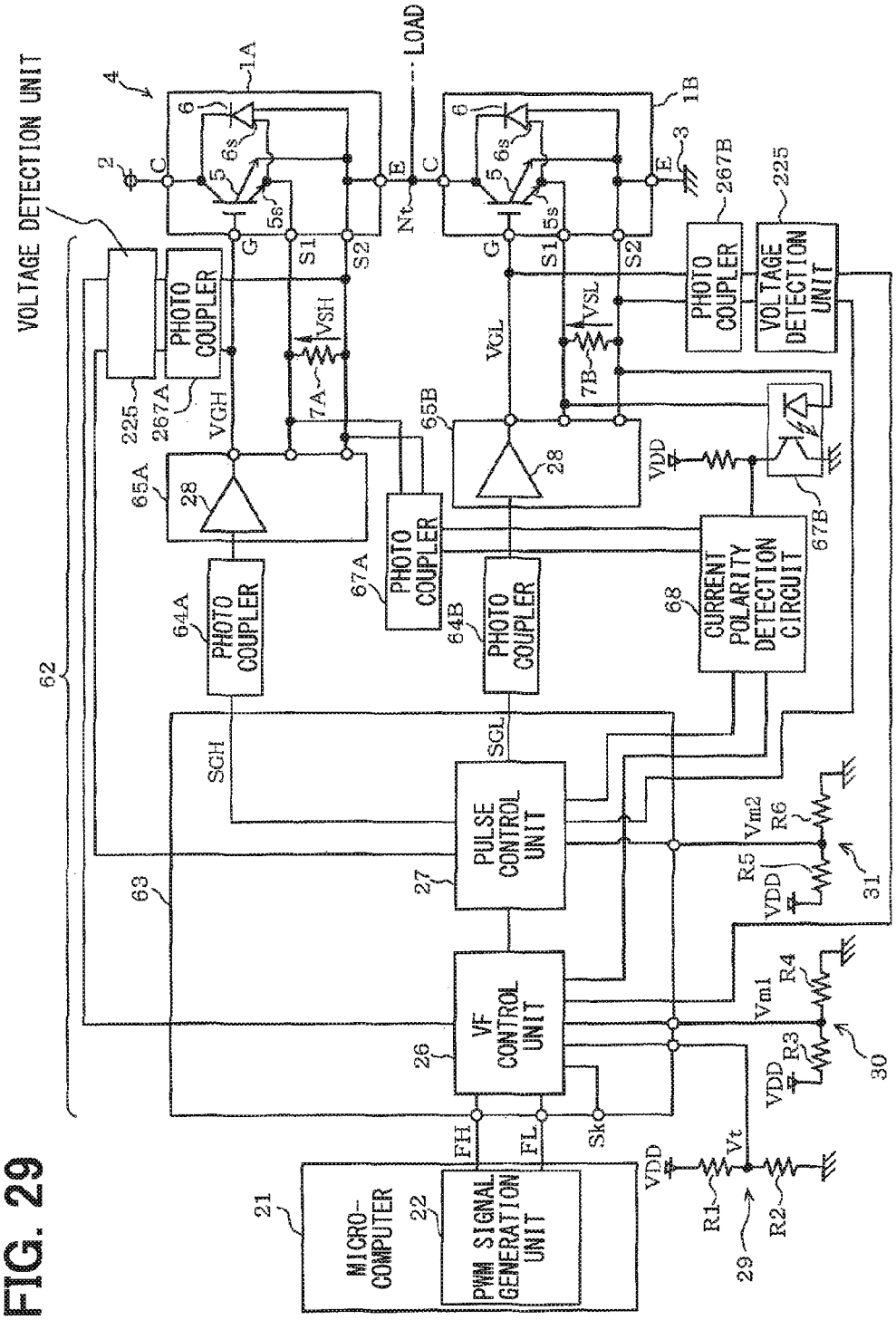
FIG. 29 is a diagram illustrating the configuration of a drive control system in the modification examples of the first to sixteenth embodiments.

Similarly, as illustrated in FIG. 29 which illustratively corresponds to FIG. 12, the voltage detection units 225 for respectively detecting the gate drive voltages VGH on the side opposite to the arm via photo couplers 267A and 267B are provided, and when it is determined that the gate drive voltage VGH detected by the voltage detection unit 225 is less than the threshold voltage Vth, the Vf control unit (control device) 26 may extend a pulse prior to t2, and output the H-level gate drive signal SGL. The waveforms of a control signal, a drive signal, and the like of each node are the same as in FIG. 27, and thus, an illustration will be omitted. Similarly, the voltage detection units 225 illustrated in FIG. 29 may be assembled into the control IC 63, or may be provided independent of the control IC 63.

Figure 30:
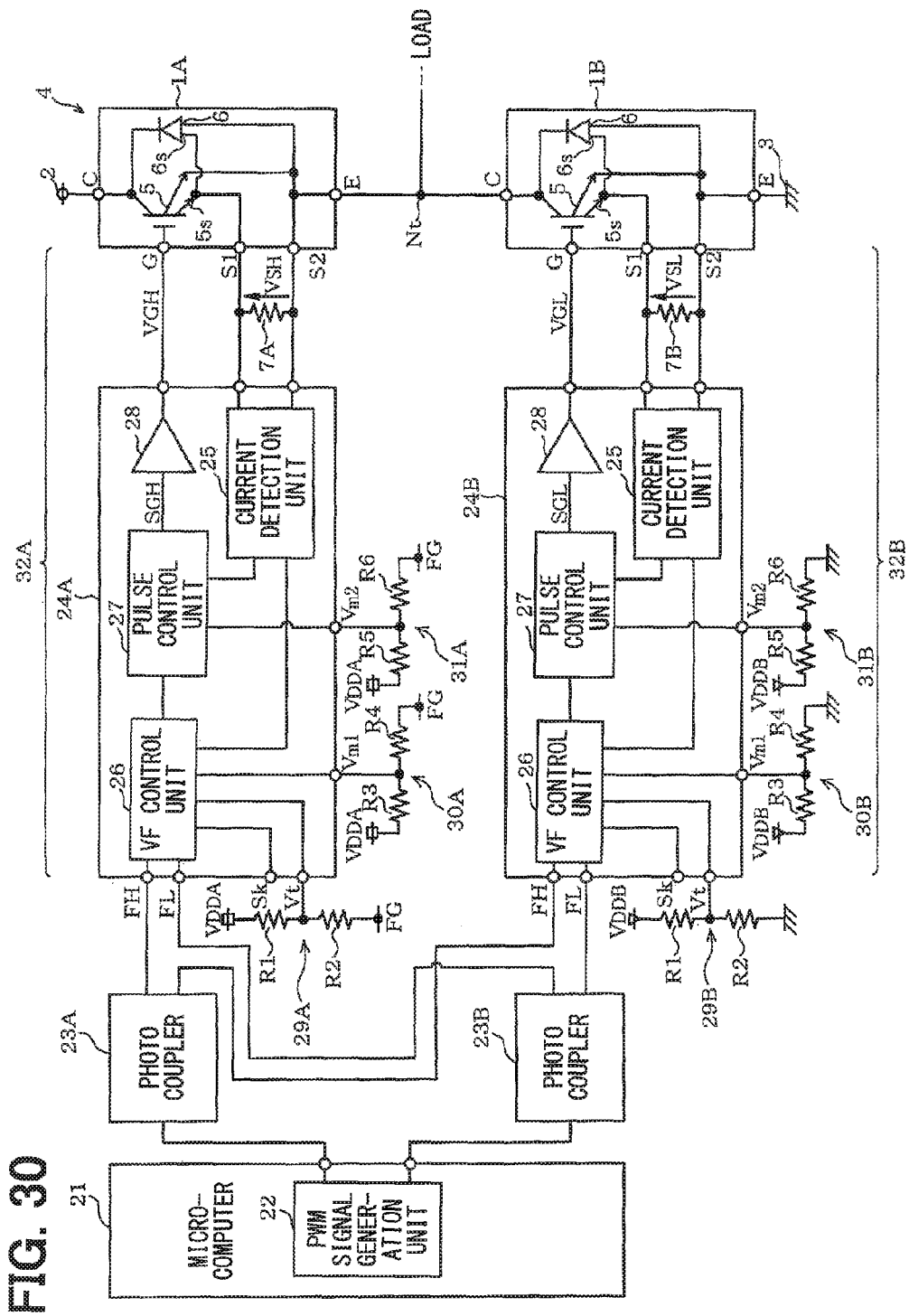
FIG. 30 is a diagram illustrating the configuration of a drive control system in the modification examples of the first to sixteenth embodiments.

As illustrated in FIG. 30, the Vf control unit 26 (or the pulse control unit 27) of each of the drive IC's 24A and 24B on the arm side receives the PWM signal FL or FH on the side opposite to the arm side, and when a predetermined amount of time has elapsed after the Vf control unit 26 (or the pulse control unit 27) detects the falling of the PWM signal, the Vf control unit 26 may extend a pulse prior to t2, and output the H-level gate drive signal SGL. The predetermined amount of time may be set such that the arms are not shorted together.

Figure 31:
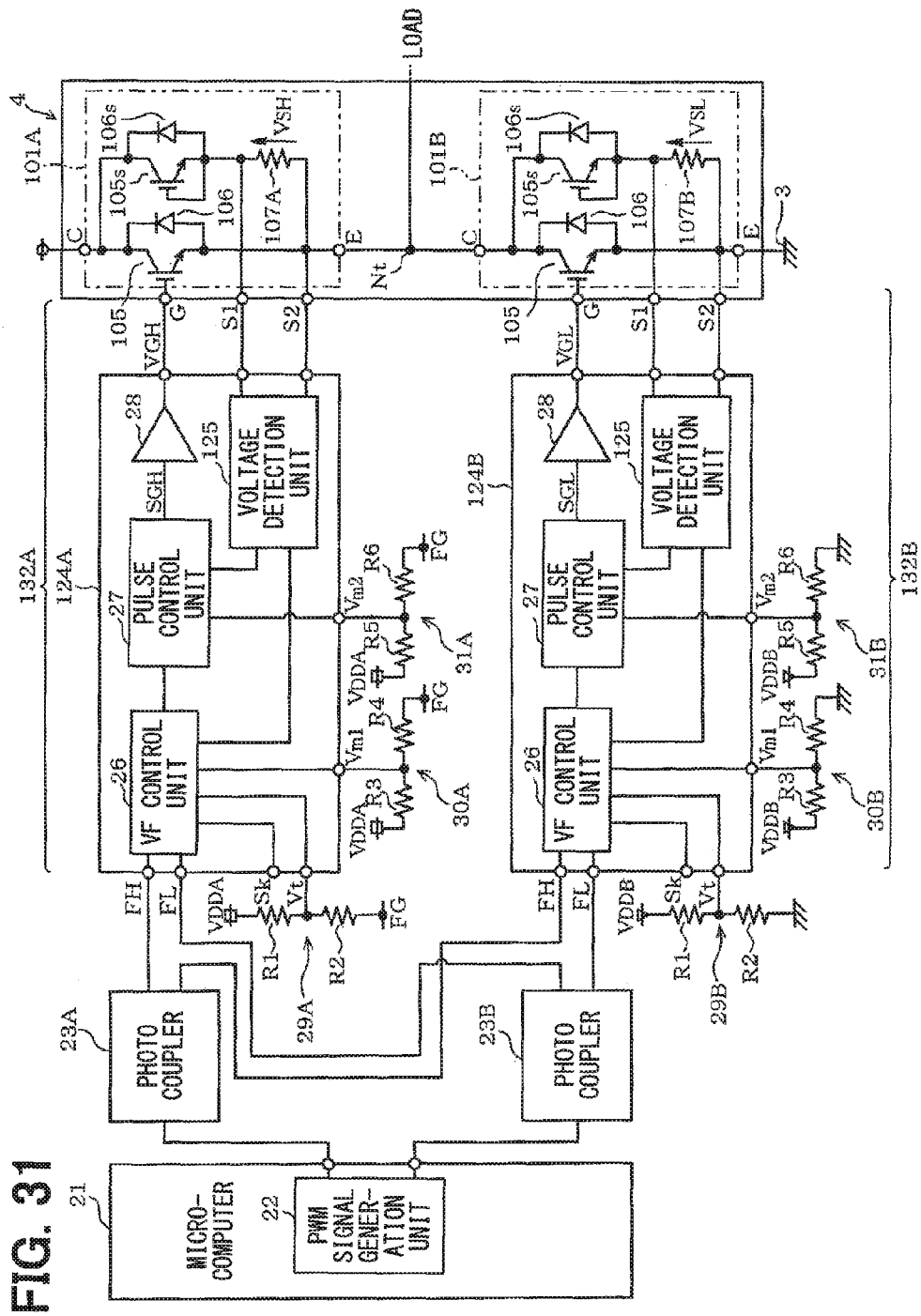
FIG. 31 is a diagram illustrating the configuration of a drive control system in the modification examples of the first to sixteenth embodiments.

As illustrated in FIG. 31, the Vf control unit 26 (or the pulse control unit 27) of each of the drive IC's 124A and 124B on the arm side receives the PWM signal FL or FH on the side opposite to the arm side, and when a predetermined amount of time has elapsed after the Vf control unit 26 (or the pulse control unit 27) detects the falling of the PWM signal, the Vf control unit 26 may extend a pulse prior to t2, and output the H-level gate drive signal SGL. The predetermined amount of time may be set such that the arms are not shorted together.

Each of FIGS. 28 to 31 illustrates an example. In addition, a configuration may be a combination of any two of the current detection device (the current detection unit 25, the hole sensor 59, the current detection circuit 60, the current polarity detection circuit 68, and the like) illustrated in the first to ninth embodiments, the voltage detection device (the voltage detection unit 125, the voltage detection unit 168, and the like) illustrated in the tenth to fifteenth embodiments, and the control voltage detection device (the voltage detection unit 225).

Figure 32:
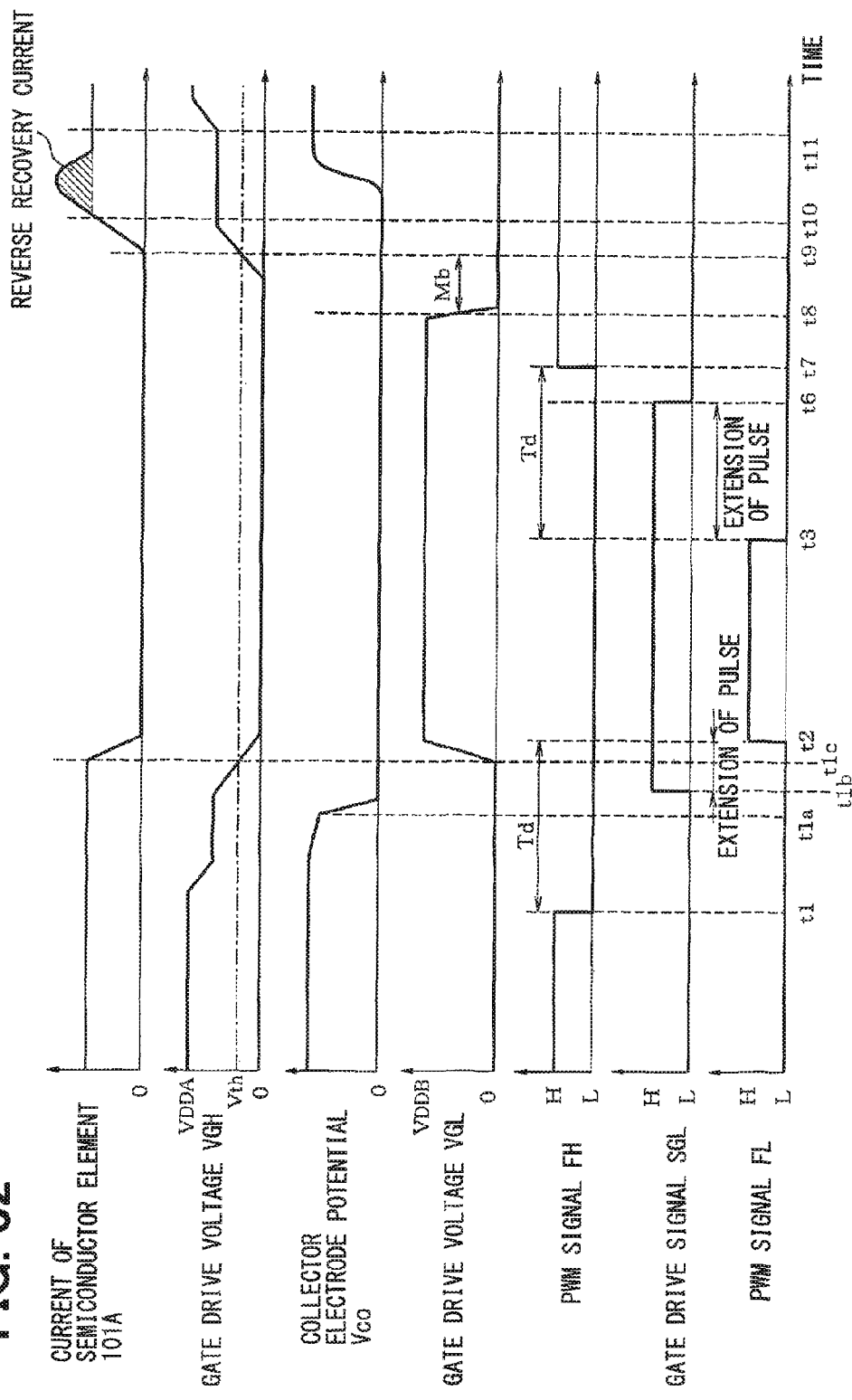
FIG. 32 illustrates waveform graphs in Vf control and pulse control when synchronous rectification is used in the modification examples of the first to sixteenth embodiments.

In particular, when a configuration may be a combination of the current detection device and the voltage detection device, as illustrated in FIG. 32, the Vf control unit 26 is capable of extending a pulse to time t1b prior to time t2, and outputting the H-level gate drive signal SGL to the extent that an arm short circuit does not occur. In the example illustrated in FIG. 32, the margin time period Ma (refer to FIG. 19) of the gate drive voltage VGL can be reduced to the minimum value (≈0).

A configuration in which the Vf control unit 26 or the pulse control unit 27 of each of the drive IC's 24A and 24B on the arm side receives the PWM signals FH and FL on the opposite side to the arm side may be combined with a configuration in which the current detection unit 25, the voltage detection unit 125, or the voltage detection unit 225 detects and controls a current or a voltage.

For example, as illustrated in FIGS. 18 and 19, when comparing a time at which the current of the semiconductor element 101A falls with a time at which the collector electrode potential Vco is detected to fall, it is understood that the time at which the collector electrode potential Vco is detected to fall is ahead of the time at which the current of the semiconductor element 101A falls.

Accordingly, for example, if based on a voltage detection signal, by means of the voltage detection device described in the tenth embodiment and the like, it is determined that a current flows in the forward direction of the diode structure 6 when the Vf control unit 26 receives an off-command signal of the PWM signal FL, as illustrated in FIG. 32, the gale drive signal SGL may be extended to time t1b prior to time t2 in such a way that the timing of an increase in the gate drive voltage VGL is behind of time t1c at which the flow of a current through the semiconductor element 101A is stopped (timing at which a current starts to flow through the semiconductor element 101B).

A predetermined delay time period from when the pulse is extended and the gate drive signal SGL is output to when the gate drive voltage VGL is generated is required. For this reason, this delay time period is pre-measured, and in anticipation of the measured time period, time t1b at which the pulse extension starts may be set prior to time t2 in advance. As described in the eleventh embodiment, there is the occurrence of various delay variations in the voltage detection unit 125, the driver 28, the semiconductor elements 101A and 101B, and the like, and the delay variations may be pre-measured, and a margin may be anticipated. However, when voltage detection control and current detection control by the voltage detection unit 125, the current detection unit 25, and the like are combined together, a start timing of the pulse extension can be determined at time (t1a) at which a voltage change is detected, and thus, delay variations may not be pre-measured, and the start timing of the pulse extension may not be set prior to time t2.

In this control, the Vf control unit 26 is capable of performing the pulse extension (which is illustrated in the eleventh embodiment) earlier than when control is performed using only the current detection device described in the first to ninth embodiments, a time period required to perform a gate drive process can be ensured, a synchronous rectification period can be extended, and the maximum effects can be obtained.

In the drawings, 1A, 1B, 101A, 101B represent semiconductor elements; 4 represents a half-bridge circuit; 5 and 105 represent transistor devices (transistor structures); 6 and 106 represent diode devices (diode structures); 7A, 7B, 107A, and 107B represent sense resistors (current detection device); 8 represents a semiconductor substrate; 8a represents a guard ring (electric field limiting ring); 15 represents an emitter electrode (conduction electrode); 18 represents a collector electrode (conduction electrode); 21 and 121 represent microcomputers (control IC's); 24A, 24B, 124A, 124B, 51, 53, 55, 151, and 153 represent drive IC's (IC's); 25 represents a current detection unit (current detection device); 125 and 168 represent voltage detection units (voltage detection device); 26 represents a Vf control unit (control device, second control device, or input device); 27 represents a pulse control unit (control device, first control device, or input device); 28 represents a drive circuit; 32A, 32B, 132A, 132B, 52, 54, 56, 152, 154, 61, 62, 162, 71, 72, and 172 represent drive control devices; 59 represents a hole sensor (current detection device); 60 represents a current detection circuit (current detection device); 63 represents a control IC; 64A, 64B, 67A, and 67B represent photo couplers (insulated circuits); 65A and 65B represent drive IC's; 68 represents a current polarity detection circuit (current detection device); 180 represents a voltage detection unit (voltage detection device); and 225 represents a voltage detection unit (control voltage detection device).

Seventeenth Embodiment

Figure 33:
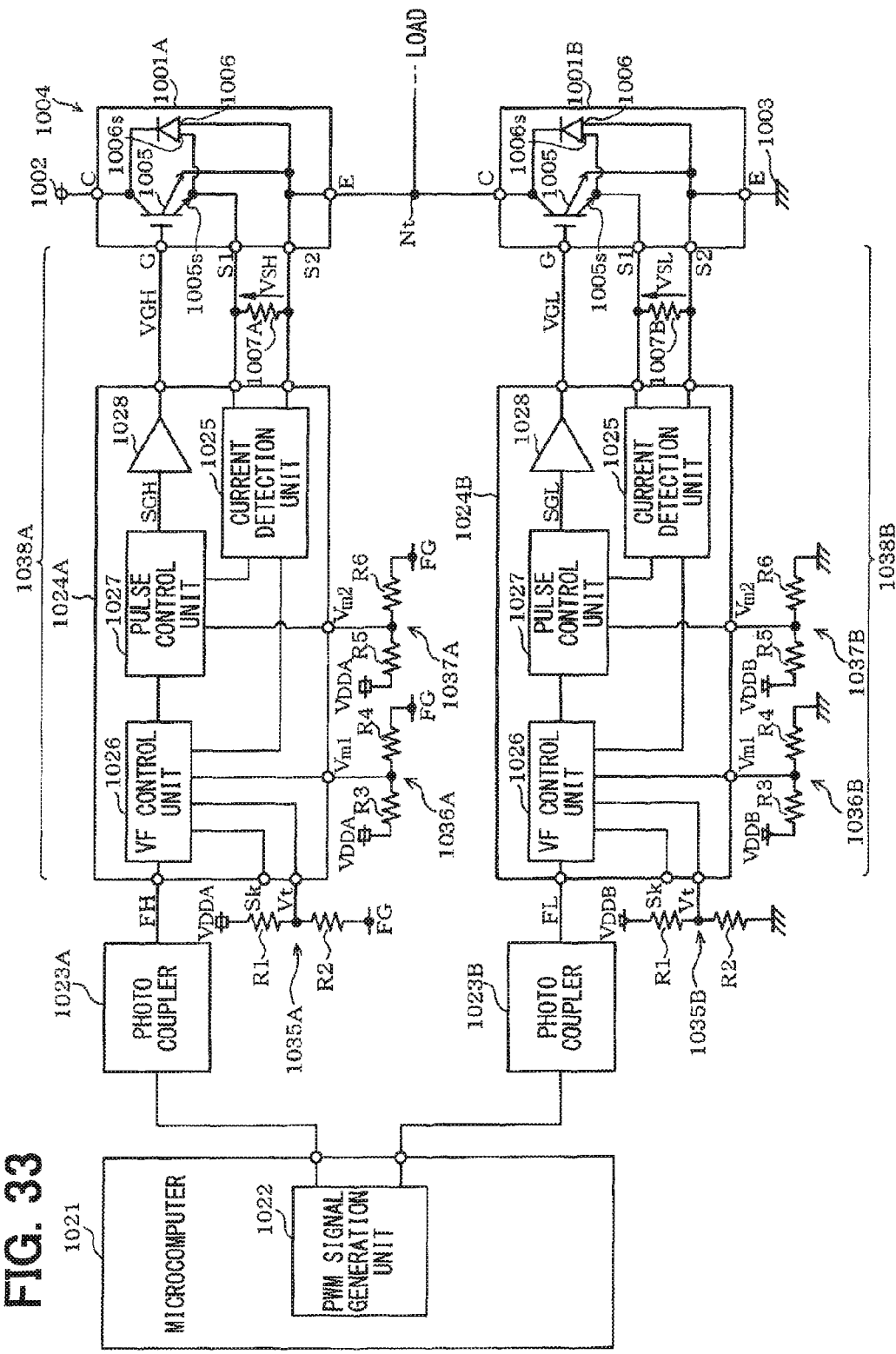
FIG. 33 is a diagram illustrating the configuration of a drive control system in a seventeenth embodiment of the present disclosure.

Hereinafter, a seventeenth embodiment of the present disclosure will be described with reference to the drawings. A description will be given using a drive control system in FIG. 33 (equivalent to FIG. 1 in the first embodiment) that illustrates a basic configuration, which can be applied to all of the aforementioned embodiments. The drive control system illustrated in FIG. 33 is used in power converter devices such as an inverter device that drives an inductive load (for example, a motor), and a converter device that includes an inductor, and boosts and bucks a DC voltage. Semiconductor elements 1001A and 1001B which are switching devices form a half-bridge circuit 1004 such that the semiconductor elements 1001A and 1001B are disposed in series with the output terminal Nt interposed between a high-potential DC power supply line 1002 and a low-potential DC power supply line 1003.

Figure 34:
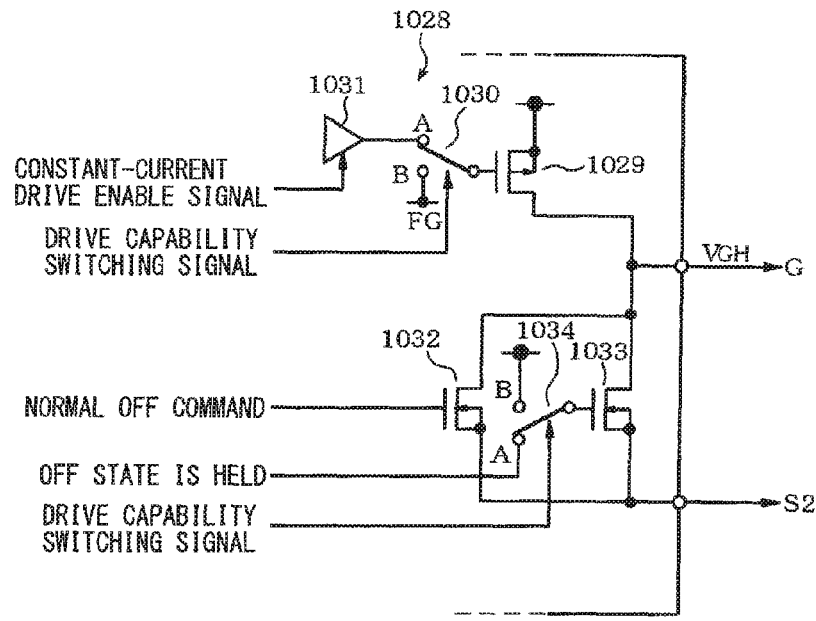
FIG. 34 is a diagram illustrating the configuration of a drive capability switching circuit of a drive circuit.

The gate drive signal SGL generated by a Vf control unit 1026 and a pulse control unit 1027 is applied to a gate of the semiconductor element 1001B via a drive circuit 1028. As illustrated in FIG. 34, the drive circuit 1028 is capable of switching a gate drive capability in multiple ways.

When turned on, the drive circuit 1028 drives the gate using a MOS transistor 1029. The output voltage (A side) of a constant current drive amplifier 1031 or the voltage (B side) of a floating ground FG is applied to a gate of the MOS transistor 1029 via a switching switch 1030. In the former case, a normal drive capability is obtained, and in the latter case, a high drive capability is obtained. At a normal drive capability, the drive circuit 1028 performs a protective operation against a short-circuit current in the middle of a drive period. For this reason, the constant current drive amplifier 1031 temporarily holds the gate drive voltage VGL at a midpoint voltage in the middle of an increase in the gate drive voltage VGL.

When turned off, the drive circuit 1028 drives the gate using MOS transistors 1032 and 1033. When a switching switch 1034 switches to the A side, and only the MOS transistor 1032 is driven, a normal drive capability is obtained, and when the switching switch 1034 switches to the B side, and the MOS transistors 1032 and 1033 are driven, a high drive capability is obtained. The MOS transistor 1033 has on-resistance lower than that of the MOS transistor 1032. The MOS transistor 1033 is used to hold an off state of the semiconductor element 1001B.

When a rapid change in a current (element current) flowing through the semiconductor element 1001B or a rapid change in voltage occurs, for example, when the PWM signal FL rises, or when the PWM signal FL falls in a state in which a current flows through a transistor device 1005, the drive circuit 1028 switches to a normal drive capability so as to restrict the occurrence of a voltage surge. In contrast, when a rapid change in the element current or the voltage does not occur as with the pulse control, the drive circuit 1028 switches to a high drive capability.

Threshold value setting circuits 1035A, 1036A, and 1037A are externally attached to a drive IC 1024A. Threshold value setting circuits 1035B, 1036B, and 1037B are externally attached to a drive IC 1024B. Each of the threshold value setting circuits 1029A, 1030A, and 1031A is configured with respect to the reference potential of the floating ground FG, which is equal to the emitter potential of the semiconductor element 1001A. The threshold value setting circuit 1035A generates a threshold value voltage Vt by dividing the voltage VDDA using the resistors R1 and R2, and the threshold value setting circuit 1035B generates the threshold value voltage Vt by dividing the voltage VDDB using the resistors R1 and R2. The threshold value setting circuit 1036A generates the specified voltage Vm1 by dividing the voltage VDDA using the resistors R3 and R4, and the threshold value setting circuit 1036B generates the specified voltage Vm1 by dividing the voltage VDDB using the resistors R3 and R4. The threshold value setting circuit 1037A generates the specified voltage Vm2 by dividing the voltage VDDA using the resistors R5 and R6, and the threshold value setting circuit 1037B generates the specified voltage Vm2 by dividing the voltage VDDB using the resistors R5 and R6.

The threshold value voltage Vt determines the magnitude of the current threshold value It used by the Vf control unit 1026. The characteristic of the forward voltage Vf with respect to the forward current If of a diode device 1006 varies depending on the types (an RC-IGBT, a MOS transistor, and the like) of elements or the breakdown voltage of an element. The Vf control unit 1026 properly selects the current threshold value It based on the switch signal Sk applied from the outside and the threshold value voltage Vt.

The specified voltage Vm1 determines the magnitude of a specified value Im1 used to determine whether to stop the Vf control. The specified voltage Vm2 determines the magnitude of a specified value Im2 used to determine whether to stop the pulse control. There is a problem in that the polarity of a current is reversed due to a control delay when the current is detected, and when the gate drive voltages VGH and VGL are applied based on the polarity of the detected current. For this reason, when a current detection value is less than the specified value Im1, the Vf control unit 1026 stops the Vf control, and when the current detection value is less than the specified value Im2, the pulse control unit 1027 stops the pulse control.

A drive control device 1038A is formed of the drive IC 1024A and a sense resistor 1007A, and a drive control device 1038B is formed of the drive IC 1024B and a sense resistor 1007B.

Hereinafter, the operation of the low-side drive control device 1038B will be mainly described with reference to FIGS. 35 to 46. The high-side drive control device 1038A also operates in the same manner. First, the Vf control will be simply described. When a gate drive voltage is applied to each of the semiconductor elements 1001A and 1001B, which are RC-IGBT's, in a state where a current flows through the diode device 1006, a channel is formed in a first region 1012, and the injection of holes is restricted. For this reason, as illustrated in FIG. 37, the forward voltage Vf of the diode device 1006 through which the forward current If flows increases, and the conduction loss (Vf×If) of the diode device 1006 increases.

When a current greater than or equal to the current threshold value It flows through the diode device 1006, a conduction loss can be reduced by shutting off the gate drive voltage. When an RC-IGBT is used, the current threshold value It is substantially zero, and when a MOS transistor is used, the current threshold value It becomes a value greater than zero according to a breakdown voltage or the like. For example, the switch signal Sk switches to an L level to drive the RC-IGBT, and the switch signal Sk switches to an H level to drive the MOS transistor. When the switch signal Sk is at an H level, the Vf control unit 1026 sets the current threshold value It according to the threshold value voltage Vt, and executes the Vf control.

Figure 38:
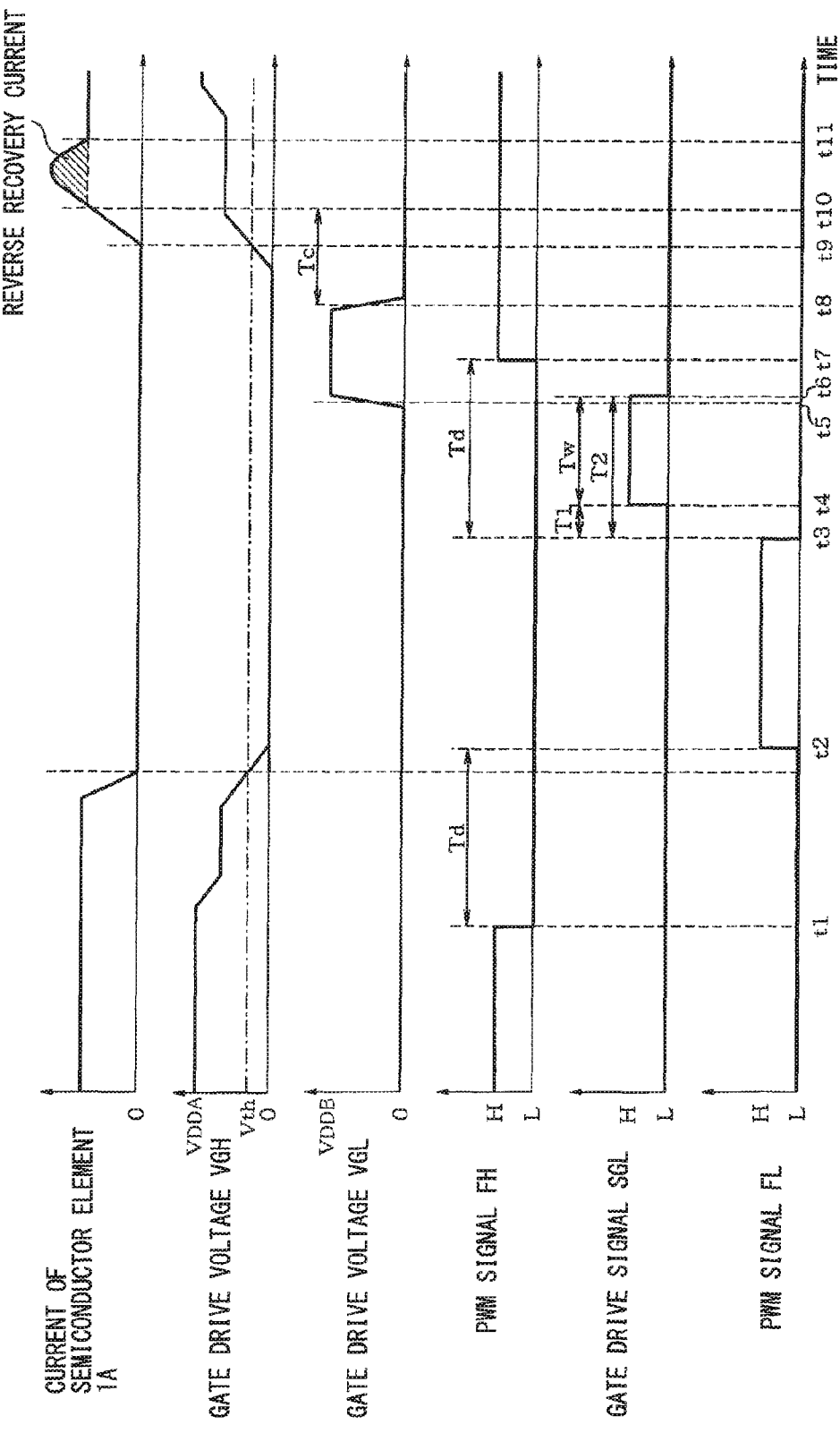
FIG. 38 illustrates waveform graphs in Vf control and pulse control.

FIG. 38 illustrates waveforms when the semiconductor element 1001A is turned off, the semiconductor element 1001B is turned on, and then the semiconductor element 1001B is turned off, and the semiconductor element 1001A is turned on again in a state where a current flows toward a load from the output terminal Nt. The current of the semiconductor element 1001A, the gate drive voltages VGH and VGL, the PWM signal FH, the gate drive signal SGL, and the PWM signal FL are illustrated sequentially from the top. Vth is the threshold value voltage of the semiconductor element 1001A.

The Vf control unit 1026 of the drive IC 1024B determines whether or not the detected current of the diode device 1006 in the forward direction is greater than or equal to the current threshold value It during a time period (time t2 to time t3) for which the PWM signal FL is at an H level. When it is determined that the detected current is greater than or equal to the current threshold value It, as illustrated in FIG. 38, the Vf control unit 1026 outputs the L-level gate drive signal SGL. Accordingly, the gate drive voltage VGL is shut off, and a conduction loss is reduced.

Hereinafter, the pulse control will be described. The pulse control represents control by which when a current flows through the diode device 1006 of the semiconductor element 1001B during the time period for which the PWM signal FL is at an H level, a gate drive pulse is applied to the semiconductor element 1001B until a reverse recovery current starts to flow after the PWM signal FL falls to an L level. Similarly, when a current flows through the diode device 1006 of the semiconductor element 1001A during a time period for which the PWM signal FH is at an H level, after the PWM signal FH falls to an L level, the pulse control is performed. Accordingly, the amount of carriers (holes) accumulated in the diode device 1006 is reduced, and thus, it is possible to obtain the effect of reducing the reverse recovery current.

In FIG. 38, if it is determined that a current flows through the diode device 1006 of the semiconductor element 1001B (if a current detection value is greater than or equal to the specified value Im2) when the PWM signal FL falls to an L level (time t3), the pulse control unit 1027 sets the gate drive signal SGL to an H level from when the first time period T1 has elapsed (time t4) to when the second time period T2 has elapsed (time t6), starting from when the PWM signal FL falls. Due to the Vf control, the gate drive signal SGL is set to an L level when the PWM signal FL falls.

Also after the PWM signal falls to an L level, the pulse control unit 1027 continues to determine whether or not a current flows through the diode device 1006 of the semiconductor element 1001B. When the current detection value is less than the specified value Im2, the pulse control unit 1027 immediately causes the gate drive signal SGL to return to an L level even before the second time period T2 has elapsed after the first time period T1 has elapsed.

In contrast, if it is determined that a current does not flow through the diode device 1006 when the PWM signal FL falls to an L level, the pulse control unit 1027 immediately maintains the gate drive signal SGL at an L level. That is, the gate drive pulse is not applied.

Figure 39:
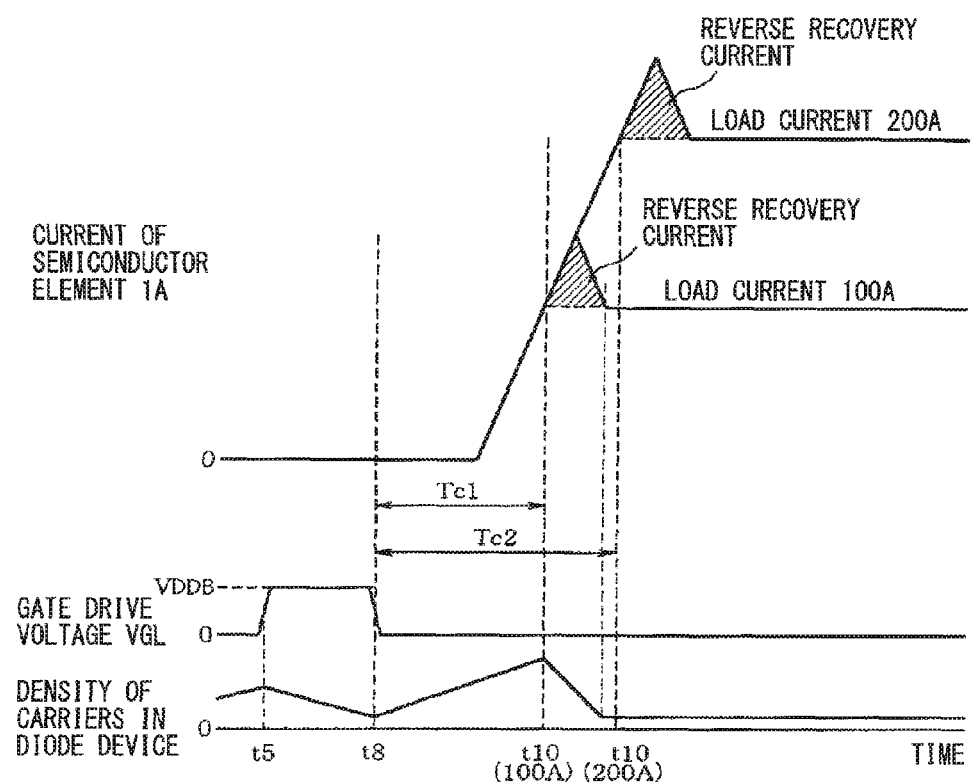
FIG. 39 is a graph illustrating an element current, a gate drive voltage, and a carrier concentration in a diode device.
Figure 40:
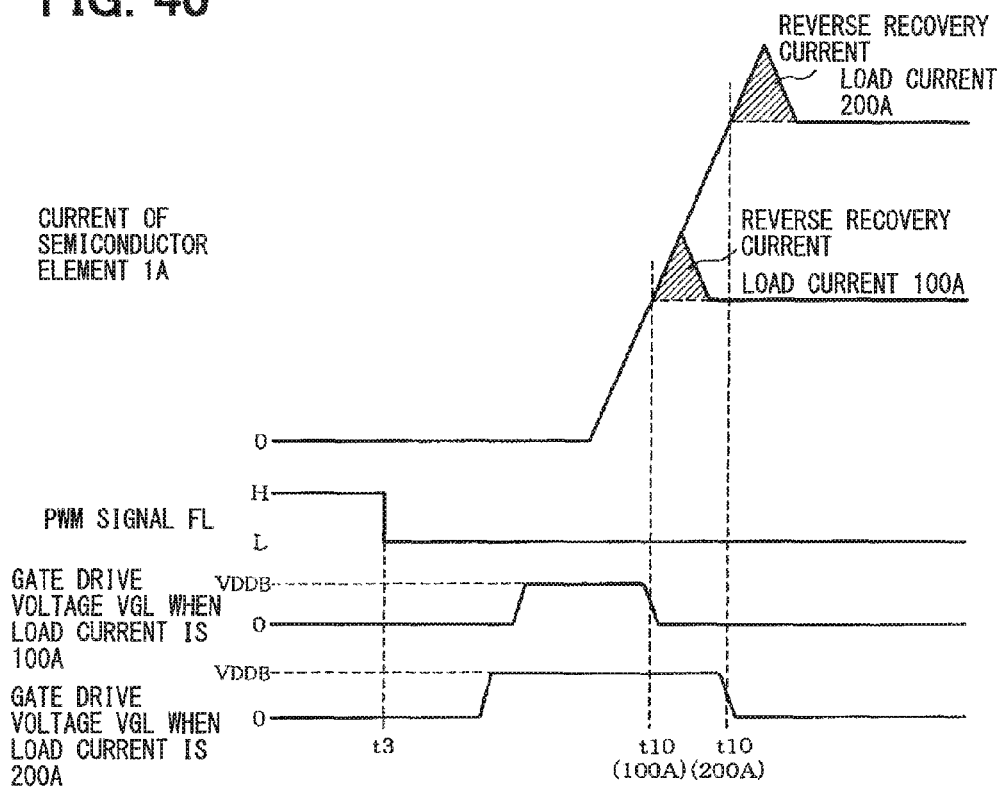
FIG. 40 illustrates waveform graphs when a re-injection time period becomes zero.

As illustrated in FIG. 38, when conduction switches between the upper arm and the lower arm, and it is determined that the gate drive voltage VGH is greater than or equal to the threshold value voltage Vth (time t9), a current increasingly flows through the transistor device 1005 of the semiconductor elements 1001A. The reverse recovery current represents a fraction of the current of the transistor device 1005 exceeding the amount of current flowing through the diode device 1006 of the semiconductor element 1001B. The reverse recovery current is illustrated by hatching in the drawing (time t10 to time t11). FIGS. 39 and 40 concurrently illustrate a load current of 100 A and a load current of 200 A (which respectively represent currents flowing through the semiconductor elements 1001A and 1001B).

As illustrated in FIG. 39, when the gate drive voltage VGL (the gate drive pulse) is applied, the amount of carriers in the diode device 1006 of the semiconductor element 1001B is reduced, and thus, the density of carriers decreases (time t5 to time t8). When the application of the gate drive pulse ends, carriers are re-injected into the diode device 1006, and thus, the density of carriers increases. The time period Tc (Tc1 and Tc2) from when the application of the gate drive pulse ends (time t8) to when the reverse recovery current starts to flow (time t10) represents a carrier re-injection time period.

Figure 41:
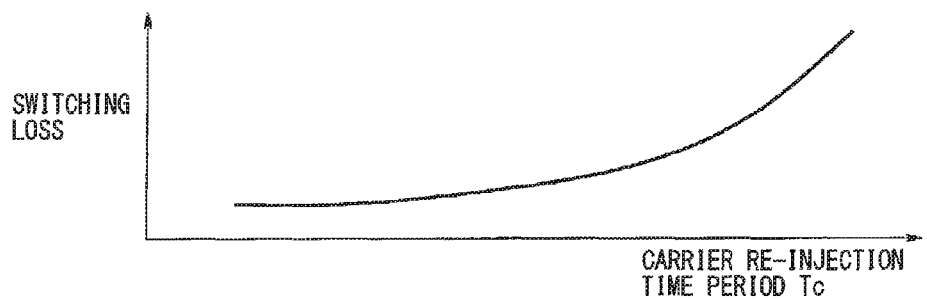
FIG. 41 is a graph illustrating a relationship between the re-injection time period and a switching loss.

The density of carriers accumulated in the diode device 1006 decreases to the extent that the re-injection time period Tc is reduced, and thus, the reverse recovery current decreases. As illustrated in FIG. 41, a switching loss is reduced to the extent that the re-injection time period Tc is reduced. Accordingly, the re-injection time period Tc is controlled to be shorter than or equal to an injection allowance time period corresponding to the allowed magnitude of the reverse recovery current. FIG. 40 illustrates a case in which the re-injection time period Tc is zero. Actually, in order to prevent the occurrence of an arm short circuit, the re-injection time period Tc is controlled to be longer than or equal to a short-circuit margin time period Tm (>0).

Figure 42:
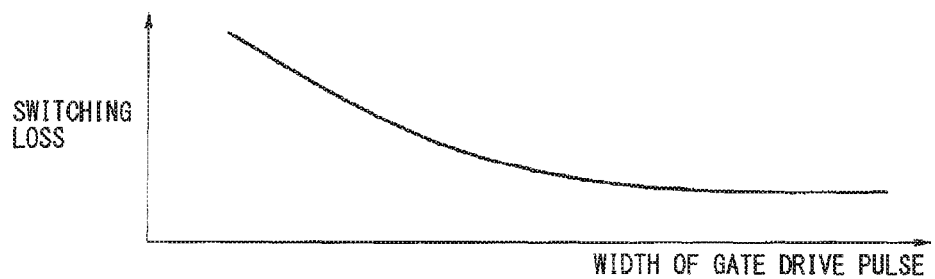
FIG. 42 is a graph illustrating a relationship between a pulse width and the switching loss.

As illustrated in FIG. 39, a time (time t10) at which the reverse recovery current starts to flow is delayed to the extent that a load current is high. For this reason, if an ending time of the application of the gate drive voltage VGL is fixed (time t8) from when the PWM signal FL falls, when the load current is 100 A, the re-injection time period becomes Tc1, and when the load current is 200 A, the re-injection time period becomes Tc2 (>Tc1). That is, to the extent that the load current is high, the re-injection time period increases, and the reverse recovery current increases. The density of carriers accumulated in the diode device 1006 increases to the extent that the load current is high, and thus, in order to reduce a switching loss by sufficiently lowering the density of carriers, as illustrated in FIG. 42, it is necessary to sufficiently ensure a time period for the reduction of carriers by ensuring the width of the gate drive pulse to some extent.

In this manner, the pulse control unit 1027 controls the application timing of the gate drive voltage VGL according to the load current. The pulse control unit 1027 sets a time width Tw to a value corresponding to the magnitude of a current flowing through the diode device 1006 during a time period for which the PWM signal FL falls to an H level, with the time width Tw being the difference between the first time period T1 for which the gate drive signal SGL is set to an H level and the second time period T2 for which the gate drive signal SGL is returned to an L level, starting from when the PWM signal FL falls. Specifically, the time width is set to a large value to the extent that a current flowing through the diode device 1006 is high during a time period for which the PWM signal FL is at an H level.

Specifically, the first time period T1 and the second time period T2 are set by pre-measuring a timing at which the gate drive signal SGL is applied, a timing at which the gate drive voltage VGL is actually applied, and a timing at which a reverse recovery current starts to flow, starting from when the PWM signal FL falls, while diversely changing a current flowing through the diode device 6. The first time period T1 and the second time period T2 are stored in a memory 1039 (to be described later) (which may be designed as an analog circuit or the like) while being associated with a current. Instead of the first time period T1 and the second time period T2, the first time period T1 and the pulse width Tw (=T2−T1) may be stored.

Figure 35:
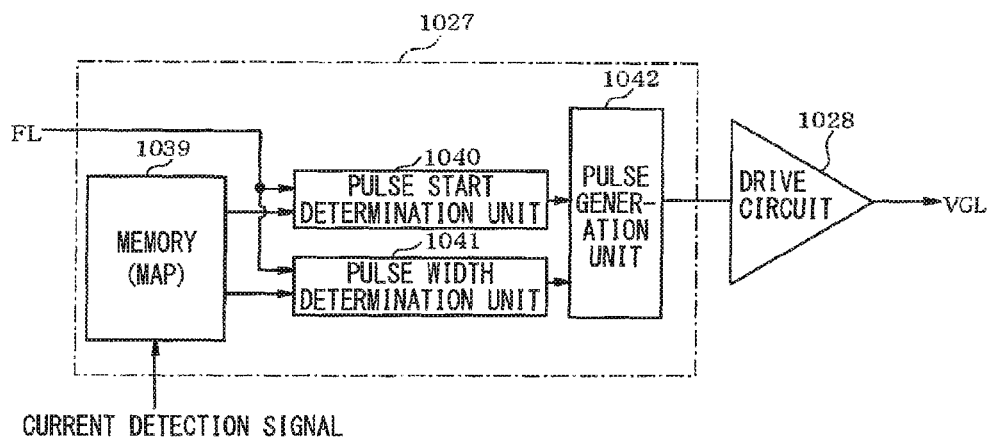
FIG. 35 is a block diagram illustrating the configuration of a pulse control unit.
Figure 43:
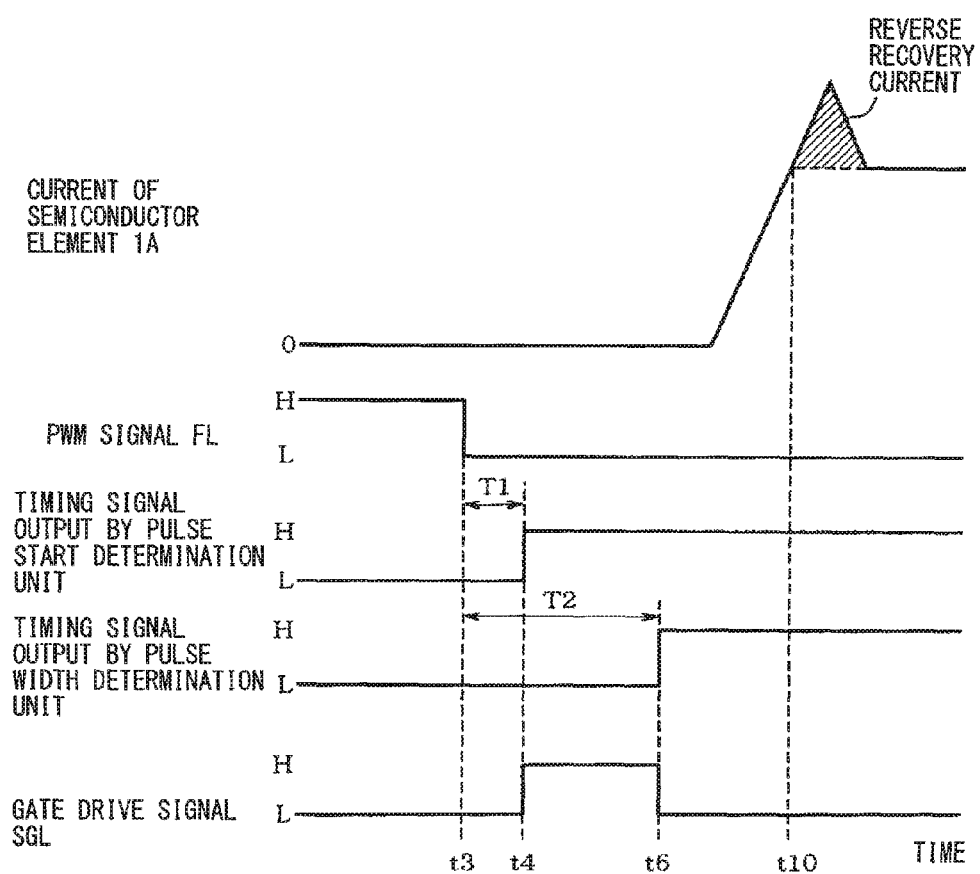
FIG. 43 shows graphs illustrating a first time and a second time.

FIG. 35 is a block diagram illustrating the configuration of the pulse control unit 1027 of the drive IC 1024B. The memory 1039 receives a current detection signal, and outputs the first time period T1 and the second time period T2 (or the first time period T1 and the pulse width Tw) required for the pulse control. As illustrated in FIG. 43, a pulse start determination unit 1040 generates a timing signal for the rising of the gate drive signal SGL based on the PWM signal FL and the first time period T1. A pulse width determination unit 1041 generates a timing signal for the falling of the gate drive signal SGL based on the PWM signal FL and the second time period T2 (or the pulse width Tw). A pulse generation unit 1042 generates the gate drive signal SGL based on these timing signals, and outputs the resultant signal to the drive circuit 1028.

Figure 36:
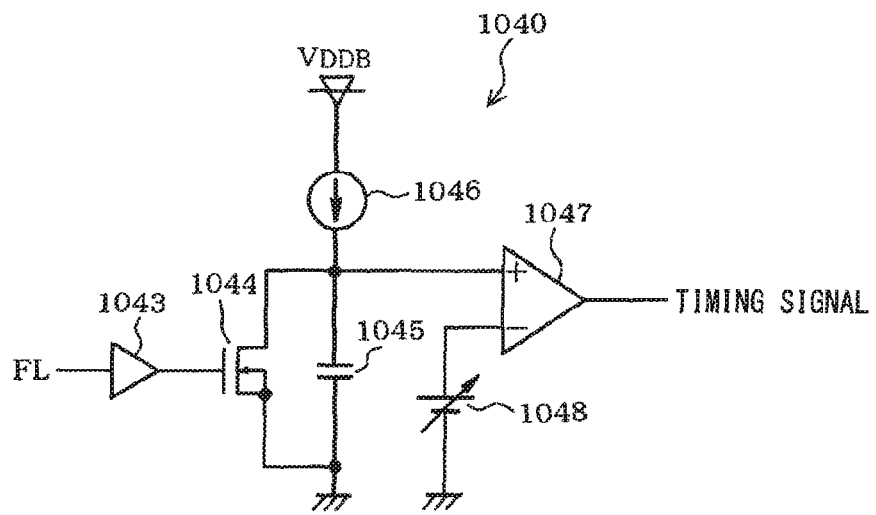
FIG. 36 is a diagram illustrating the configuration of a pulse start determination unit.
Figure 37:
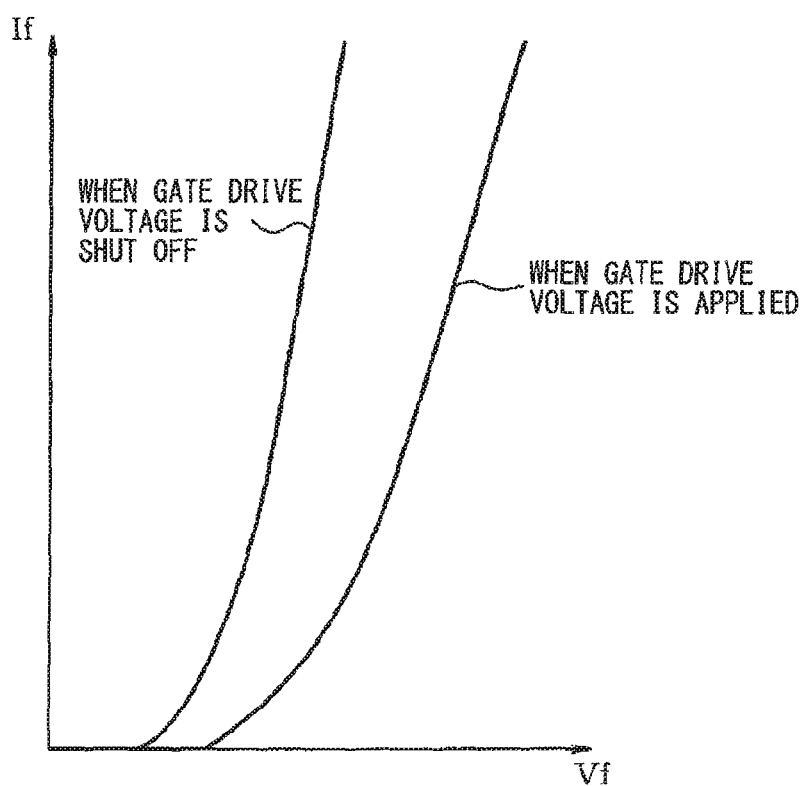
FIG. 37 is a forward voltage-to-current characteristic graph of a diode device.

For example, the pulse start determination unit 1040 has a configuration illustrated in FIG. 36. A MOS transistor 1044 is turned on by a gate voltage input through a buffer 1043 during a time period for which the PWM signal FL is at an H level, and thus, the voltage of a capacitor 1045 becomes zero. When the PWM signal FL falls to an L level, the MOS transistor 1044 is turned off, and the capacitor 1045 is charged by a constant current circuit 1046. A comparator 1047 compares the voltage of the capacitor 1045 with a reference voltage corresponding to the first time period T1, and outputs a timing signal. The pulse width determination unit 1041 also has the same configuration.

Figure 44:
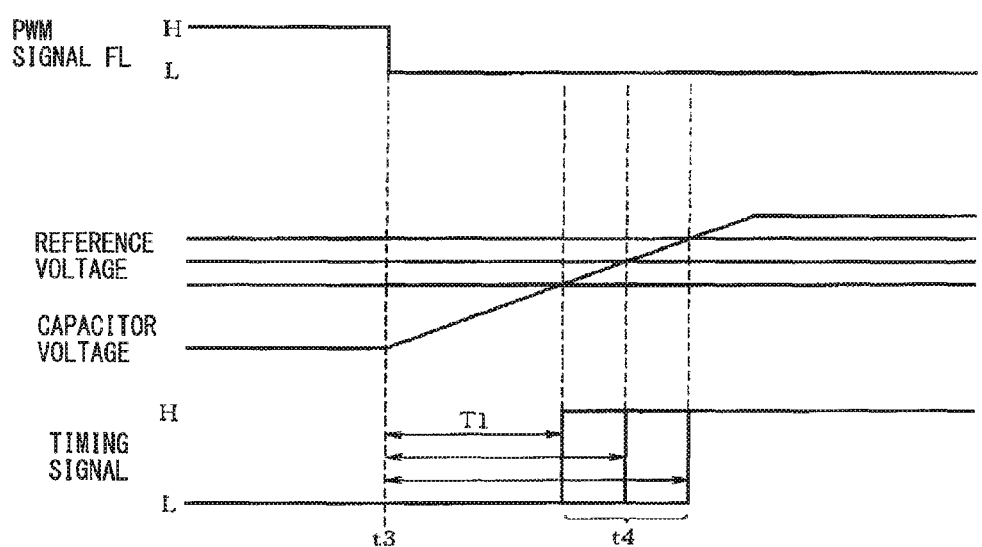
FIG. 44 shows graphs illustrating the operation of the pulse start determination unit.

FIG. 44 illustrates a state in which the first time period T1 output from the memory 1039, that is, the reference voltage changes according to a current flowing through the diode device 1006 during a time period for which the PWM signal FL is at an H level, and accordingly, the timing signal for the rising of the gate drive signal SGL changes. The memory 1039 may store the first time period T1, and a value read therefrom may be changed according to an element current.

During the time period for which the PWM signal FL is at an L level, when a current flows through the diode device 1006, the waveform of the gate drive voltage VGL at the application of the gate drive pulse is different from that when a current flows through the transistor device 1005. While factors illustrated in (1) to (3) (to be described hereinafter) are taken into consideration, the first time period T1 and the second time period T2 (or the first time period T1 and the pulse width Tw) are set in order for the gate drive voltage VGL to simply increase or decrease according to the gate drive capability of the drive circuit 1028.

(1) Dead Time Td

The dead time Td of the PWM signals FH and FL is a constant time period. For this reason, a time period from when the PWM signal FL is set to an L level to when the PWM signal FH is set to an H level, and a time period from when the PWM signal FH is set to an L level to when the PWM signal FL is set to an H level are accurately ensured. While an arm short circuit is prevented from occurring, the gale drive pulse can be applied by using the dead time Td.

(2) Mirror Time Period

If a current flows through the transistor device 1005, the collector-to-emitter voltage changes when the gate drive voltage VGL is applied and shut off, and thus, the mirror time period occurs. The mirror time period is long, and for example, the mirror time period may become a time period of several μ seconds depending on conditions. In contrast, if a current flows through the diode device 1006, the collector-to-emitter voltage does not change, and thus, the mirror time period does not occur.

Figure 45:
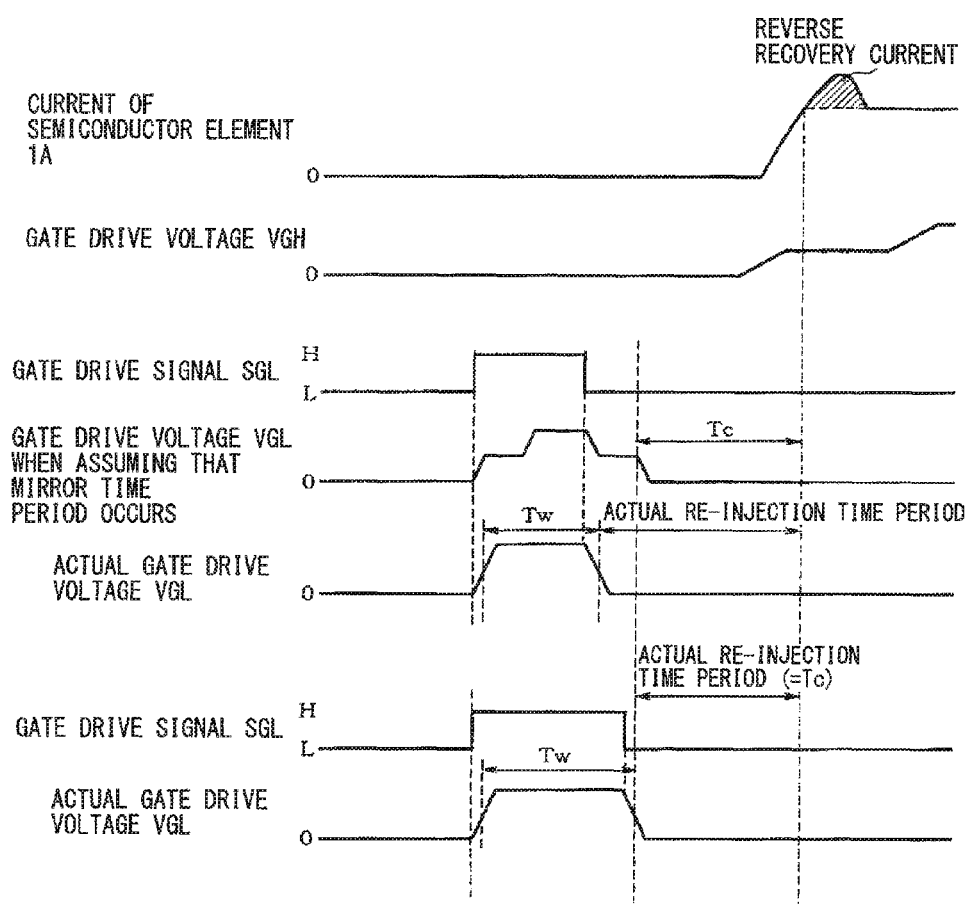
FIG. 45 illustrates waveform graphs when a mirror time period is present and is not present.

FIG. 45 illustrates the re-injection time period when the timing of the gate drive pulse is set on the condition that the mirror time period is present, and the re-injection time period when the timing of the gate drive pulse is set on the condition that the mirror time period does not present. In the former case, when the re-injection time period Tc is set assuming that the mirror time period occurs, actually, the mirror time period does not occur, and thus, an actual re-injection time period becomes longer than Tc. In contrast, initially, when the re-injection time period is set assuming that the mirror time period does not occur, the re-injection time period Tc can be set as intended. Accordingly, the timing of the gate drive pulse is set using a time period from which the mirror time period is subtracted. As a result, effects that a longer pulse width Tw of the gate drive pulse can be ensured can be obtained.

(3) Drive Capability of Drive Circuit 1028

When outputting the gate drive pulse, the drive circuit 1028 causes the switching switches 1030 and 1034 (refer to FIG. 34) to switch to the B side at the rising and the falling of the gate drive voltage VGL, and outputs the gate drive voltage VGL at a high gate drive capability (herein, the maximum gate drive capability). The reason for this is that a current continues to flow through the diode device 1006 during an application time period of the gate drive pulse, and thus, a surge caused by a rapid change in the current does not occur.

When the gate drive voltage VGL rises, the drive circuit 1028 outputs the gate drive voltage VGL while maintaining a constant gate drive capability. When a current flows through the transistor device 1005, according to a method adopted, a short-circuit current at the occurrence of a short circuit in the other side semiconductor element 1001A is reduced by temporarily holding the gate drive voltage VGL at the midpoint voltage Vm (for example, 12 V) in the middle of an increase in the gate drive voltage VGL. However, when a forward current flows through the diode device 1006 of the semiconductor element 1001B, there is no possibility that a short circuit on a path via each of the semiconductor elements 1001A and 1001B occurs. For this reason, two-stage drive using the midpoint voltage Vm is not required.

Figure 46:
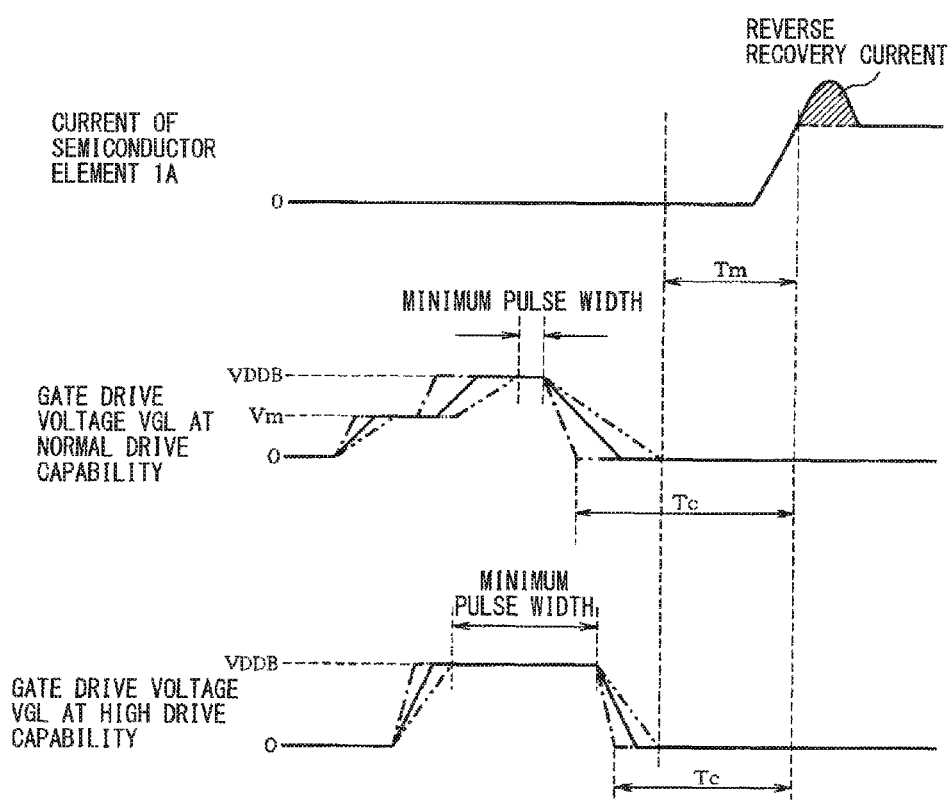
FIG. 46 illustrates gate drive voltage waveforms for different drive capabilities.

FIG. 46 illustrates a waveform when the drive circuit 1028 outputs the gate drive voltage VGL at a normal drive capability using the two-stage drive by contrast with a waveform when the drive circuit 1028 outputs the gate drive voltage VGL while maintaining a high drive capability. The drive capability of the drive circuit 1028, the gate capacitance of the semiconductor element 1001B, and the like have variations, and thus, variations in the rising time and the falling time of the gate drive voltage VGL occur. These variations appear to be large to the extent that the drive capability is low.

For this reason, when the re-injection time period Tc is set to be always longer than or equal to the short-circuit margin time period Tm, the drive circuit 1028 outputs the gate drive voltage VGL while maintaining a high drive capability, and thus, it is possible to decrease the square of the re-injection time period Tc and the short-circuit margin time period Tm. That is, the re-injection time period Tc can be accurately controlled. In addition, variations in the pulse width Tw of the gate drive pulse can be reduced, and a larger pulse width Tw can be ensured.

As described above, in this embodiment, when conduction switches between the upper arm and the lower arm, and it is determined that a current flows through the semiconductor elements 1001A and 1001B in the forward direction of the diode device 1006 during the time period for which the respective PWM signals FH and FL are at an H level, the drive control devices 1038A and 1038B output the gate drive signals SGH and SGL to command the application of the gate drive pulse, respectively. Due to the pulse control, the amount of holes accumulated in the diode device 1006 is reduced such that the reverse recovery current is reduced, and thus, a switching loss can be reduced.

The respective pulse control units 1027 of the drive IC's 1024A and 1024B set the respective gate drive signals SGH and SGL to an H level from when the first time period T1 has elapsed to when the second time period T2 has elapsed, starting from when the respective PWM signals FH and FL fall. Since the falling of each of the PWM signals FH and FL is a starting point of the dead time Td, while an arm short circuit is prevented from occurring, the gate drive pulse can be applied by effectively using the dead time Td of predetermined period.

The first time period T1 and the second time period T2 (or the first time period T1 and the pulse width Tw) are set based on delays or variations in the gate drive voltages VGH and VGL which are pre-measured corresponding to the dead time Td and the element current, and a time period until the reverse recovery current starts to flow, and the first time period T1 and the second time period T2 are stored in the memory 1039 of the pulse control unit 27.

The timing at which the reverse recovery current flows is delayed to the extent that the load current is high, when conduction switches between the upper arm and the lower arm. The time width (the pulse width Tw), which is the difference between the first time period T1 and the second time period T2, is set to be large to the extent that a current flowing through the diode device 1006 is high during the time period for which the PWM signals FH and FL are at an H level. Accordingly, regardless of the magnitude of the load current, the re-injection time period Tc (time period from when the application of the gate drive pulse ends to when the reverse recovery current starts to flow) for which carriers are re-injected into the diode device 1006 can be restricted from increasing, and a switching loss can be reduced.

The first time period T1 and the second time period T2 are set such that the re-injection time period Tc becomes greater than zero. Accordingly, a short-circuit current can be prevented from flowing the half-bridge circuit 4. The pulse width Tw is set to be shorter than or equal to a predetermined injection allowance time period. Accordingly, the reverse recovery current can be limited to be less than or equal to the magnitude corresponding to the injection allowance time period, and a switching loss can be reduced.

The first time period T1 and the second time period T2 are set while the waveform of the gate drive voltage and the drive pattern of the drive circuit 1028 at the application of the gate drive pulse are taken into consideration. That is, if the gate drive pulse is applied when a current flows through the diode device 1006, the mirror time period does not occur. The first time period T1 and the second time period T2 are set assuming that the mirror time period does not occur.

A current continues to flow through the diode device 1006 during an application time period of the gate drive pulse, and thus, a surge caused by a rapid change in the current and the voltage does not occur. For this reason, the drive circuit 1028 outputs the gate drive voltages VGH and VGL according to the maximum gate drive capability thereof. When a current flows through the diode device 1006, there is no possibility of a short circuit occurring. For this reason, when the gate drive voltages VGL and VGH rise and fall, the drive circuit 1028 causes the gate drive voltages VGL and VGH to simply increase while maintaining a constant gate drive capability. The first time period T1 and the second time period T2 are set in accordance with when such a drive pattern is used.

When a specific drive pattern is used for the gate drive pulse, a delay or variations in the gate drive voltage are reduced compared to the gate drive voltage when a drive pattern of conducting and shutting off the transistor device 1005 is used. For this reason, the drive IC's 1024A and 1024B are capable of increasing the accuracy of the application timing of the gate drive pulse, and accurately controlling the re-injection time period Tc. As a result, while an arm short circuit is prevented from occurring, the re-injection time period can be controlled to be short, and a switching loss can be further reduced. In addition, a wider pulse width Tw of the gate drive pulse can be ensured. Since the pulse control unit 1027 applies the gate drive signal, starting from when the PWM signals FH and FL fall, the pulse control unit 1027 does not require a separate timing signal, and a drive control device in the related art is easily switched to the drive control device in the embodiment.

Even during the time period (time t4 to time t6) for which the gate drive puke is applied based on the pulse control, when it is determined that a current may not flow through the diode device 1006 (a current detection value may become less than the specified value Im2) or a current does not flow through the diode device 1006, the pulse control unit 1027 immediately stops applying the gate drive pulse. Accordingly, even if the load current changes rapidly, an arm short circuit can be reliably prevented from occurring. In addition, it is not necessary to set the specified value Im2 to a high value in preparation for a rapid change in the load current, and thus, a wide range of current with which the pulse control is executed can be ensured, and a switching loss can be further reduced.

Figure 7:
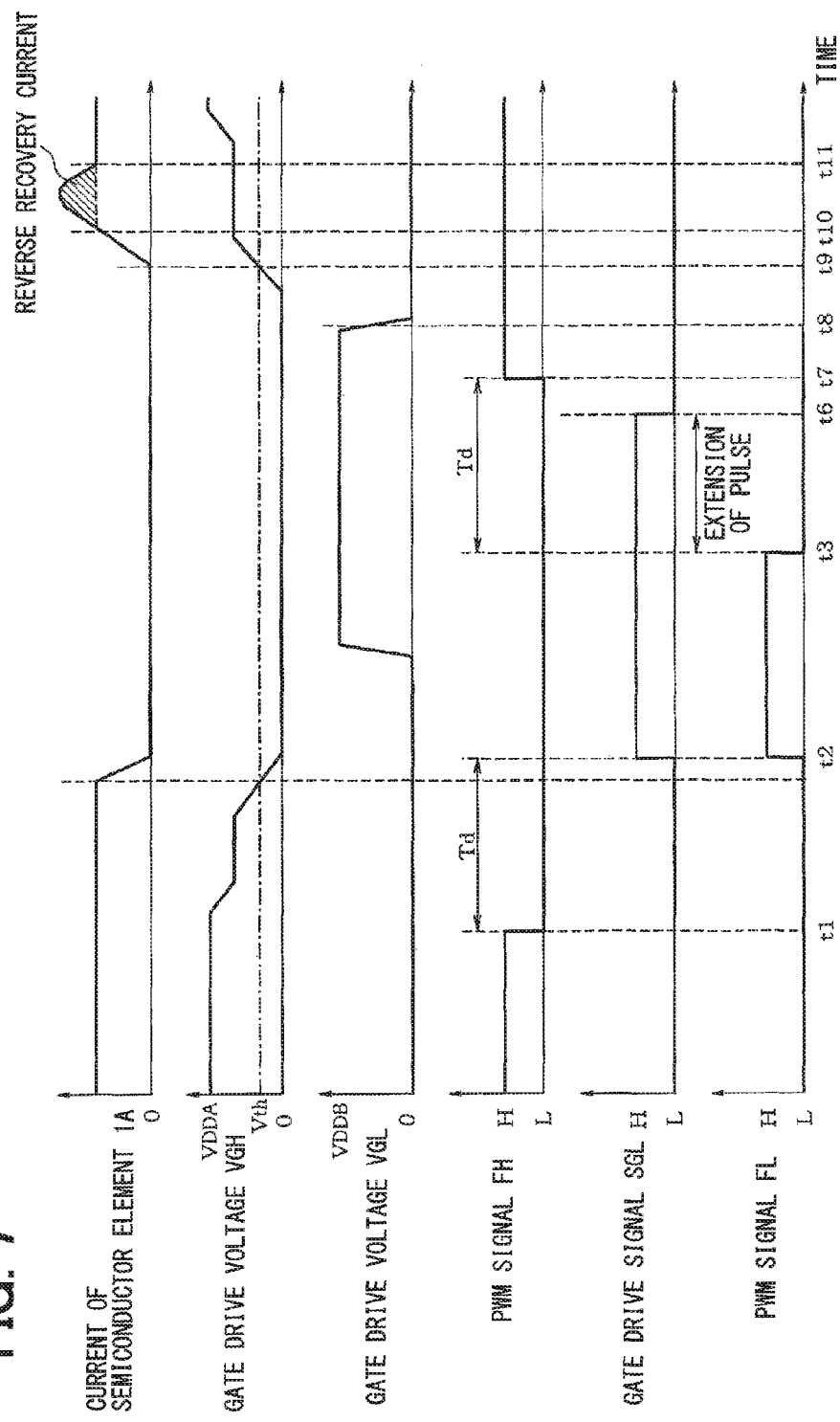
FIG. 7 illustrates waveform graphs in Vf control and pulse control when synchronous rectification is used.

In the seventeenth embodiment, when a conduction loss can be reduced by performing synchronous rectification using MOS transistors as the semiconductor elements 1A and 1B as described in the second embodiment, and when it is determined that a current flows through the semiconductor element in the forward direction of the diode structure, the gate drive voltages VGH and VGL may be output at a high drive capability corresponding to the rising (t2) of the gate drive control signals SGL and SGH as illustrated in FIG. 7 and the second time period T2, instead of the first time period T1.

In the seventeenth embodiment, the drive control system with the circuit configuration equivalent to the first embodiment has been described; however, instead of the circuit configuration (equivalent to the first embodiment) illustrated in FIG. 33, the drive control system described in the third to ninth embodiments can also be applied. Also in this case, when a conduction loss can be reduced by performing synchronous rectification using MOS transistors as the semiconductor elements 1A and 1B as illustrated in FIGS. 8 to 14, and when it is determined that a current flows through the semiconductor element in the forward direction of the diode structure, the gate drive voltages VGH and VGL may be output at a high drive capability corresponding to the rising (t2) of the gate drive control signals SGL and SGH as illustrated in FIG. 7 and the second time period T2, instead of the first time period T1.

In the seventeenth embodiment, the drive control system with the circuit configuration equivalent to the first embodiment has been described; however, instead of the circuit configuration (equivalent to the first embodiment) illustrated in FIG. 33, the drive control system described in the eleventh to fifteenth embodiments can also be applied. Also in this case, when a conduction loss can be reduced by performing synchronous rectification using MOS transistors as the semiconductor elements 101A and 101B as illustrated in FIG. 17 and FIGS. 20 to 23, and when it is determined that a current flows through the semiconductor element in the forward direction of the diode structure, the gate drive voltages VGH and VGL may be output at a high drive capability corresponding to the rising (t2) of the gate drive control signals SGL and SGH as illustrated in FIG. 19 and the second time period T2, instead of the first time period T1.

In the seventeenth embodiment, the drive control system with the circuit configuration equivalent to the first embodiment has been described; however, instead of the circuit configuration (equivalent to the first embodiment) illustrated in FIG. 33, the drive control system, which executes the control illustrated in FIGS. 7, 19, 27, and 32 and is described in the modification examples of the first to sixteenth embodiments, can also be applied. In this case, when a conduction loss can be reduced by performing synchronous rectification using MOS transistors as the semiconductor elements 1A and 1B or the semiconductor elements 101A and 101B, and when it is determined that a current flows through the semiconductor element in the forward direction of the diode structure, the gate drive voltages VGH and VGL may be output at a high drive capability corresponding to the rising (t2, t1c, and t1b) of the gate drive control signals SGL and SGH as illustrated in FIG. 27 and the second time period T2, instead of the first time period T1.

The preferred embodiments of the present disclosure have been described; however, this disclosure is not limited to the aforementioned embodiments, and this disclosure can be modified in various forms or can be extended insofar as the modifications and the extension do not depart from the purport of this disclosure.

The RC-IGBT is not limited to a trench gate type RC-IGBT, and may be a planar gate type RC-IGBT or the like. Each of the semiconductor elements 1001A and 1001B may be an element which has a control gate and is provided with a parasitic diode, and for example, may be a MOS transistor and a diode with a MOS gate. The MOS transistor is not limited to a trench gate type MOS transistor, and may be a planar gate type MOS transistor, or the like. The MOS transistor may have a super junction (SJ) structure.

Figure 47:
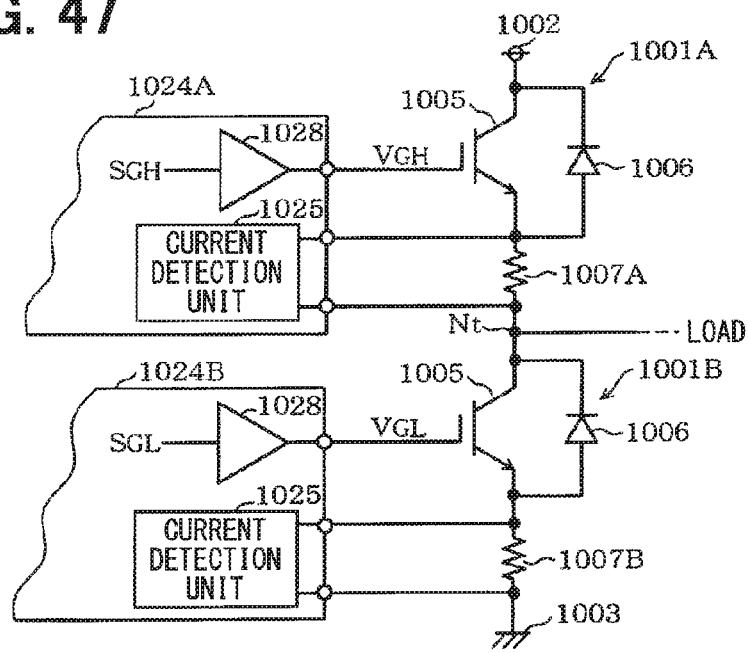
FIG. 47 is a diagram illustrating the other modification example of the current detection configuration.
Figure 48:
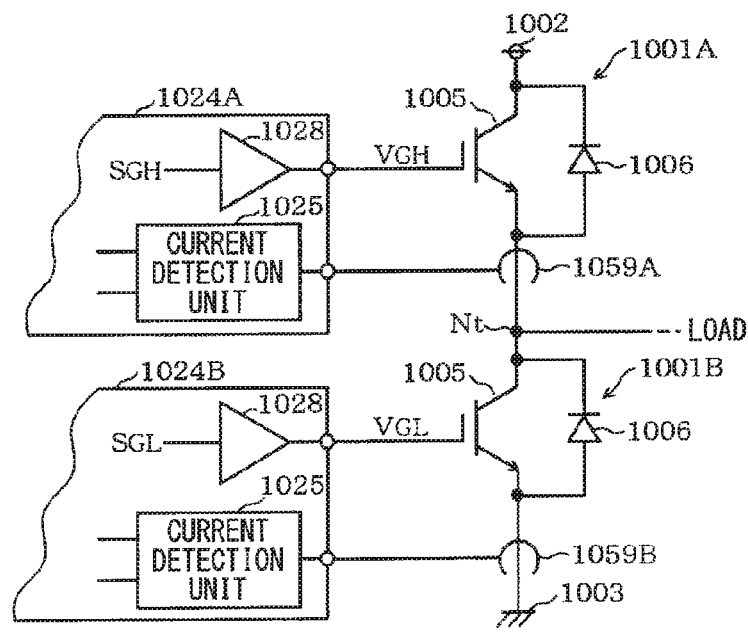
FIG. 48 is a diagram illustrating the modification example of the current detection configuration.

In the embodiment, as the current detection device, the semiconductor elements 1001A and 1001B are respectively provided with the sense elements, and include the sense resistors 1007A and 1007B, respectively. Instead, as illustrated in FIG. 47, the sense resistors 1007A and 1007B may be respectively provided in series to the semiconductor elements 1001A and 1001B from which the sense elements are removed. Since the sense resistors 1007A and 1007B are directly connected to the main elements, respectively, high responsiveness can be obtained. As illustrated in FIG. 48, hole sensors 1059A and 1059B may be respectively provided for the semiconductor elements 1001A and 1001B. Instead of the hole sensors 1059A and 1059B, a hole sensor may be provided on an output line extending from the output terminal Nt to a load. In any configuration, a current can be detected with high precision. An insulated current sensor such as a giant magneto resistance (GMR) sensor may be used instead of the hole sensor.

The present disclosure includes the following aspects.

According to a first aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through at least one of the two semiconductor elements; and a first control device that outputs a gate drive signal for instructing to apply the gate drive voltage from when a first time period has elapsed from a starting time to when a second time period has elapsed from the starting time, at which an off-command signal is input after it is determined based on the current detection signal that a current flows through the at least one of the two semiconductor elements in a forward direction of the diode structure during a time period for which an on-command signal is input to the at least one of the two semiconductor elements. The two semiconductor elements provide a half-bridge circuit. The first time period and the second time period are preliminary set not to generate an arm short-circuit between the two semiconductor elements.

The semiconductor element which is a drive target has a gate structure that is common to the transistor structure and the diode structure. When conduction switches between upper and lower arms, for example, when the first control device applies the gate drive voltage to one semiconductor element in a state where a current flows through the diode structure of the one semiconductor element, the amount of holes accumulated in the diode structure is reduced, and a reverse recovery current is reduced.

When an element current (for example, diode current) flows through the semiconductor element (to which the off-command signal is input) in the forward direction of the diode structure, the waveform of the gate drive voltage VGL at the application of the gate drive pulse is different from that when an element current (transistor current) flows therethrough in a reverse direction. For example, in the former case, a rapid change in voltage and current between the semiconductor elements or a mirror time period does not occur, and thus, a time at which the gate drive voltage rises and a time at which the gate drive voltage falls are reduced, (or can be reduced). Accordingly, a delay or variations in the gate drive pulse are reduced. In contrast, in the latter case, a rapid change in voltage and current between the semiconductor elements or the mirror time period occurs, and thus, a delay or variations in the gate drive pulse increase. The drive control device applies the gate drive pulse only when a current flows through the semiconductor element in the forward direction of the diode structure, and thus, it is possible to perform control based on a small delay or small variations in the formal case, and to increase the accuracy of an application timing.

The first control device inputs at least one command signal of high-potential (high-side) and low-potential (low-side) command signals (for example, PWM signals) changing complementary to each other, and applies the gate drive voltage to at least one semiconductor element. The command signal has a dead time (time period for which both sides are turned off to prevent the occurrence of an arm short circuit) during switching. The dead time is a constant time period, and thus, a time period from the input of one side off-command signal to the input of the other side off-command signal is accurately ensured.

According to this device, it is possible to understand a dead time by pre-measuring a delay or variations, and to accurately set the timing of the gate drive signal required to apply the gate drive voltage at a desired timing, starting from when the off-command signal is input, that is, to accurately set the first time period and the second time period.

Accordingly, it is possible to accurately control a time period from when the application of the gate drive pulse to the one semiconductor element ends to when the reverse recovery current starts to flow therethrough, for example, a time period (carrier re-injection time period) for which carriers (holes) are injected into the diode structure again after the application of the gate drive pulse ends. As a result, while an arm short circuit is prevented from occurring, a re-injection time period can be controlled to be short, and thus, a reverse recovery current can be reduced, and a switching loss can be reduced. Since the first control device is capable of applying the gate drive signal using the off-command signal as a reference timing, the first control device does not require a separate timing signal, and a drive control device in the related art is easily switched to the drive control device in this aspect of this disclosure.

Alternatively, the drive control device may further include a second control device that outputs another gate drive signal for instructing to shut off the gate drive voltage when it is determined based on the current detection signal that the current of the at least one of the two semiconductor elements flowing in the forward direction of the diode structure is greater than or equal to a current threshold value during the time period for which the on-command signal is input to the at least one of the two semiconductor elements to be driven and controlled. When it is determined based on the current detection signal that the current of the at least one of the two semiconductor elements flowing in the forward direction of the diode structure is less than the current threshold value during the time period for which the on-command signal is input to the at least one of the two semiconductor elements to be driven and controlled, the second control device outputs the gate drive signal for instructing to apply the gate drive voltage. When the current flows through the at least one of the two semiconductor elements in the forward direction of the diode structure, a current value, at which a conduction loss in a case where the gate drive voltage is shut off is equal to a conduction loss in a case where the gate drive voltage is applied, is preliminary measured, and a measured current value is set as the current threshold value.

A semiconductor element has a characteristic by which a conduction loss at the shutting off of a gate drive voltage is different from a conduction loss at the application of the gate drive voltage. The reason for this is that the injection of holes is affected by the formation of a channel. A magnitude relationship between the conduction loss at the shutting off of a gate drive voltage and the conduction loss at the application of the gate drive voltage varies depending on the types and the breakdown voltages of semiconductor elements and the like. According to this device, this relationship is pre-measured, and the current threshold value is set to reverse the magnitude relationship.

When a current flowing through the semiconductor element in the forward direction of the diode structure is greater than or equal to the current threshold value, the second control device outputs a command to shut off the gate drive voltage, and when the current is less than the current threshold value, the second control device outputs a command to apply the gate drive voltage. Accordingly, regardless of the types or the breakdown voltages of the semiconductor elements, it is possible to appropriately reduce a conduction loss. The gate drive voltage is reliably applied during a time period for which a current flows through the semiconductor element in a reverse direction of the diode structure, and thus, a current is capable of flowing through the transistor structure according to the on-command signal.

Alternatively, when it is determined that the current less than the current threshold value flows through the at least one of the two semiconductor elements in the forward direction of the diode structure during the time period for which the on-command signal is input to the at least one of the two semiconductor elements to be driven and controlled, the second control device may extend to output the gate drive signal for instructing to apply the gate drive voltage until the second time period has elapsed after the starting time, at which the off-command signal is input to the at least one of the two semiconductor elements.

Accordingly, it is possible to execute the control by the second control device and the control by the first control device using a series of gate drive voltages, and it is possible to further reduce a conduction loss.

Alternatively, the drive control device may further include a second control device that outputs the gate drive signal for instructing to apply the gate drive voltage during the time period for which the on-command signal is input to the at least one of the two semiconductor elements to be driven and controlled, and extends to output the gate drive signal for instructing to apply the gate drive voltage until the second time period has elapsed after the starting time, at which the off-command signal is input to the at least one of the two semiconductor elements, when it is determined that the current flows through the at least one of the two semiconductor elements in the forward direction of the diode structure during the time period.

Accordingly, it is possible to apply the gate drive voltage during the time period for which the on-command signal is input, and the gate drive voltage in the control by the first control device thereafter, as a series of gate drive voltages, and it is possible to further reduce a conduction loss.

According to a second aspect of the present disclosure, a drive control device for a semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through the semiconductor element; and a second control device that outputs a gate drive signal for instructing to shut off the gate drive voltage when it is determined based on the current detection signal that the current of the semiconductor element flowing in a forward direction of the diode structure is greater than or equal to a current threshold value during a time period for which an on-command signal is input to the semiconductor element. When it is determined based on the current detection signal that the current of the semiconductor element flowing in the forward direction of the diode structure is less than the current threshold value during the time period for which the on-command signal is input to the semiconductor element, the second control device outputs another gate drive signal for instructing to apply the gate drive voltage. When the current flows through the semiconductor element in the forward direction of the diode structure, a current value, at which a conduction loss in a case where the gate drive voltage is shut off is equal to a conduction loss in a case where the gate drive voltage is applied, is preliminary measured, and a measured current value is set as the current threshold value.

During a time period for which an on-command signal is input to the semiconductor element, when it is determined that the current flowing through the semiconductor element in the forward direction of the diode structure is greater than or equal to the current threshold value based on the current detection signal, the second control device outputs a gate drive signal to command the shutting off of the gate drive voltage. When it is determined that the current is less than the current threshold value, the second control device outputs a gate drive signal to command the application of the gate drive voltage. In this configuration, the same operations and effects as in the first aspect can be obtained. Regardless of the types or the breakdown voltages of semiconductor elements, it is possible to appropriately reduce a conduction loss. The gate drive voltage is reliably applied during a time period for which a current flows through the semiconductor element in a reverse direction of the diode structure, and thus, a current is capable of flowing through the transistor structure according to the on-command signal.

Alternatively, the second control device may be configured to receive a threshold value specifying signal for specifying the current threshold value from an outside. During the time period for which the on-command signal is input, the second control device uses the current threshold value corresponding to an input threshold value specifying signal to determine the current flowing through the semiconductor element.

Accordingly, the drive control device is capable of driving various semiconductor elements of different types having different breakdown voltages at a low conduction loss.

Alternatively, at least one of the first control device and the second control device may perform a normal control. In the normal control, when a current flowing through a load via the at least one of the two semiconductor elements is less than a specified value, and the on-command signal is input to the semiconductor element to be driven and controlled, the at least one of the first control device and the second control device outputs the gate drive signal for instructing to apply the gate drive voltage. In the normal control, when the current flowing through the load via the at least one of the two semiconductor elements is less than the specified value, and the off-command signal is input to the semiconductor element to be driven and controlled, the at least one of the first control device and the second control device outputs another gate drive signal for instructing to shut off the gate drive voltage.

Accordingly, a decrease in the accuracy of current detection can be prevented from causing erroneous control.

Alternatively, the drive control device may further include a drive circuit that receives the gate drive signal, and outputs the gate drive voltage. The drive circuit is configured to include an IC having a breakdown voltage corresponding to the gate drive voltage.

In this configuration, the drive control device is provided for each of the semiconductor elements which form a half-bridge circuit. A drive control device (drive IC) may be replaced for a drive system of a semiconductor element which is widely used, and thus, the drive system is easily changed.

Alternatively, the drive control device may drive and control the two semiconductor elements for providing a half-bridge circuit. The drive control device is configured to include an IC having a breakdown voltage corresponding to a power source voltage applied to the half-bridge circuit. The IC includes the drive circuit that receives the gate drive signal, and outputs the gate drive voltage. The current detection device is configured to detect the current flowing through the at least one of the two semiconductor elements. At least one of the first control device and the second control device prohibits the gate drive voltage from being applied to one of the two semiconductor elements during a time period for which the gate drive voltage is applied to the other of the two semiconductor elements.

The current detection device detects a current flowing through at least one of the two semiconductor elements. When a current flowing through the one semiconductor element can be detected, a current flowing through the other semiconductor element can be indirectly detected.

The drive control device is capable of understanding drive states of the two semiconductor elements which form the half-bridge circuit. The control device prohibits the gate drive voltage from being applied to one semiconductor element of the two semiconductor elements during a time period for which the gate drive voltage is applied to the other semiconductor element. Accordingly, an arm short circuit can be reliably prevented from occurring.

Alternatively, the drive control device may drive and control the two semiconductor elements for providing a half-bridge circuit. The drive control device is configured to include a control IC that provides at least one of the first control device and the second control device, a drive IC that applies the gate drive voltage to each of the two semiconductor elements based on the gate drive signal input from the control IC, an insulated circuit that transmits the gate drive signal, which is output from the control IC, to the drive IC while the gate drive signal being electrically insulated, and the current detection device. The control IC outputs a gate drive signal to prohibit the gate drive voltage from being applied to one of the two semiconductor elements during a time period for which the gate drive voltage is applied to the other of the two semiconductor elements.

The drive control device is capable of understanding drive states of the two semiconductor elements which form the half-bridge circuit. The control IC outputs a gate drive signal to prohibit the gate drive voltage from being applied to one semiconductor element of the two semiconductor elements during a time period for which the gate drive voltage is applied to the other semiconductor element. Accordingly, an arm short circuit can be reliably prevented from occurring. When the current detection device is capable of detecting only a current flowing through the one semiconductor element of the two semiconductor elements, the current detection device is capable of indirectly detecting a current flowing through the other semiconductor element.

Alternatively, the control IC may provide the current detection device.

For example, the control IC executes a software process on the aforementioned control.

According to a third aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through at least one of the two semiconductor elements; and a control device that outputs a pulse not to generate an arm short-circuit between the two semiconductor elements at a time when the current detection device detects a change in the current detection signal in a case where it is determined based on the current detection signal that a current flows through the at least one of the two semiconductor elements in a forward direction of the diode structure under a condition that an off-command signal is input to the at least one of the two semiconductor elements. The time is ahead of an input time when the on-command signal is input to the at least one of the two semiconductor elements. The two semiconductor elements provide a half-bridge circuit.

In this configuration, the same operations and effects as in the first aspect can be obtained.

According to a fourth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal based on an electrode potential of one of the two semiconductor elements; and a control device that outputs a pulse not to generate an arm short-circuit between the two semiconductor elements from an input time when an on-command signal is input to the one of the two semiconductor elements in a case where it is determined based on the voltage detection signal that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

Alternatively, the drive control device may further include a current detection device that outputs a current detection signal corresponding to a current flowing through at least one of the two semiconductor elements; and another control device that outputs a pulse from a time which is by a delay time period ahead of the input time when the on-command signal is input to the one of the two semiconductor elements in a case where it is determined based on the current detection signal that the current flows through the one of the two semiconductor elements in the forward direction of the diode structure under a condition that an off-command signal is input to the one of the two semiconductor elements. The delay time period is defined as a time period between a timing when a current starts not to flow through the one of the two semiconductor elements and a timing when the gate drive voltage increases.

According to a fifth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through one of the two semiconductor elements; an input device that inputs a command signal to the other of the two semiconductor elements; and a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the current detection signal and an input signal of the input device that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

According to a sixth aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal based on an electrode potential of one of the two semiconductor elements; an input device that inputs a command signal to the other of the two semiconductor elements; and a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the voltage detection signal and an input signal of the input device that a current flows through the one of the two semiconductor elements in a forward direction of the diode structure under a condition that an off-command signal is input to the one of the two semiconductor elements. The two semiconductor elements provide a half-bridge circuit.

In this configuration, the same operations and effects as in the first aspect can be obtained.

Alternatively, the drive control device may further include a control voltage detection device that outputs a control voltage detection signal corresponding to the control voltage of the other of the two semiconductor elements. The control device outputs a pulse based on a change in the control voltage detection signal of the control voltage detection device.

According to a seventh aspect of the present disclosure, a drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, includes: a voltage detection device that outputs a voltage detection signal corresponding to an electrode potential of at least one of the two semiconductor elements; and a control device that outputs a gate drive signal for instructing to apply the gate drive voltage from when a first time period has elapsed from a starting time to when a second time period has elapsed from the starting time, at which an off-command signal is input subsequent to an input of an on-command signal after it is determined based on the voltage detection signal that a current flows through the one of the two semiconductor elements in a forward direction of the diode structure under a condition that an off-command signal is input to the one of the two semiconductor elements. The first time period and the second time period are preliminary set not to generate an arm short-circuit between the two semiconductor elements. The two semiconductor elements provide a half-bridge circuit.

In this configuration, the same operations and effects as in the first aspect can be obtained.

Alternatively, the control device may check a current flowing through a load by determining using the voltage detection unit whether a voltage changes. When it is determined that the current of the load is within a predetermined range around zero, the control device outputs another gate drive signal for instructing to shut off the gate drive voltage. When it is determined that the current of the load is out of the predetermined range around zero, the control device outputs the gate drive signal for instructing to apply the gate drive voltage.

Alternatively, when it is determined based on the voltage detection signal that a current flows in the forward direction of the diode structure during a time period for which an on-command signal is input to the semiconductor element to be driven and controlled, the control device may output another gate drive signal for instructing to shut off the gate drive voltage. When it is determined based on the voltage detection signal that a current does not flow in the forward direction of the diode structure during a time period for which an on-command signal is input to the semiconductor element to be driven and controlled, the control device outputs the gate drive signal for instructing to apply the gate drive voltage.

Alternatively, the drive control device may further include a drive circuit that receives the gate drive signal, and outputs the gate drive voltage. The drive circuit is configured to include an IC having a breakdown voltage corresponding to the gate drive voltage.

Alternatively, the drive control device may drive and control the two semiconductor elements which provide the half-bridge circuit. The drive control device is configured to include an IC having a breakdown voltage corresponding to a power source voltage applied to the half-bridge circuit. The IC provides the drive circuit that receives the gate drive signal, and outputs the gate drive voltage. The voltage detection device is configured to detect a voltage of at least one of the two semiconductor elements. The control device prohibits the gate drive voltage from being applied to one of the two semiconductor elements during a time period for which the gate drive voltage is applied to the other of the two semiconductor elements.

Alternatively, the drive control device may drive and control the two semiconductor elements which provide the half-bridge circuit. The drive control device is configured to include a control IC that has the control device, a drive IC that applies the gate drive voltage to the semiconductor element based on a gate drive signal input from the control IC, an insulated circuit that transmits the gate drive signal, which is output from the control IC, to the drive IC while the gate drive signal being electrically insulated, and the voltage detection device. The control IC outputs a gate drive signal to prohibit the gate drive voltage from being applied to one of the two semiconductor elements during a time period for which the gate drive voltage is applied to the other of the two semiconductor elements.

Alternatively, the control IC may provide the voltage detection device.

Alternatively, the voltage detection device may be arranged on the semiconductor substrate to be separated from each other on an outer circumferential side of an element formation region of the two semiconductor elements. The voltage detection device detects a midpoint potential using an electric field limiting ring having a conduction type opposite to a conduction type of the semiconductor substrate.

According to an eighth aspect of the present disclosure, a drive control device for a semiconductor element having an insulated gate type transistor structure, to which a gate drive voltage is applied, and a diode structure arranged on a same semiconductor substrate, the transistor structure and the diode structure having a common energization electrode, includes: a current detection device that outputs a current detection signal corresponding to a current flowing through the semiconductor element; a control device that outputs a gate drive signal for instructing to apply the gate drive voltage from when a predetermined first time period has elapsed from a starting time to when a predetermined second time period has elapsed from the starting time, at which an off-command signal is input after it is determined based on the current detection signal that a current flows through the semiconductor element in a forward direction of the diode structure during a time period for which an on-command signal is input to the semiconductor element; and a drive circuit that receives the gate drive signal, and outputs the gate drive voltage. A time width, which is a difference between the first time period and the second time period, is set to a value corresponding to a magnitude of a current flowing through the semiconductor element during a time period for which an on-command signal is input to the semiconductor element.

The semiconductor element which is a drive target has a gate structure that is common to the transistor structure and the diode structure. When conduction switches between upper and lower arms, for example, when the control device applies the gate drive voltage to one semiconductor element in a state where a current flows through the diode structure of the one semiconductor element, the amount of holes accumulated in the diode structure is reduced, and a reverse recovery current is reduced.

When an element current (for example, diode current) flows through the semiconductor element (to which the off-command signal is input) in the forward direction of the diode structure, the waveform of the gate drive voltage at the application of the gate drive pulse is different from that when an element current (transistor current) flows therethrough in a reverse direction. For example, in the former case, a rapid change in current, a rapid change in voltage, or a mirror time period does not occur, and thus, a time at which the gate drive voltage rises and a time at which the gate drive voltage falls are reduced, (or can be reduced). Accordingly, a delay or variations in the gate drive pulse are reduced. In contrast, in the latter case, a rapid change in current, a rapid change in voltage, or the mirror time period occurs, and thus, a delay or variations in the gate drive pulse increase. The drive control device applies the gate drive pulse only when a current flows through the semiconductor element in the forward direction of the diode structure, and thus, it is possible to perform control based on a small delay or small variations in the former case, and to increase the accuracy of an application timing.

The semiconductor elements form a half-bridge circuit such that the semiconductor element on a high-potential side (on a high side) and the semiconductor element on a low-potential side (on a low side) are disposed in series with an output terminal interposed therebetween. The drive control device inputs at least one command signal of high-side and low-side command signals (for example, PWM signals) changing complementary to each other, and applies the gate drive voltage to at least one semiconductor element. The command signal has a dead time during switching. The dead time is a constant time period, and thus, a time period from the input of one side off-command signal to the input of the other side off-command signal is accurately ensured.

The control device understands the dead time by pre-measuring the delay or the variations, and performs control such that the time width is set to a value corresponding to the magnitude of a current flowing through the semiconductor element during a time period for which an on-command signal is input to the semiconductor element, with the time width being the difference between the first time period and the second time period. Accordingly, it is possible to accurately set the timing of the gate drive signal required to apply the gate drive voltage at a desired timing, starting from when the off-command signal is input, that is, to accurately set the first time period and the second time period.

As a result, it is possible to accurately control a time period from when the application of the gate drive pulse to the one semiconductor element ends to when the reverse recovery current starts to flow therethrough, for example, a time period (carrier re-injection time period) for which carriers (holes) are injected into the diode structure again after the application of the gate drive pulse ends. According to this device, while an arm short circuit is prevented from occurring, a re-injection time period can be controlled to be short, and thus, the reverse recovery current can be reduced, and a switching loss can be reduced. Since the control device is capable of applying the gate drive signal using the off-command signal as a reference timing, the control device does not require a separate timing signal, and a drive control device in the related art is easily switched to the drive control device in this aspect of this disclosure.

Alternatively, the semiconductor element may include one semiconductor device and another semiconductor device. The one semiconductor device and the another semiconductor device provide a half-bridge circuit. The first time period and the second time period are set such that a time width as a difference between a time and another time is greater than zero, and is less than or equal to a predetermined injection allowance time period, the time when the gate drive voltage is shut off subsequent to elapse of the second time period in a case where an on-command signal is input to the other semiconductor element subsequent to elapse of a constant dead time after an off-command signal is input under a condition that a current flows through the semiconductor element in the forward direction of the diode structure, and the another time when a current exceeding an amount of current flowing through the one semiconductor element starts to flow through the transistor structure of the other semiconductor element.

The time width is the carrier re-injection time period. It is possible to prevent a short-circuit current from flowing through the half-bridge circuit by setting this time to be larger than zero. It is possible to limit the magnitude of the reverse recovery current to a value corresponding to the injection allowance time period by setting this time to be shorter than or equal to a predetermined injection allowance time period, and to reduce a switching loss.

Alternatively, a time width, which is a difference between the first time period and the second time period, may be set to be longer as a current, flowing through the semiconductor element during a time period for which an on-command signal is input to the semiconductor element, is larger.

As described above, the time width, which is the difference between the first time period and the second time period, is set to a long time period to the extent that a current, which flows through the semiconductor element during a time period for which an on-command signal is input to the semiconductor element, is high. The reason for this is that a time period from when an off-command signal is input to when the reverse recovery current starts to flow is increased to the extent that a current is high. Accordingly, regardless of the magnitude of current, it is possible to restrict an increase in the re-injection time period, and to reduce a switching loss.

Alternatively, the first time period and the second time period may be set in order to monotonically increase or monotonically decrease the gate drive voltage based on the gate drive signal, which is output from when the first time period has elapsed to when the second time period has elapsed, according to a gate drive capability of the drive circuit.

The gate drive pulse, which is to be applied after the input of an off-command signal, acts to reduce the amount of holes accumulated in the diode structure, and does not act to conduct or shut off the semiconductor element. For this reason, a voltage between conduction terminals (between C and E, between D and S) of the transistor device does not change, and a mirror time period does not occur. A current continues to flow through the semiconductor element in the forward direction of the diode structure during an application time period of the gate drive pulse, and thus, a special gate drive voltage having a protective function against an arm short circuit is also not required. Accordingly, the gate drive signal is set in order for the gate drive voltage to simply increase or decrease, and thus, control can be performed such that the carrier re-injection time period is set to a desired value.

Alternatively, the first time period and the second time period may be set not to generate a mirror time period in the gate drive voltage based on the gate drive signal, which is output from when the first time period has elapsed to when the second time period has elapsed.

As described above, the first time period and the second time period are set assuming that a mirror time period does not occur in the gate drive voltage based on a gate drive signal which is output from when the first time period has elapsed to when the second time period has elapsed. Accordingly, it is possible to restrict an increase in the carrier re-injection time period compared to when a gate drive signal is set assuming that the mirror time period occurs.

Alternatively, when the gate drive signal changes at a time when the first time period has elapsed, the drive circuit may output the gate drive voltage while maintaining a constant gate drive capability.

As described above, when the gate drive signal is changed at a time at which the first time period has elapsed, the drive circuit outputs the gate drive voltage while maintaining a constant gate drive capability. According to a drive method adopted for conducting the semiconductor element, a short-circuit current at the occurrence of a short circuit in the semiconductor element is reduced by temporarily holding the gate drive voltage at a midpoint voltage in the middle of an increase in the gate drive voltage. However, when the gate drive pulse is applied at an appropriate timing, a short-circuit current does not flow. According to this device, it is possible to reduce variations in the rising time of the gate drive voltage, and to accurately control the re-injection time period by maintaining a constant gate drive capability and excluding a useless midpoint voltage.

Alternatively, when the gate drive signal changes at a time when the first time period has elapsed and the second time period has elapsed, the drive circuit may output the gate drive voltage at a drive capability higher than a case where the semiconductor element is energized and shut off.

As described above, the drive circuit outputs the gate drive voltage at a high drive capability when the gate drive signal is changed at a time at which the first time period has elapsed and the second time period has elapsed compared to when the semiconductor element is conducted and shut off. The reason for this is that a current continues to flow through the semiconductor element in the forward direction of the diode structure during a time period for which the gate drive pulse is applied, and thus, a surge caused by a rapid change in voltage and current does not occur. Accordingly, it is possible to reduce variations in the rising time and the falling time of the gate drive voltage, and to accurately control the re-injection time period.

It is noted that a flowchart or the processing of the flowchart in the present application includes sections (also referred to as steps), each of which is represented, for instance, as S100. Further, each section can be divided into several sub-sections while several sections can be combined into a single section. Furthermore, each of thus configured sections can be also referred to as a device, module, or means.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
   a current detection device that outputs a current detection signal corresponding to a current flowing through at least one of the two semiconductor elements; and
   a first control device that outputs a gate drive signal for instructing to apply the gate drive voltage from when a first time period has elapsed from a starting time to when a second time period has elapsed from the starting time, at which an off-command signal is input after it is determined based on the current detection signal that a current flows through the at least one of the two semiconductor elements in a forward direction of the diode structure during a time period for which an on-command signal is input to the at least one of the two semiconductor elements, wherein:
   the two semiconductor elements provide a half-bridge circuit; and
   the first time period and the second time period are preliminary set not to generate an arm short-circuit between the two semiconductor elements.

2. The drive control device according to claim 1, further comprising:
   a second control device that outputs another gate drive signal for instructing to shut off the gate drive voltage when it is determined based on the current detection signal that the current of the at least one of the two semiconductor elements flowing in the forward direction of the diode structure is greater than or equal to a current threshold value during the time period for which the on-command signal is input to the at least one of the two semiconductor elements to be driven and controlled, wherein:
   when it is determined based on the current detection signal that the current of the at least one of the two semiconductor elements flowing in the forward direction of the diode structure is less than the current threshold value during the time period for which the on-command signal is input to the at least one of the two semiconductor elements to be driven and controlled, the second control device outputs the gate drive signal for instructing to apply the gate drive voltage; and
   when the current flows through the at least one of the two semiconductor elements in the forward direction of the diode structure, a current value, at which a conduction loss in a case where the gate drive voltage is shut off is equal to a conduction loss in a case where the gate drive voltage is applied, is preliminary measured, and a measured current value is set as the current threshold value.

3. The drive control device according to claim 2, wherein:
   when it is determined that the current less than the current threshold value flows through the at least one of the two semiconductor elements in the forward direction of the diode structure during the time period for which the on-command signal is input to the at least one of the two semiconductor elements to be driven and controlled, the second control device extends to output the gate drive signal for instructing to apply the gate drive voltage until the second time period has elapsed after the starting time, at which the off-command signal is input to the at least one of the two semiconductor elements.

4. The drive control device according to claim 1, further comprising:

a second control device that outputs the gate drive signal for instructing to apply the gate drive voltage during the time period for which the on-command signal is input to the at least one of the two semiconductor elements to be driven and controlled, and extends to output the gate drive signal for instructing to apply the gate drive voltage until the second time period has elapsed after the starting time, at which the off-command signal is input to the at least one of the two semiconductor elements, when it is determined that the current flows through the at least one of the two semiconductor elements in the forward direction of the diode structure during the time period.

5. A drive control device for a semiconductor element having an insulated gate type transistor structure, to which a gate drive voltage is applied, and a diode structure arranged on a same semiconductor substrate, the transistor structure and the diode structure having a common energization electrode, the drive control device comprising:
a current detection device that outputs a current detection signal corresponding to a current flowing through the semiconductor element; and
a second control device that outputs a gate drive signal for instructing to shut off the gate drive voltage when it is determined based on the current detection signal that the current of the semiconductor element flowing in a forward direction of the diode structure is greater than or equal to a current threshold value during a time period for which an on-command signal is input to the semiconductor element, wherein:
when it is determined based on the current detection signal that the current of the semiconductor element flowing in the forward direction of the diode structure is less than the current threshold value during the time period for which the on-command signal is input to the semiconductor element, the second control device outputs another gate drive signal for instructing to apply the gate drive voltage; and
when the current flows through the semiconductor element in the forward direction of the diode structure, a current value, at which a conduction loss in a case where the gate drive voltage is shut off is equal to a conduction loss in a case where the gate drive voltage is applied, is preliminary measured, and a measured current value is set as the current threshold value.

6. The drive control device according to claim 5, wherein:
the second control device is configured to receive a threshold value specifying signal for specifying the current threshold value from an outside; and
during the time period for which the on-command signal is input, the second control device uses the current threshold value corresponding to an input threshold value specifying signal to determine the current flowing through the semiconductor element.

7. The drive control device according to claim 5, wherein:
at least one of the first control device and the second control device performs a normal control;
in the normal control, when a current flowing through a load via the at least one of the two semiconductor elements is less than a specified value, and the on-command signal is input to the semiconductor element to be driven and controlled, the at least one of the first control device and the second control device outputs the gate drive signal for instructing to apply the gate drive voltage; and
in the normal control, when the current flowing through the load via the at least one of the two semiconductor elements is less than the specified value, and the off-command signal is input to the semiconductor element to be driven and controlled, the at least one of the first control device and the second control device outputs another gate drive signal for instructing to shut off the gate drive voltage.

8. The drive control device according to claim 5, further comprising:
a drive circuit that receives the gate drive signal, and outputs the gate drive voltage, wherein:
the drive circuit is configured to include an IC having a breakdown voltage corresponding to the gate drive voltage.

9. The drive control device according to claim 5, wherein:
the drive control device drives and controls the two semiconductor elements for providing a half-bridge circuit;
the drive control device is configured to include an IC having a breakdown voltage corresponding to a power source voltage applied to the half-bridge circuit;
the IC includes the drive circuit that receives the gate drive signal, and outputs the gate drive voltage;
the current detection device is configured to detect the current flowing through the at least one of the two semiconductor elements; and
at least one of the first control device and the second control device prohibits the gate drive voltage from being applied to one of the two semiconductor elements during a time period for which the gate drive voltage is applied to the other of the two semiconductor elements.

10. The drive control device according to claim 5, wherein:
the drive control device drives and controls the two semiconductor elements for providing a half-bridge circuit;
the drive control device is configured to include a control IC that provides at least one of the first control device and the second control device, a drive IC that applies the gate drive voltage to each of the two semiconductor elements based on the gate drive signal input from the control IC, an insulated circuit that transmits the gate drive signal, which is output from the control IC, to the drive IC while the gate drive signal being electrically insulated, and the current detection device; and
the control IC outputs a gate drive signal to prohibit the gate drive voltage from being applied to one of the two semiconductor elements during a time period for which the gate drive voltage is applied to the other of the two semiconductor elements.

11. The drive control device according to claim 10, wherein:
the control IC provides the current detection device.

12. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
a current detection device that outputs a current detection signal corresponding to a current flowing through at least one of the two semiconductor elements; and
a control device that outputs a pulse not to generate an arm short-circuit between the two semiconductor elements at a time when the current detection device detects a change in the current detection signal in a case where it is determined based on the current detection signal that a current flows through the at least one of the two semiconductor elements in a forward direction of the diode structure under a condition that an off-command signal is input to the at least one of the two semiconductor elements, wherein:
the time is ahead of an input time when the on-command signal is input to the at least one of the two semiconductor elements; and
the two semiconductor elements provide a half-bridge circuit.

13. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
a voltage detection device that outputs a voltage detection signal based on an electrode potential of one of the two semiconductor elements; and
a control device that outputs a pulse not to generate an arm short-circuit between the two semiconductor elements from an input time when an on-command signal is input to the one of the two semiconductor elements in a case where it is determined based on the voltage detection signal that a current flows through the one of the two semiconductor elements in a forward direction of the diode structure under a condition that an off-command signal is input to the one of the two semiconductor elements; and
the two semiconductor elements provide a half-bridge circuit.

14. The drive control device according to claim 13, further comprising:
a current detection device that outputs a current detection signal corresponding to a current flowing through at least one of the two semiconductor elements; and
another control device that outputs a pulse from a time which is by a delay time period ahead of the input time when the on-command signal is input to the one of the two semiconductor elements in a case where it is determined based on the current detection signal that the current flows through the one of the two semiconductor elements in the forward direction of the diode structure under a condition that an off-command signal is input to the one of the two semiconductor elements, wherein:
the delay time period is defined as a time period between a timing when a current starts not to flow through the one of the two semiconductor elements and a timing when the gate drive voltage increases.

15. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
a current detection device that outputs a current detection signal corresponding to a current flowing through one of the two semiconductor elements;
an input device that inputs a command signal to the other of the two semiconductor elements; and
a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the current detection signal and an input signal of the input device that a current flows through the one of the two semiconductor elements in a forward direction of the diode structure under a condition that an off-command signal is input to the one of the two semiconductor elements, wherein:
the two semiconductor elements provide a half-bridge circuit.

16. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
a voltage detection device that outputs a voltage detection signal based on an electrode potential of one of the two semiconductor elements;
an input device that inputs a command signal to the other of the two semiconductor elements; and
a control device that outputs a pulse in accordance with an input of an off-command signal to the input device, and outputs a pulse not to generate an arm short-circuit between the two semiconductor elements from a time which is by a predetermined time ahead of an input time when an on-command signal is input to the one of the two semiconductor elements, in a case where it is determined based on the voltage detection signal and an input signal of the input device that a current flows through the one of the two semiconductor elements in a forward direction of the diode structure under a condition that an off-command signal is input to the one of the two semiconductor elements, wherein:
the two semiconductor elements provide a half-bridge circuit.

17. The drive control device according to claim 15, further comprising:
a control voltage detection device that outputs a control voltage detection signal corresponding to the control voltage of the other of the two semiconductor elements, wherein:
the control device outputs a pulse based on a change in the control voltage detection signal of the control voltage detection device.

18. A drive control device for two semiconductor elements, each semiconductor element having an insulated gate type transistor structure, to which a gate drive voltage is applied, and a diode structure arranged on a same semiconductor substrate, the transistor structure and the diode structure having a common energization electrode, the drive control device comprising:
a voltage detection device that outputs a voltage detection signal corresponding to an electrode potential of at least one of the two semiconductor elements; and
a control device that outputs a gate drive signal for instructing to apply the gate drive voltage from when a first time period has elapsed from a starting time to when a second time period has elapsed from the starting time, at which an off-command signal is input subsequent to an input of an on-command signal after it is determined based on the voltage detection signal that a current flows through the one of the two semiconductor elements in a forward direction of the diode structure under a condition that an off-command signal is input to the one of the two semiconductor elements, wherein:
the first time period and the second time period are preliminary set not to generate an arm short-circuit between the two semiconductor elements; and
the two semiconductor elements provide a half-bridge circuit.

19. The drive control device according to claim 18, wherein:
the control device checks a current flowing through a load by determining using the voltage detection unit whether a voltage changes;
when it is determined that the current of the load is within a predetermined range around zero, the control device outputs another gate drive signal for instructing to shut off the gate drive voltage; and
when it is determined that the current of the load is out of the predetermined range around zero, the control device outputs the gate drive signal for instructing to apply the gate drive voltage.

20. The drive control device according to claim 18, wherein:
when it is determined based on the voltage detection signal that a current flows in the forward direction of the diode structure during a time period for which an on-command signal is input to the semiconductor element to be driven and controlled, the control device outputs another gate drive signal for instructing to shut off the gate drive voltage; and
when it is determined based on the voltage detection signal that a current does not flow in the forward direction of the diode structure during a time period for which an on-command signal is input to the semiconductor element to be driven and controlled, the control device outputs the gate drive signal for instructing to apply the gate drive voltage.

21. The drive control device according to claim 18, further comprising:
a drive circuit that receives the gate drive signal, and outputs the gate drive voltage, wherein:
the drive circuit is configured to include an IC having a breakdown voltage corresponding to the gate drive voltage.

22. The drive control device according to claim 18, wherein:
the drive control device drives and controls the two semiconductor elements which provide the half-bridge circuit;
the drive control device is configured to include an IC having a breakdown voltage corresponding to a power source voltage applied to the half-bridge circuit;
the IC provides the drive circuit that receives the gate drive signal, and outputs the gate drive voltage;
the voltage detection device is configured to detect a voltage of at least one of the two semiconductor elements; and
the control device prohibits the gate drive voltage from being applied to one of the two semiconductor elements during a time period for which the gate drive voltage is applied to the other of the two semiconductor elements.

23. The drive control device according to claim 18, wherein:
the drive control device drives and controls the two semiconductor elements which provide the half-bridge circuit;
the drive control device is configured to include a control IC that has the control device, a drive IC that applies the gate drive voltage to the semiconductor element based on a gate drive signal input from the control IC, an insulated circuit that transmits the gate drive signal, which is output from the control IC, to the drive IC while the gate drive signal being electrically insulated, and the voltage detection device; and
the control IC outputs a gate drive signal to prohibit the gate drive voltage from being applied to one of the two semiconductor elements during a time period for which the gate drive voltage is applied to the other of the two semiconductor elements.

24. The drive control device according to claim 23, wherein:
the control IC provides the voltage detection device.

25. The drive control device according to claim 18, wherein:
the voltage detection device is arranged on the semiconductor substrate to be separated from each other on an outer circumferential side of an element formation region of the two semiconductor elements; and
the voltage detection device detects a midpoint potential using an electric field limiting ring having a conduction type opposite to a conduction type of the semiconductor substrate.

26. The drive control device according to claim 18, wherein:
a time width, which is a difference between the first time period and the second time period, is set to a value corresponding to a magnitude of a current flowing through the semiconductor element during a time period for which an on-command signal is input to the semiconductor element.

27. The drive control device according to claim 18, wherein:
the two semiconductor elements include one semiconductor element and the other semiconductor element;
the one semiconductor element and the other semiconductor element provide the half-bridge circuit; and
the first time period and the second time period are set such that a time width as a difference between a time and another time is greater than zero, and is less than or equal to a predetermined injection allowance time period, the time when the gate drive voltage is shut off subsequent to elapse of the second time period in a case where an on-command signal is input to the other semiconductor element subsequent to elapse of a constant dead time after an off-command signal is input under a condition that a current flows through the semiconductor element in the forward direction of the diode structure, and the another time when a current exceeding an amount of current flowing through the one semiconductor element starts to flow through the transistor structure of the other semiconductor element.

28. The drive control device according to claim 18, wherein:
a time width, which is a difference between the first time period and the second time period, is set to be longer as a current, flowing through the semiconductor element during a time period for which an on-command signal is input to the semiconductor element, is larger.

29. The drive control device according to claim 18, wherein:
the first time period and the second time period are set in order to monotonically increase or monotonically decrease the gate drive voltage based on the gate drive signal according to a gate drive capability of the drive circuit.

30. The drive control device according to claim 18, wherein:
the first time period and the second time period are set not to generate a mirror time period in the gate drive voltage based on the gate drive signal.

31. The drive control device according to claim 18, wherein:
when the gate drive signal changes, the drive circuit outputs the gate drive voltage while maintaining a constant gate drive capability.

32. The drive control device according to claim 18, wherein:
when the gate drive signal changes, the drive circuit outputs the gate drive voltage at a drive capability higher than a case where the semiconductor element is energized and shut off.

33. A drive control device for a semiconductor element having an insulated gate type transistor structure, to which a gate drive voltage is applied, and a diode structure arranged on a same semiconductor substrate, the transistor structure and the diode structure having a common energization electrode, the drive control device comprising:
a current detection device that outputs a current detection signal corresponding to a current flowing through the semiconductor element;
a control device that outputs a gate drive signal for instructing to apply the gate drive voltage from when a predetermined first time period has elapsed from a starting time to when a predetermined second time period has elapsed from the starting time, at which an off-command signal is input after it is determined based on the current detection signal that a current flows through the semiconductor element in a forward direction of the diode structure during a time period for which an on-command signal is input to the semiconductor element; and
a drive circuit that receives the gate drive signal, and outputs the gate drive voltage, wherein:
a time width, which is a difference between the first time period and the second time period, is set to a value corresponding to a magnitude of a current flowing through the semiconductor element during a time period for which an on-command signal is input to the semiconductor element.

34. The drive control device according to claim 33, wherein:
the semiconductor element includes one semiconductor device and another semiconductor device;
the one semiconductor device and the another semiconductor device provide a half-bridge circuit; and
the first time period and the second time period are set such that a time width as a difference between a time and another time is greater than zero, and is less than or equal to a predetermined injection allowance time period, the time when the gate drive voltage is shut off subsequent to elapse of the second time period in a case where an on-command signal is input to the other semiconductor element subsequent to elapse of a constant dead time after an off-command signal is input under a condition that a current flows through the semiconductor element in the forward direction of the diode structure, and the another time when a current exceeding an amount of current flowing through the one semiconductor element starts to flow through the transistor structure of the other semiconductor element.

35. The drive control device according to claim 33 or 34, wherein:
a time width, which is a difference between the first time period and the second time period, is set to be longer as a current, flowing through the semiconductor element during a time period for which an on-command signal is input to the semiconductor element, is larger.

36. The drive control device according to claim 33, wherein:
the first time period and the second time period are set in order to monotonically increase or monotonically decrease the gate drive voltage based on the gate drive signal, which is output from when the first time period has elapsed to when the second time period has elapsed, according to a gate drive capability of the drive circuit.

37. The drive control device according to claim 36, wherein:
the first time period and the second time period are set not to generate a mirror time period in the gate drive voltage based on the gate drive signal, which is output from when the first time period has elapsed to when the second time period has elapsed.

38. The drive control device according to claim 36, wherein:
when the gate drive signal changes at a time when the first time period has elapsed, the drive circuit outputs the gate drive voltage while maintaining a constant gate drive capability.

39. The drive control device according to claim 33, wherein:
when the gate drive signal changes at a time when the first time period has elapsed and the second time period has elapsed, the drive circuit outputs the gate drive voltage at a drive capability higher than a case where the semiconductor element is energized and shut off.

* * * * *